US012677532B2

(12) United States Patent
Lee et al.

(10) Patent No.: US 12,677,532 B2
(45) Date of Patent: Jul. 7, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jongwon Lee, Yongin-si (KR); Seungcheol Kim, Yongin-si (KR); Heungsu Park, Yongin-si (KR); Changmin Lee, Yongin-si (KR); Hyunshik Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 311 days.

(21) Appl. No.: 18/360,048

(22) Filed: Jul. 27, 2023

(65) Prior Publication Data

US 2024/0237391 A1 Jul. 11, 2024

(30) Foreign Application Priority Data

Dec. 9, 2022 (KR) ........................ 10-2022-0171857

(51) Int. Cl.
*H10K 50/19* (2023.01)
*H10K 50/13* (2023.01)
*H10K 102/00* (2023.01)

(52) U.S. Cl.
CPC ........... *H10K 50/19* (2023.02); *H10K 50/131* (2023.02); *H10K 2102/351* (2023.02)

(58) Field of Classification Search
CPC ................. H10K 50/19; H10K 50/131; H10K 2102/351; H10K 50/00; H10K 59/00;
(Continued)

(56) References Cited

U.S. PATENT DOCUMENTS 8,664,016 B2 3/2014 Chun et al.
2003/0052616 A1* 3/2003 Antoniadis .......... H10K 50/805 315/169.3

(Continued)

FOREIGN PATENT DOCUMENTS

KR 10-0994118 11/2010
KR 10-2021-0085981 7/2021

(Continued)

*Primary Examiner* — Donald L Raleigh
(74) *Attorney, Agent, or Firm* — CANTOR COLBURN LLP

(57) ABSTRACT

A tandem light-emitting device including a first electrode, a second electrode facing the first electrode, m light-emitting units stacked between the first electrode and the second electrode, the m light-emitting units each including an emission layer, and m−1 charge generation layers between two adjacent light-emitting units of the m light-emitting units. M is an integer of 5 or more. The m light-emitting units include first to fifth light-emitting units, in order of proximity to the first electrode. The m−1 charge generation layers include first to fourth charge generation layers, in order of proximity to the first electrode. At least one of the first to fifth light-emitting units emits blue light. At least one of the first to fifth light-emitting units emits green light. The formula $3 \leq D/(2*\lambda_b) \leq 4$ is satisfied.

19 Claims, 6 Drawing Sheets

(58) Field of Classification Search
CPC ........ H10K 59/35; H10K 50/13; H10K 59/12; H10K 50/15; H10K 50/16; H10K 50/17; H10K 50/18; H10K 50/81; H10K 50/82; H10K 50/844; H10K 50/852; H10K 50/86; H10K 59/123; H10K 59/38; H10K 59/40
See application file for complete search history.

(56) References Cited

U.S. PATENT DOCUMENTS

| | | | | |
|---|---|---|---|---|
| 2008/0061685 | A1* | 3/2008 | Chesterfield ......... | H10K 85/115 313/504 |
| 2021/0202606 | A1 | 7/2021 | Kim et al. | |
| 2022/0020945 | A1 | 1/2022 | Yamamoto et al. | |
| 2022/0020950 | A1 | 1/2022 | Kim et al. | |
| 2022/0208888 | A1* | 6/2022 | Byeon .................... | H10K 59/38 |
| 2022/0320467 | A1 | 10/2022 | Ye et al. | |

FOREIGN PATENT DOCUMENTS

| | | | |
|---|---|---|---|
| KR | 10-2022-0010689 | | 1/2022 |
| KR | 20220096979 | A | 7/2022 |
| KR | 20220138545 | A | 10/2022 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2022-0171857 under 35 U.S.C. § 119, filed on Dec. 9, 2022 in the Korean Intellectual Property Office, the entire contents of which are incorporated herein by reference.

BACKGROUND

1. Technical Field

One or more embodiments relate to a light-emitting device and an electronic apparatus including the same.

2. Description of the Related Art

From among light-emitting devices, self-emissive devices have wide viewing angles, high contrast ratios, short response times, and excellent characteristics in terms of luminance, driving voltage, and response speed.

In a light-emitting device, a first electrode may be located on a substrate, and a hole transport region, an emission layer, an electron transport region, and a second electrode may be sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

To implement desired characteristics, tandem devices, in which several light-emitting devices are connected in series, have been used.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a light-emitting device having low driving voltage, high efficiency, and long lifespan.

Additional aspects will be set forth in part in the description which follows and, in part, will be apparent from the description, or may be learned by practice of the embodiments of the disclosure.

According to one or more embodiments, a tandem light-emitting device may include a first electrode, a second electrode facing the first electrode, m light-emitting units stacked between the first electrode and the second electrode, the m light-emitting units each including an emission layer, and m−1 charge generation layers between two adjacent light-emitting units of the m light-emitting units. M may be an integer of 5 or more. The m light-emitting units may include a first light-emitting unit, a second light-emitting unit, a third light-emitting unit, a fourth light-emitting unit, and a fifth light-emitting unit, in order of proximity to the first electrode. The m−1 charge generation layers may include a first charge generation layer, a second charge generation layer, a third charge generation layer, and a fourth charge generation layer, in order of proximity to the first electrode. At least one of the first to fifth light-emitting units may emit blue light. At least one of the first to fifth light-emitting units may emit green light. The formula $3 \leq D/(2^*\lambda_b) \leq 4$ may be satisfied. D may indicate a distance between the first electrode and the second electrode. $\lambda_b$ may indicate a maximum emission wavelength of the blue light, and may be in a range of about 400 nm to about 480 nm.

In an embodiment, m may be 5.

In an embodiment, D may be in a range of about 2,400 Å to about 3,800 Å.

In an embodiment, D may be in a range of about 2,600 Å to about 3,400 Å.

In an embodiment, the m-light emitting parts may include three light-emitting units emitting blue light, and two light-emitting units emitting green light.

In an embodiment, the first light-emitting unit, the third light-emitting unit, and the fifth light-emitting unit may each emit blue light, and the second light-emitting unit and the fourth light-emitting unit may each emit green light.

The first light-emitting unit, the third light-emitting unit, and the fifth light-emitting unit may emit blue light of a same wavelength.

The second light-emitting unit and the fourth light-emitting unit may emit green light of a same wavelength.

At least one of the m−1 charge generation layers may include an n-type charge generation layer and a p-type charge generation layer.

Each of the m light-emitting units may further include a hole transport region that transports holes to the emission layer, and an electron transport region that transports electrons to the emission layer.

The hole transport region may include at least one of a hole injection layer, a hole transport layer, and an electron blocking layer.

The electron transport region may include at least one of an electron injection layer, an electron transport layer, and a hole blocking layer.

Each layer constituting the hole transport region in any light-emitting unit other than the first light-emitting unit and each layer constituting the electron transport region in the any light-emitting unit may each have a thickness of less than or equal to about 100 Å.

At least one of the emission layers in the m light-emitting units may include a first host, and a second host. The first host and the second host may be different from each other.

At least one of the emission layers in the m light-emitting units may include a plurality of emission layers.

At least one of the plurality of emission layers of the first to fifth light-emitting units may include an organometallic compound.

The tandem light-emitting device may further include a capping layer located outside the second electrode.

According to one or more embodiments, an electronic apparatus may include the tandem light-emitting device.

In an embodiment, the electronic apparatus may further include a thin-film transistor. The thin-film transistor may include a source electrode and a drain electrode. The first electrode of the tandem light-emitting device may be electrically connected to at least one of the source electrode and the drain electrode of the thin-film transistor.

In an embodiment, the electronic apparatus may further include at least one of a color filter, a color conversion layer, a quantum dot color conversion layer, a touch screen layer, and a polarizing layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
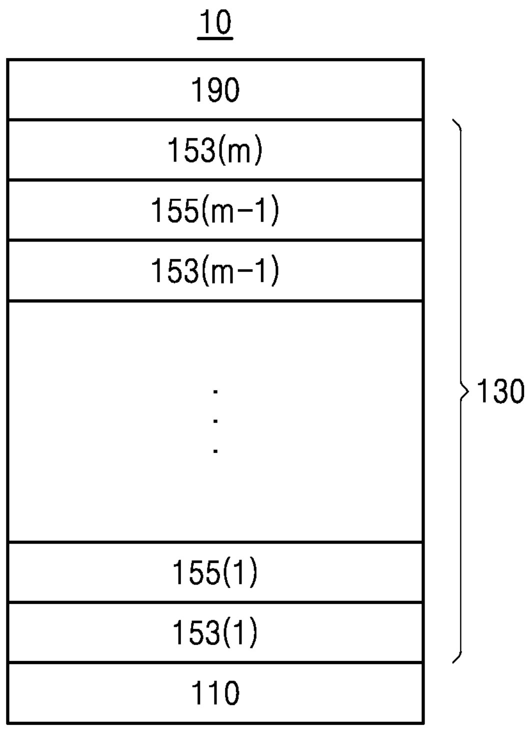
FIG. 1 is a schematic view of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will be understood that although the terms "first," "second," etc. may be used herein to describe various components, these components should not be limited by these terms. These terms are only used to distinguish one component from another.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the following embodiments, when various components such as layers, films, regions, plates, etc. are said to be "on" another component, this may include not only a case in which other components are "immediately on" the layers, films, regions, or plates, but also a case in which other components may be placed therebetween. Sizes of components in the drawings may be exaggerated for convenience of explanation.

The term "interlayer" as used herein may refer to a single layer and/or all of multiple layers between elements (e.g., the first electrode and the second electrode of the light-emitting device).

The term "maximum emission wavelength" as used herein may refer to a peak wavelength having the maximum intensity in a spectrum.

It will be understood that the terms "connected to" or "coupled to" or "contacting" may include a physical and/or electrical connection or coupling or contact.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

(Tandem Light-Emitting Device)

A tandem light-emitting device according to an embodiment may include a first electrode, a second electrode facing the first electrode, m light-emitting units stacked between the first electrode and the second electrode, the m light-emitting units each including an emission layer, and m−1 charge generation layers between two adjacent light-emitting units of the m light-emitting units. M may be an integer of 5 or more. For example, m may be 5 or 6. For example, m may be 5. The m light-emitting units may include a first light-emitting unit, a second light-emitting unit, a third light-emitting unit, a fourth light-emitting unit, and a fifth light-emitting unit, in order of proximity to the first electrode. The m−1 charge generation layers may include a first charge generation layer, a second charge generation layer, a third charge generation layer, and a fourth charge generation layer, in order of proximity to the first electrode.

For example, the first light-emitting unit may be located on the first electrode, the second light-emitting unit may be located on the first light-emitting unit, the third light-emitting unit may be located on the second light-emitting unit, the fourth light-emitting unit may be located on the third light-emitting unit, and the fifth light-emitting unit may be located on the fourth light-emitting unit. The first charge generation layer may be located between the first light-emitting unit and the second light-emitting unit, the second charge generation layer may be located between the second light-emitting unit and the third light-emitting unit, the third charge generation layer may be located between the third light-emitting unit and the fourth light-emitting unit, and the fourth charge generation layer may be located between the fourth light-emitting unit and the fifth light-emitting unit.

The tandem light-emitting device may include a light-emitting unit emitting blue light and a light-emitting unit emitting green light. For example, the first to fifth light-emitting units may each independently emit blue light or green light, wherein at least one of the first to fifth light-emitting units may emit blue light, and at least one of the first to fifth light-emitting units may emit green light.

In an embodiment, the first light-emitting unit of the tandem light-emitting device may emit blue light, the second light-emitting unit of the tandem light-emitting device may emit green light, the third light-emitting unit of the tandem light-emitting device may emit blue light, the fourth light-emitting unit of the tandem light-emitting device may emit green light, and the fifth light-emitting unit of the tandem light-emitting device may emit blue light.

In an embodiment, the light-emitting device may satisfy Formula 1:

$$3 \leq D/(2*\lambda_b) \leq 4 \quad \text{[Formula 1]}$$

In Formula 1, D indicates a distance between the first electrode and the second electrode, and $\lambda_b$ indicates a maximum emission wavelength of the blue light.

$\lambda_b$ may be in a range of about 400 nm to about 480 nm, and D may be in a range of about 2,400 Å to about 3,800 Å. For example, D may be in a range of about 2,500 Å to about 3,600 Å, or about 2,600 Å to about 3,400 Å.

For example, at least one emission layer of the tandem light-emitting device may emit blue light, and the blue light may satisfy third order resonance.

In an embodiment, the tandem light-emitting device may include multiple light-emitting units emitting blue light and multiple light-emitting units emitting green light.

In an embodiment, m may be 5.

For example, the tandem light-emitting device may include five light-emitting units.

The tandem light-emitting device may include three light-emitting units emitting blue light and two light-emitting units emitting green light.

The first light-emitting unit, the third light-emitting unit, and the fifth light-emitting unit may each emit blue light, and the second light-emitting unit and the fourth light-emitting unit may each emit green light.

The first light-emitting unit, the third light-emitting unit, and the fifth light-emitting unit may emit blue light of the same wavelength. The second light-emitting unit and the fourth light-emitting unit may emit green light of the same wavelength.

In an embodiment, at least one of the m−1 charge generation layers may include an n-type charge generation layer and a p-type charge generation layer. A charge generation layer may generate electric charges, and may inject the generated electric charges into an adjacent light-emitting unit. For example, the n-type charge generation layer may be an n-type organic semiconductor layer, and the p-type charge generation layer may be a p-type organic semiconductor layer. For example, the n-type charge generation layer may include an organic layer including an n-type dopant, and the p-type charge generation layer may include an organic layer including a p-type dopant.

In an embodiment, the first light-emitting unit may include a first emission layer, the second light-emitting unit may include a second emission layer, the third light-emitting unit may include a third emission layer, the fourth light-emitting unit may include a fourth emission layer, and the fifth light-emitting unit may include a fifth emission layer.

In an embodiment, each of the m light-emitting units may include, in addition to the emission layer, a hole transport region for transporting holes to the emission layer and an electron transport region for transporting electrons to the emission layer. The hole transport region may include at least one of a hole injection layer, a hole transport layer, and an electron blocking layer. The electron transport region may include at least one of an electron injection layer, an electron transport layer, and a hole blocking layer.

In an embodiment, each layer constituting the hole transport region and the electron transport region in each light-emitting unit may have a thickness of less than or equal to about 100 Å, except for a layer constituting the hole transport region of the first light-emitting unit. For example, in case that the hole transport region in any light-emitting unit other than the first light-emitting unit includes a hole transport layer and an electron blocking layer, the hole transport layer and the electron blocking layer may each have a thickness of less than or equal to about 100 Å. In case that the electron transport region in the any light-emitting unit includes an electron transport layer and a hole blocking layer, the electron transport layer and the hole blocking layer may each have a thickness of less than or equal to about 100 Å. In case that each of the layers has a thickness of less than or equal to about 100 Å, the light-emitting device may have a reduced thickness, and may satisfy Formula 1.

In an embodiment, at least one of the m emission layers may include a first host and a second host, and the first host and the second host may be different from each other. For example, the first host may be a hole transport host, and the second host may be an electron transport host.

In an embodiment, at least one of the m emission layers may include multiple emission layers. For example, multiple emission layers in the same light-emitting unit may emit light of the same color, but may include different hosts. For example, the same light-emitting unit may include two emission layers emitting the same color, and these emission layers may include different hosts. For example, the same light-emitting unit may include two emission layers emitting blue light, and these emission layers may include different hosts.

In an embodiment, at least one of the first to fifth light-emitting units may include an organometallic compound. The organometallic compound may be a phosphorescent dopant of an emission layer.

In an embodiment, at least one of the first to fifth light-emitting units may include a boron compound. The boron compound may be a delayed fluorescence dopant of an emission layer.

For example, the emission layer of a light-emitting unit emitting green light may include an organometallic compound. For example, the emission layer of a light-emitting unit emitting blue light may include a boron compound as a delayed fluorescence dopant.

In an embodiment, the tandem light-emitting device may further include a capping layer located outside the second electrode. The capping layer may increase the external extraction efficiency of light emitted from a light-emitting unit.

Another aspect of the disclosure provides an electronic apparatus including the tandem light-emitting device. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a quantum dot color conversion layer, a touch screen layer, a polarizing layer, or any combination thereof.

More details of the electronic apparatus may be referred to the descriptions provided herein.

Figure 2:
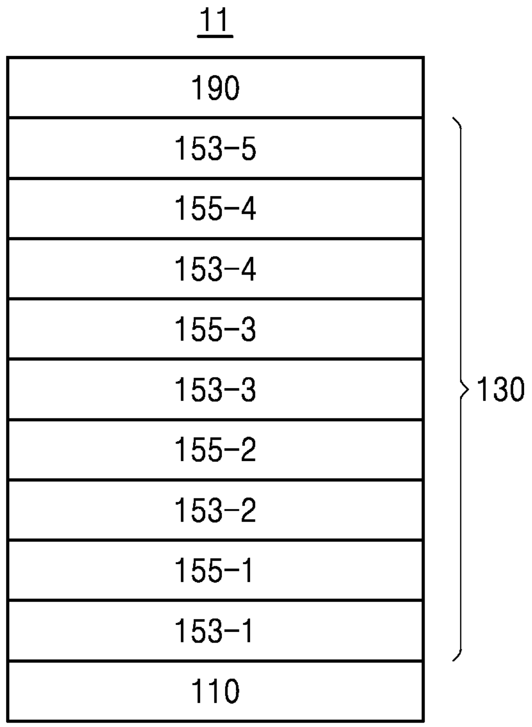
FIG. 2 is a schematic view of a light-emitting device according to another embodiment.

[Description of FIGS. 1 and 2]

FIG. 1 is a schematic cross-sectional view of a light-emitting device 10 according to an embodiment.

The light-emitting device 10 of FIG. 1 may have a structure in which a first electrode 110, an interlayer 130, and a second electrode 190 are sequentially stacked in this stated order.

The interlayer 130 may include: m light-emitting units 153(1) to **153(*m*); and m−1 charge generation layers 155(1) to 155(*m*−1)** between two adjacent light-emitting units of the m light-emitting units.

FIG. 2 is a cross-sectional view of an embodiment of the light-emitting device of FIG. 1, in particular, of a light-emitting device 11 wherein m is 5.

The light-emitting device 11 of FIG. 2 may have a structure in which the first electrode 110, a first light-emitting unit 153-1, a first charge generation layer 155-1, a second light-emitting unit 153-2, a second charge generation layer 155-2, a third light-emitting unit 153-3, a third charge generation layer 155-3, a fourth light-emitting unit 153-4, a fourth charge generation layer 155-4, a fifth light-emitting unit 153-5, and the second electrode 190 are sequentially stacked in this stated order.

Hereinafter, the structure of each of the light-emitting devices 10 and 11 according to embodiments and a method of manufacturing the same will be described in connection with FIGS. 1 and 2.

[First Electrode 110]

In FIG. 1, a substrate may be further included under the first electrode 110 or above the second electrode 190. In an embodiment, the substrate may be a glass substrate or a plastic substrate. In one or more embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. In case that the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, in case that the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, in case that the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a layer or a structure including multiple layers. For example, the first electrode 110 may have a three-layer structure of ITO/Ag/ITO.

[Interlayer 130]

The interlayer 130 may include m light-emitting units 153(1), . . . , **153(*m*−1), and 153(m) and m−1 charge generation layers 155(1), . . . , 155(*m*−2), and 155(m−1) between the first electrode 110 and the second electrode 190**.

The interlayer 130 may include an emission layer in each light-emitting unit. The interlayer 130 may include, in each light-emitting unit, a hole transport region between the first electrode 110 and the emission layer, or a hole transport region between a charge generation layer, which is adjacent to the light-emitting unit in the direction of the first electrode 110, and the emission layer. The interlayer 130 may include, in each light-emitting unit, an electron transport region between the emission layer and the second electrode 190, or an electron transport region between a charge generation layer, which is adjacent to the light-emitting unit in the direction of the second electrode 190, and the emission layer.

In an embodiment, the layers constituting the interlayer 130 may further include, in addition to various organic materials, a metal-containing compound such as an organometallic compound, an inorganic material such as a quantum dot, and the like.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or any combination thereof.

For example, the hole transport region may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked in its respective stated order from the first electrode 110 but the structure of the hole transport region is not limited thereto.

The hole transport region may include a compound represented by Formula 201, a compound represented by Formula 202, or any combination thereof:

[Formula 201]

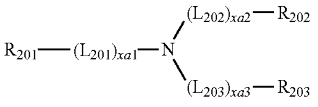

[Formula 202]

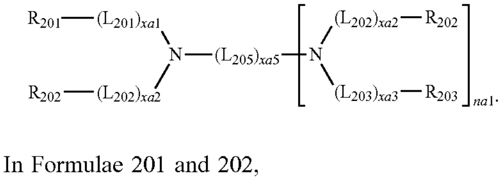

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (e.g., a carbazole group, etc.) unsubstituted or substituted with at least one $R_{10a}$ (e.g., Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

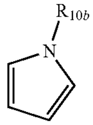

CY202

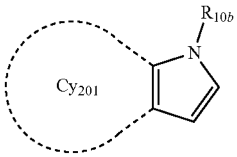

CY203

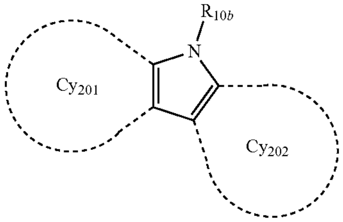

CY204

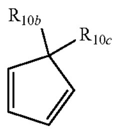

CY205

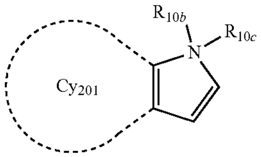

-continued

CY206

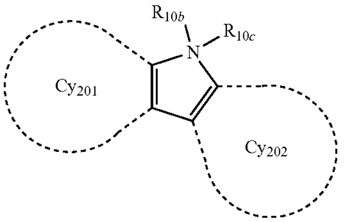

CY207

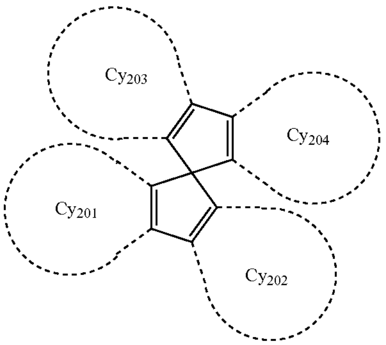

CY208

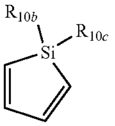

CY209

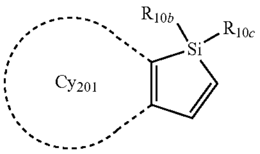

CY210

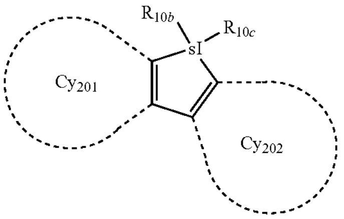

CY211

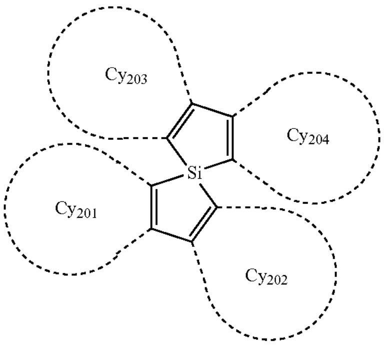

CY212

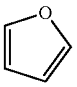

-continued

CY213

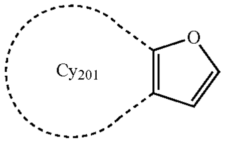

CY214

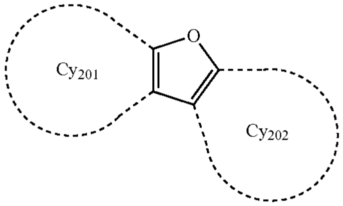

CY215

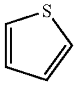

CY216

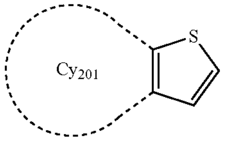

CY217

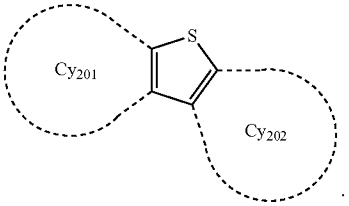

In Formulae CY201 to CY217, $R_{10b}$ and $R_{10c}$ may each independently be as defined in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be one of the groups represented by Formulae CY201 to CY203, xa2 may be 0, and $R_{202}$ may be one of the groups represented by Formulae CY204 to CY207.

In one or more embodiments, each of Formulae 201 and 202 may not include the groups represented by Formulae CY201 to CY203.

In one or more embodiments, each of Formulae 201 and 202 may not include the groups represented by Formulae CY201 to CY203, and may include at least one of the groups represented by Formulae CY204 to CY217.

In one or more embodiments, each of Formulae 201 and 202 may not include the groups represented by Formulae CY201 to CY217.

For example, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

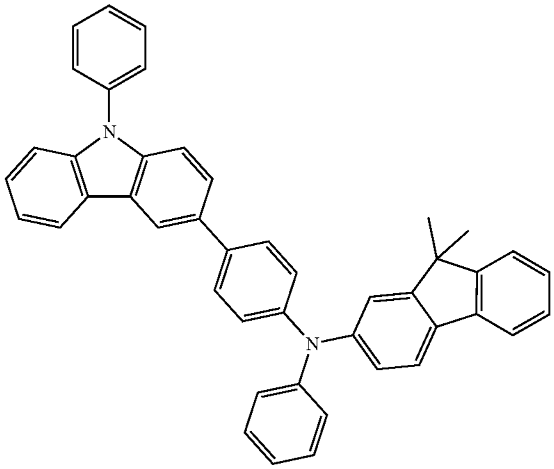

HT2

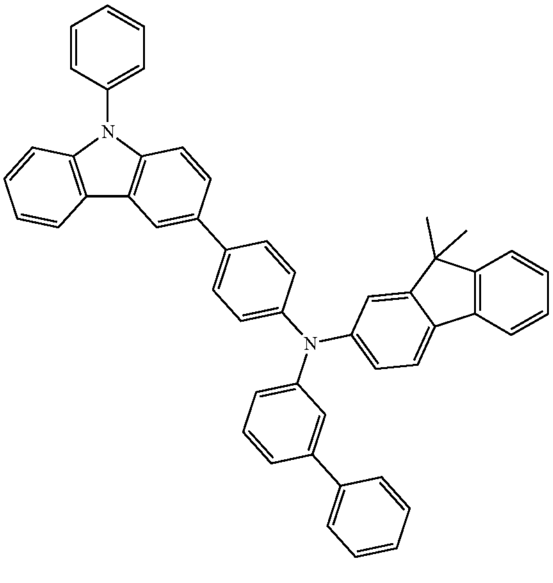

-continued
HT3
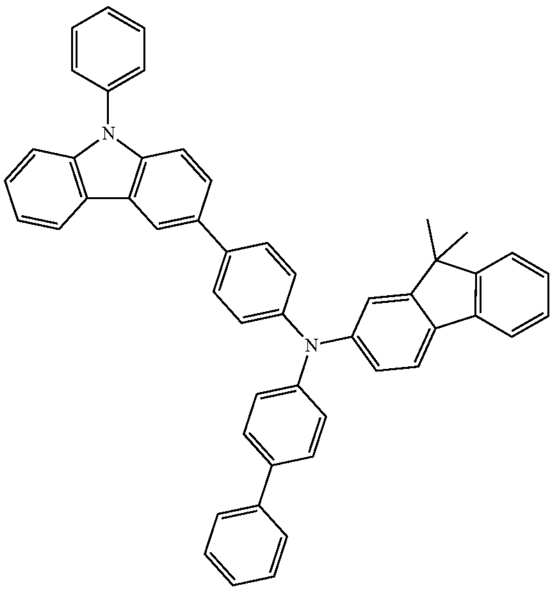
HT4
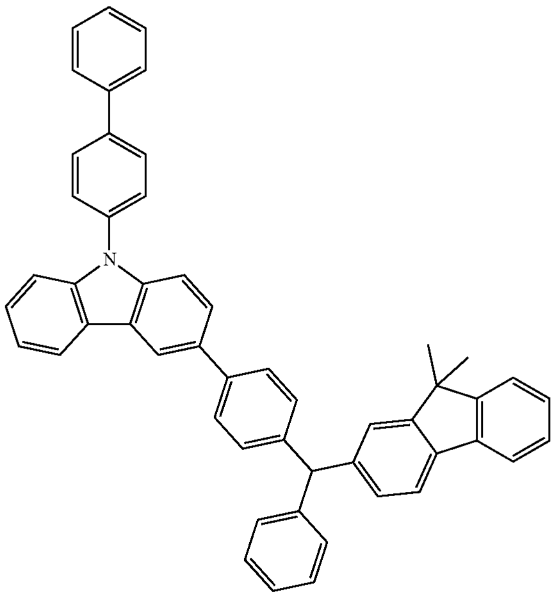
HT5
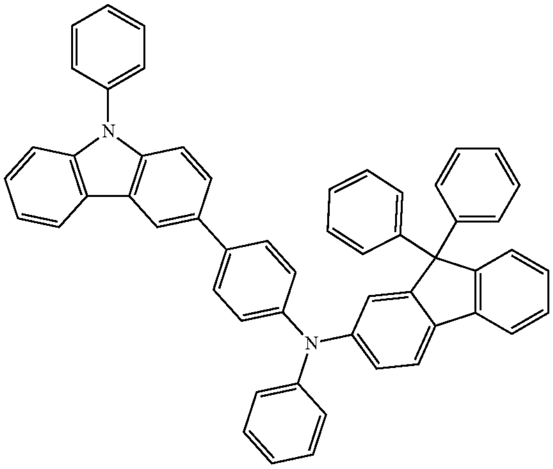
HT6
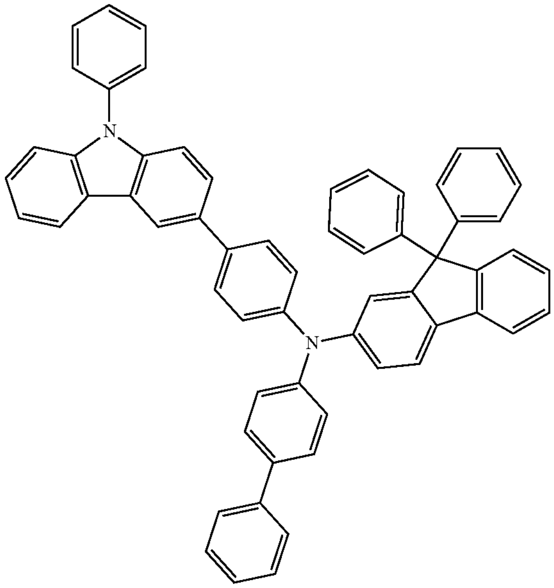

-continued
HT7
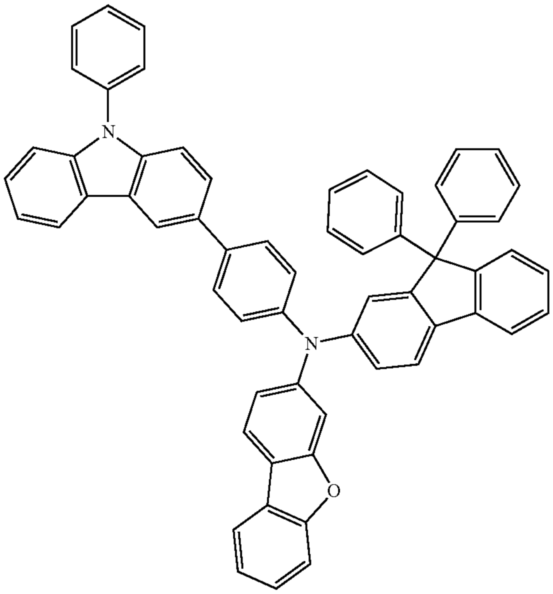
HT8
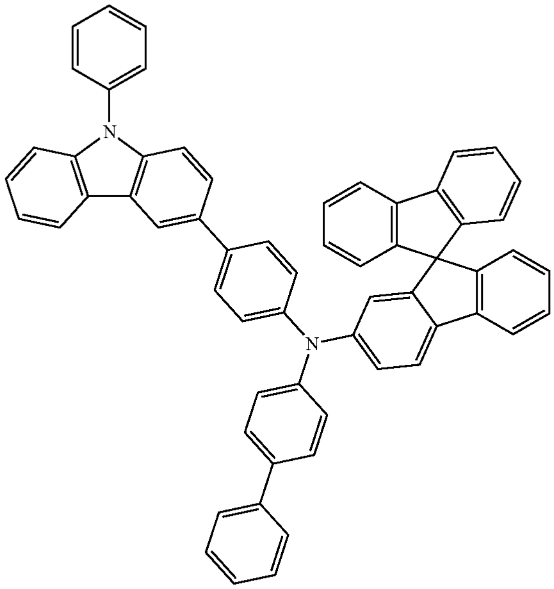
HT9
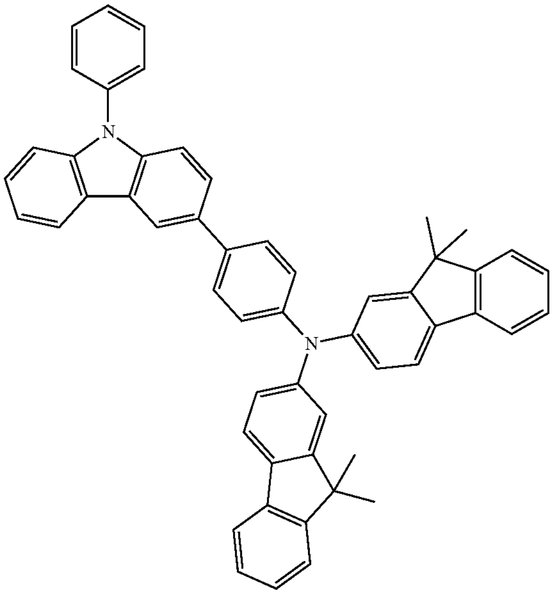
HT10
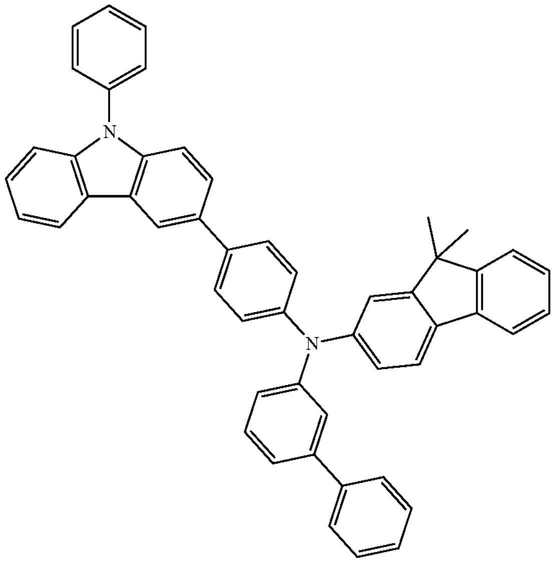

-continued
HT11
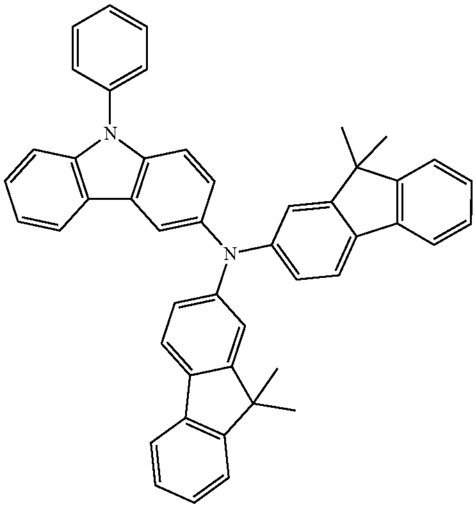
HT12
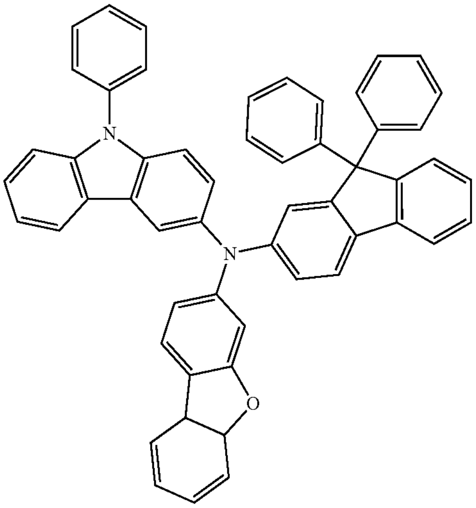
HT13
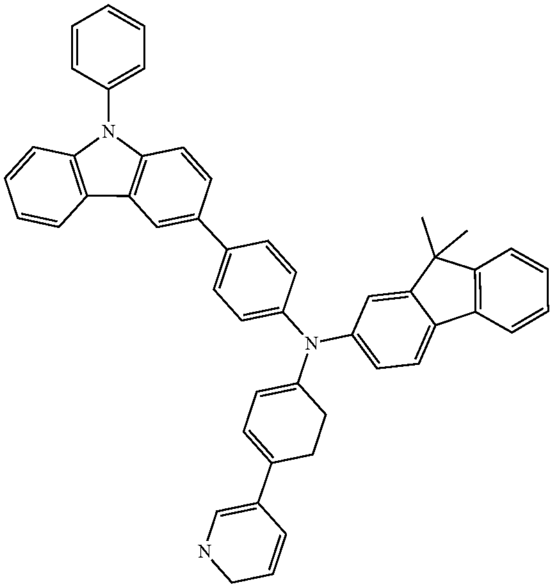
HT14
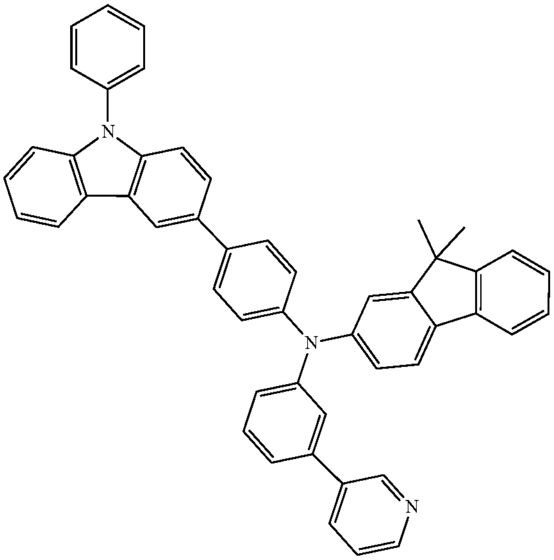
HT15
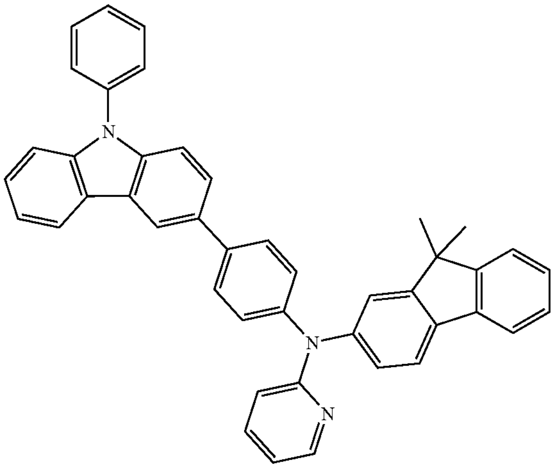
HT16
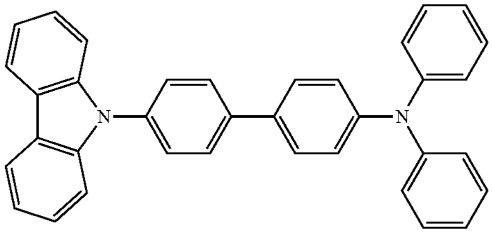

-continued
HT17
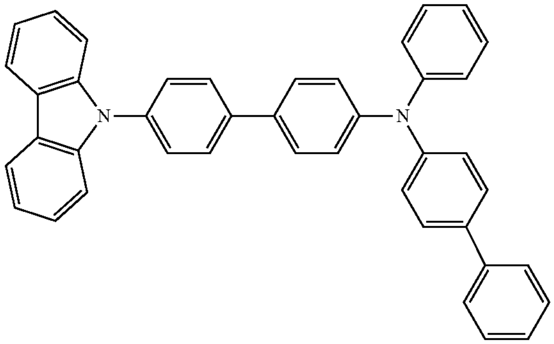
HT18
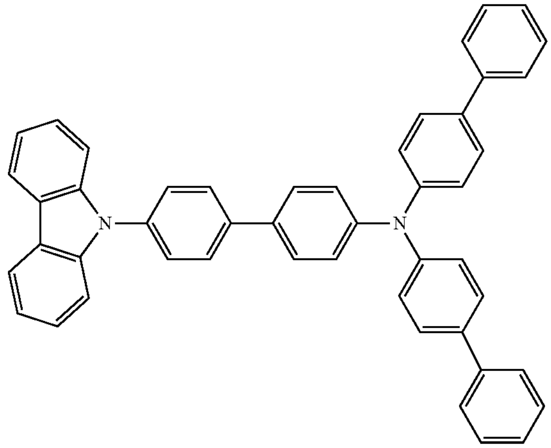
HT19
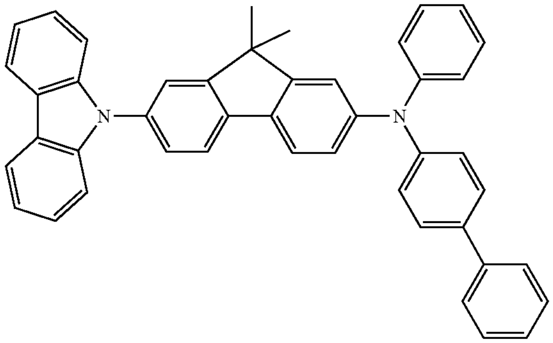
HT20
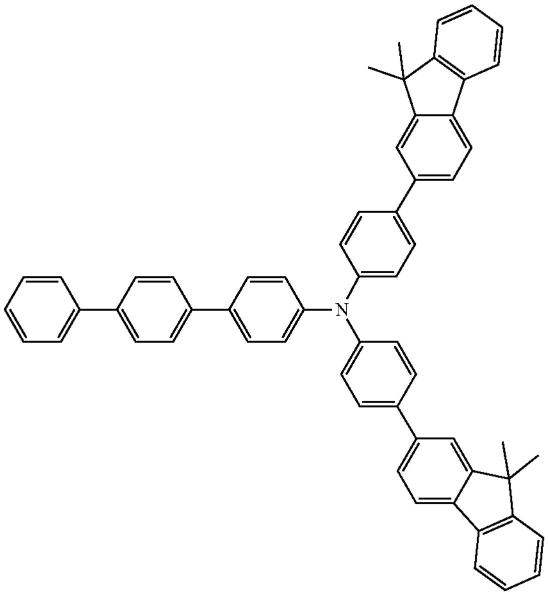

-continued
HT21
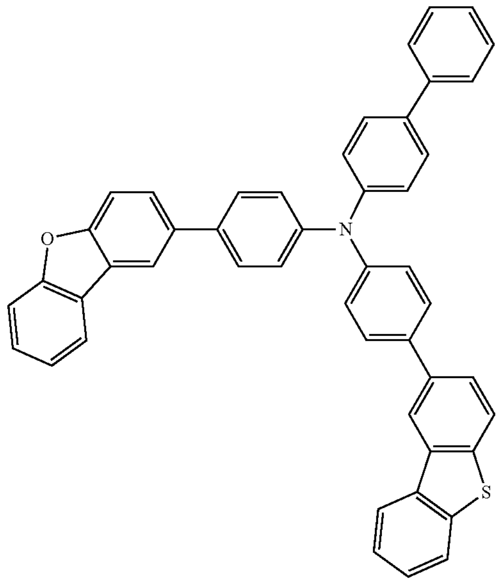
HT22
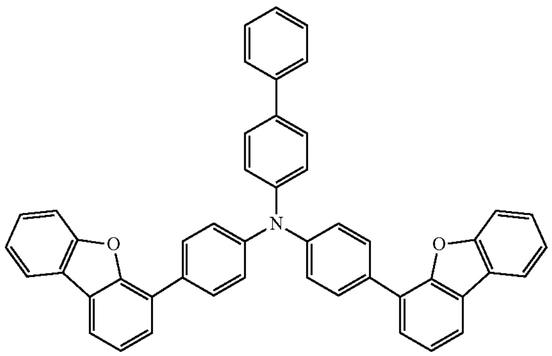
HT23
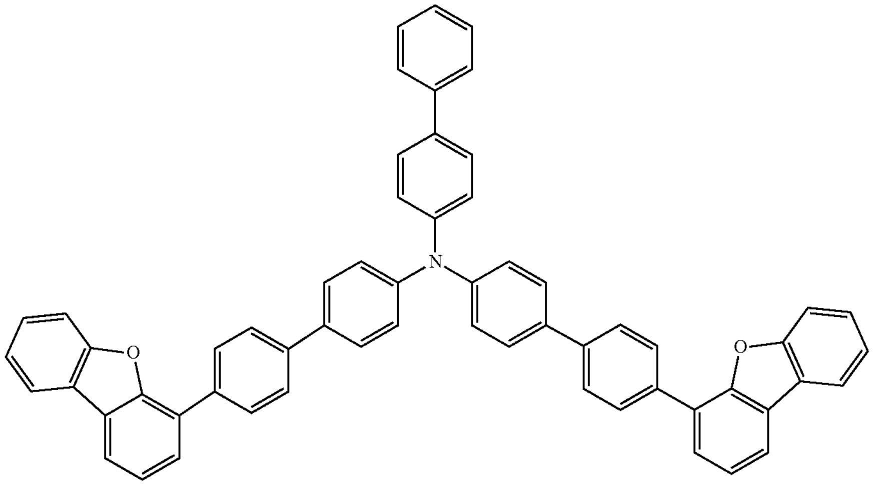

-continued
HT24
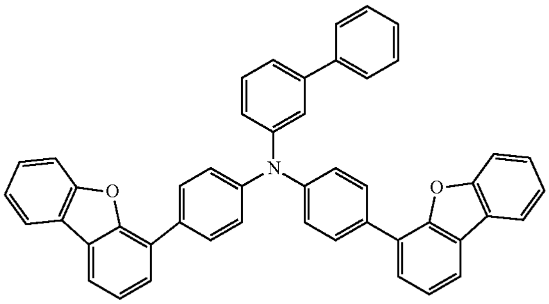
HT25
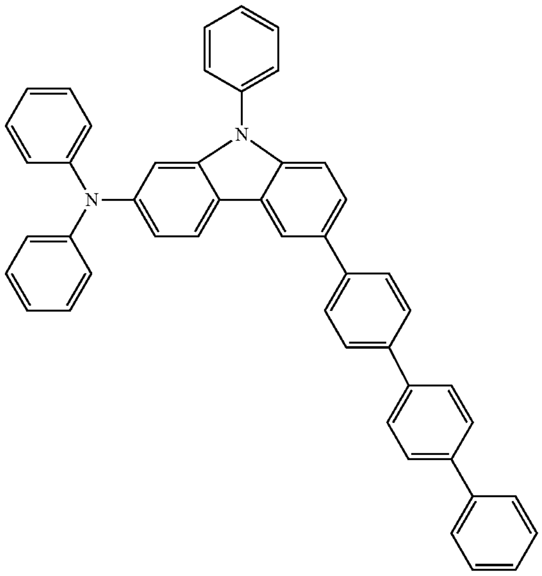
HT26
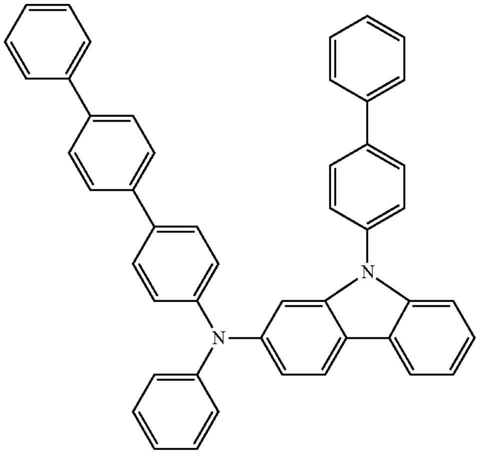
HT27
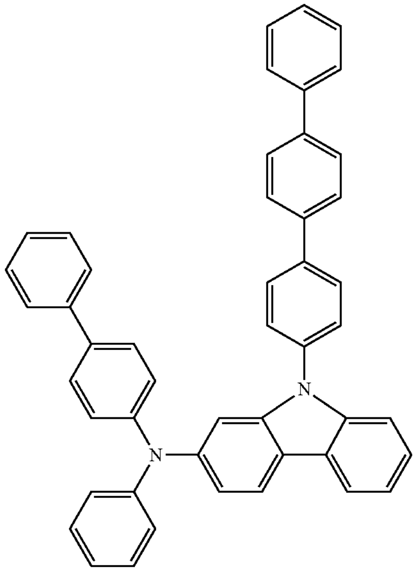
HT28
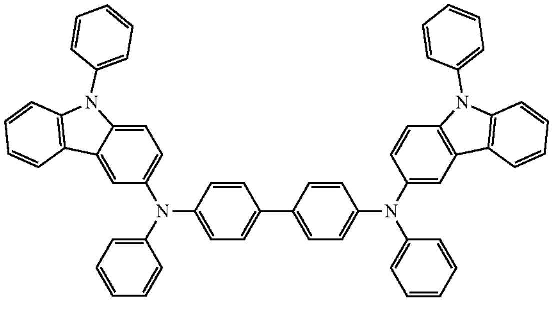
HT29
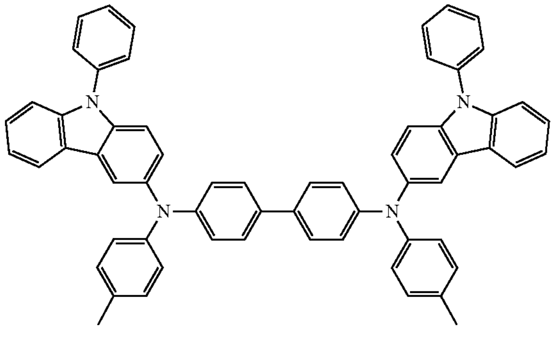

-continued
HT30
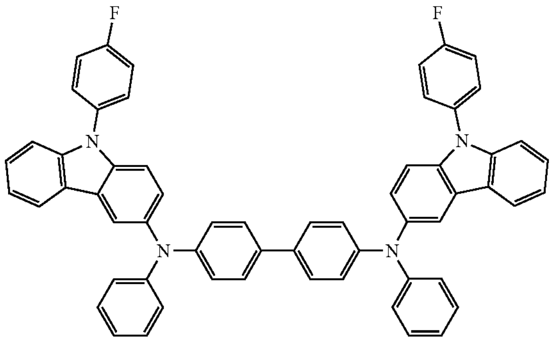
HT31
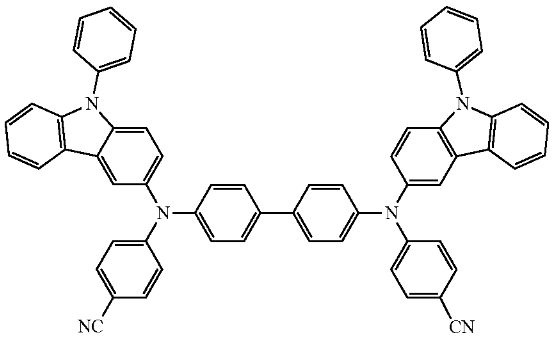
HT32
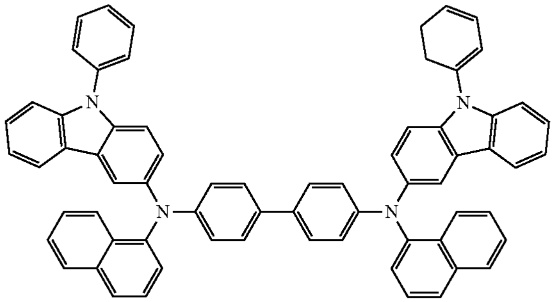
HT33
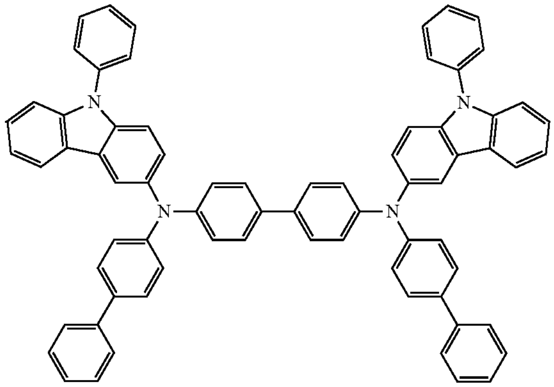
HT34
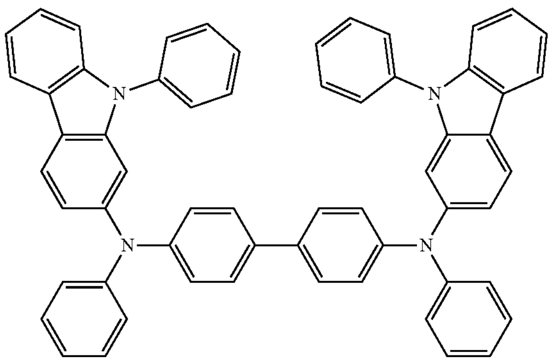
HT35
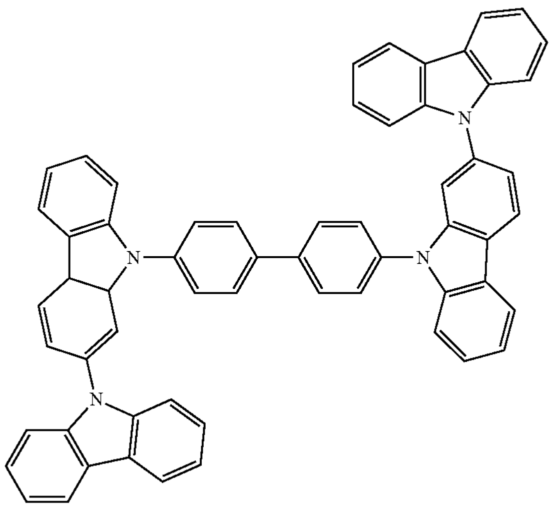

-continued
HT36
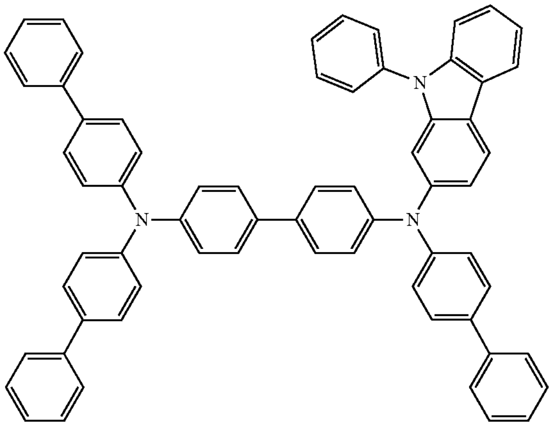
HT37
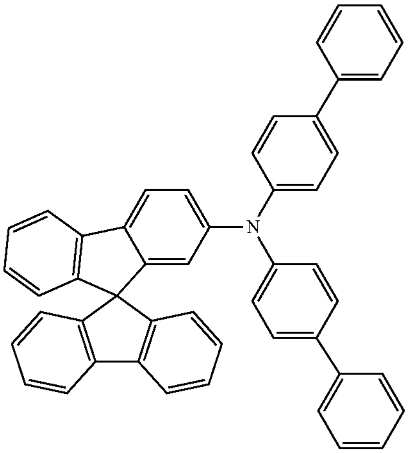
HT38
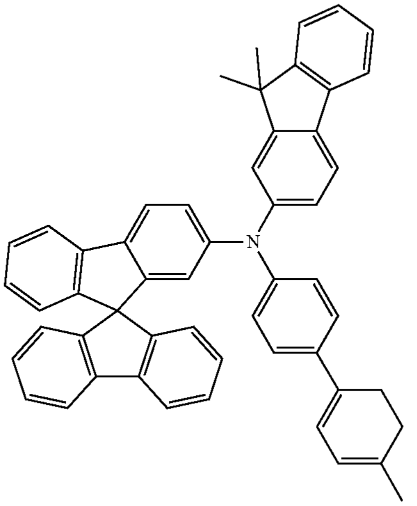
HT39
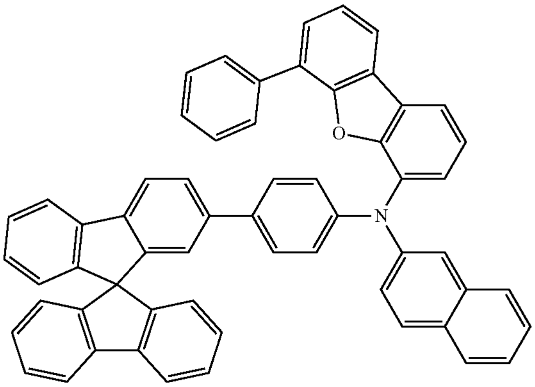
HT40
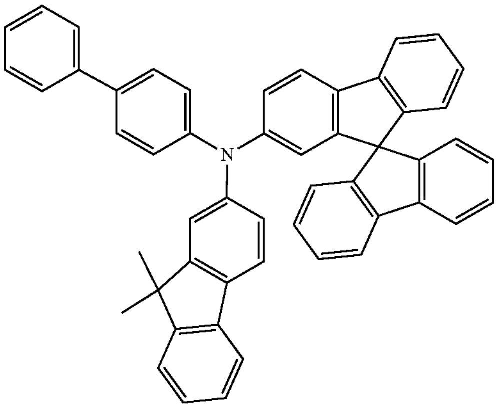
HT41
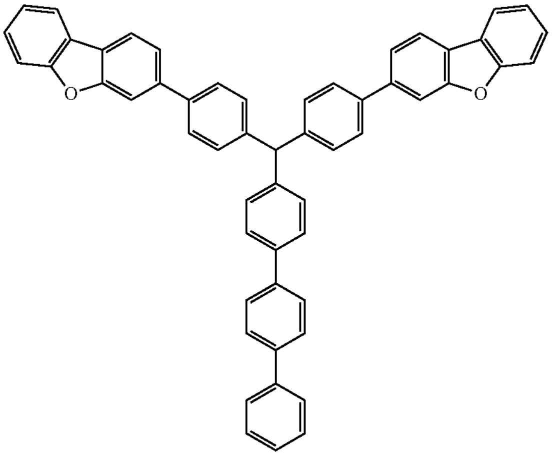

-continued
HT42
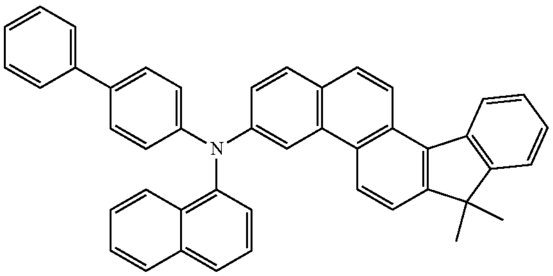
HT43
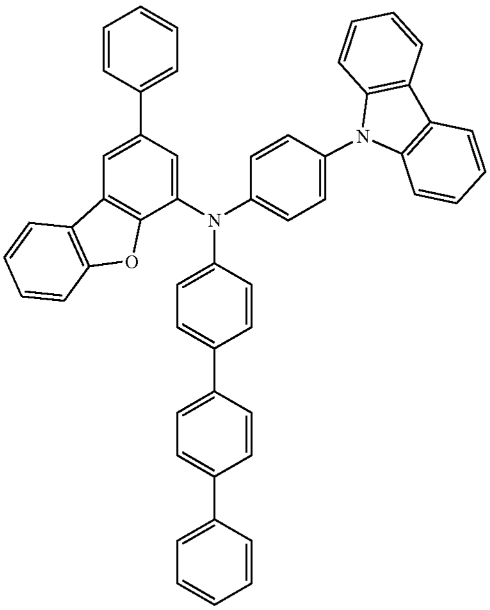
HT44
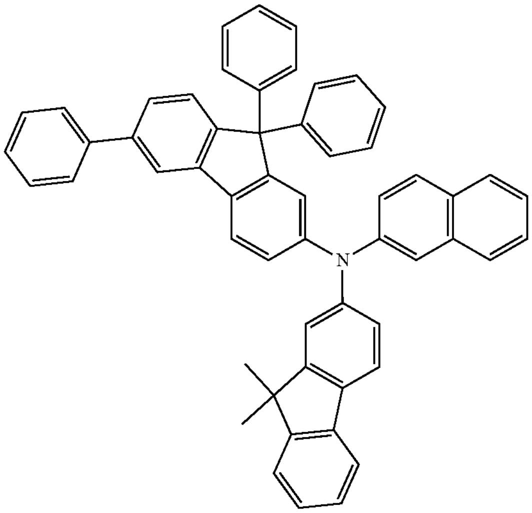
HT45
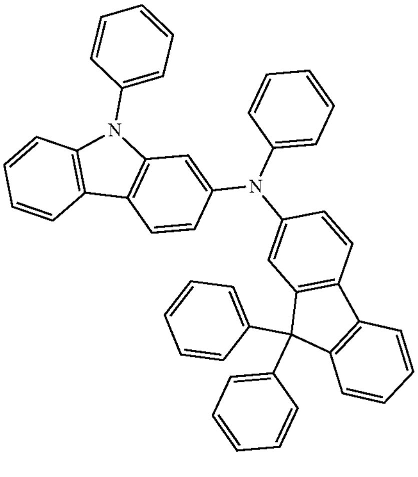

-continued
HT46
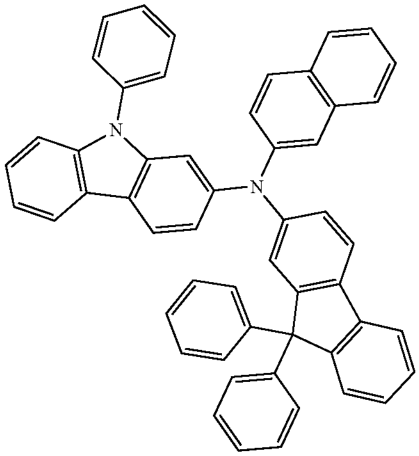
m-MTDATA
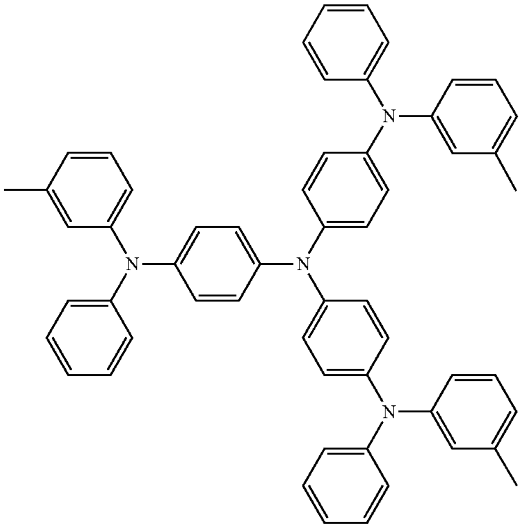
TDATA
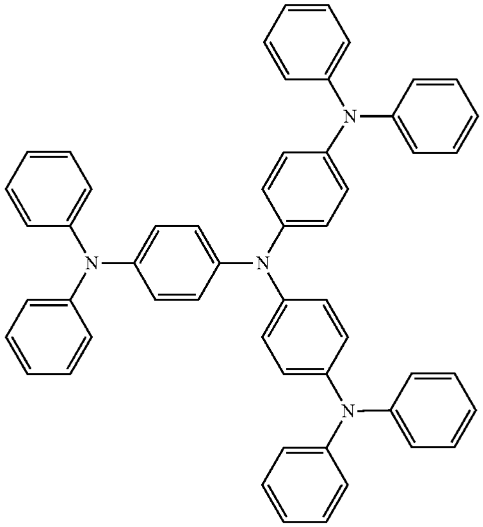
2-TNATA
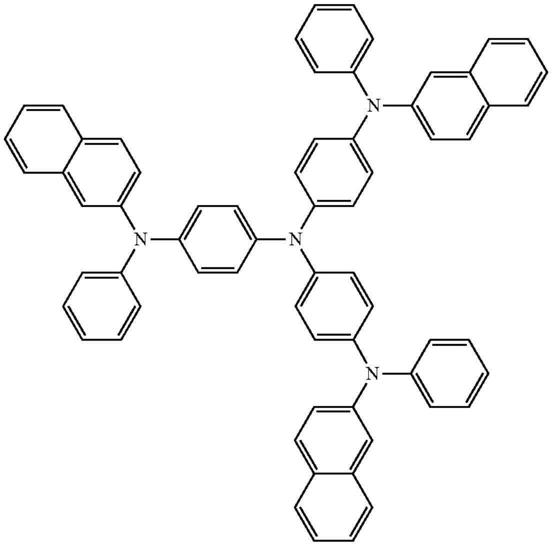
NPB
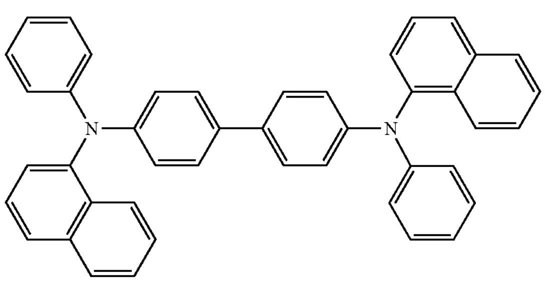
β-NPB
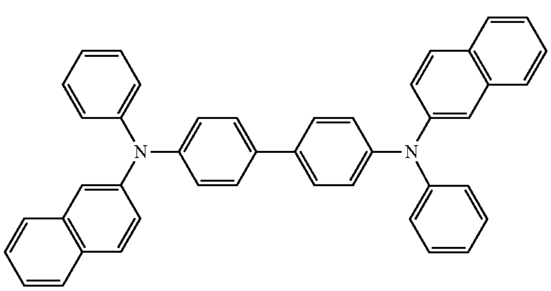

-continued

TPD

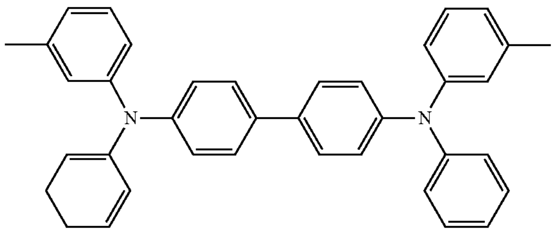

Spiro-TPD

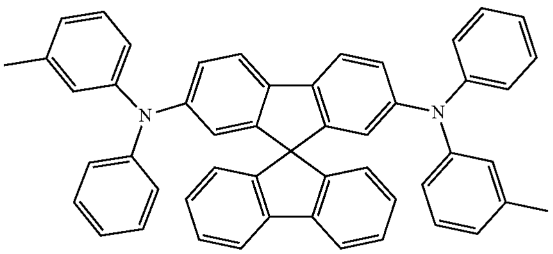

Spiro-NPB

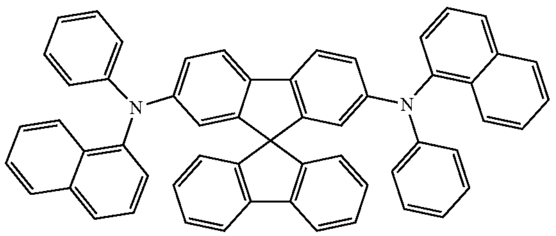

methylated-NPB

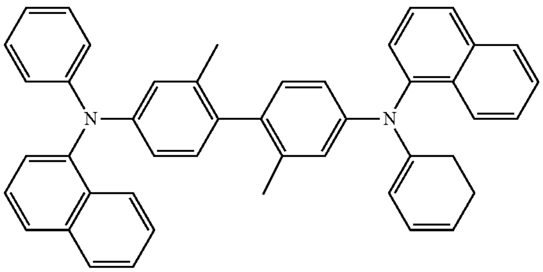

TAPC

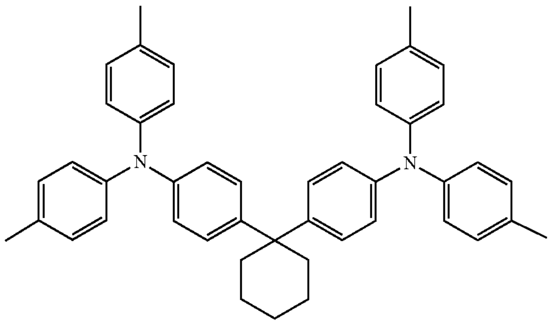

HMTPD

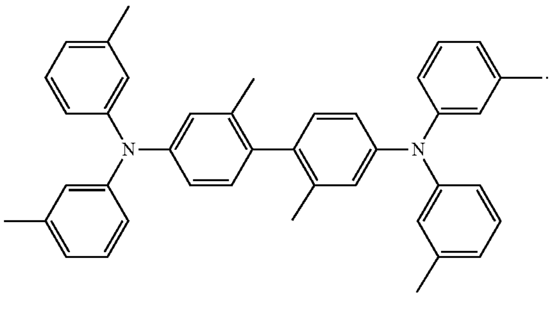

A thickness of the hole transport region may be in a range of about 50 Å to about 10,000 Å, for example, about 100 Å to about 4,000 Å. In case that the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. In case that the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the leakage of electrons from the emission layer to the hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the p-dopant may have a lowest unoccupied molecular orbital (LUMO) energy level of less than or equal to about −3.5 eV.

In an embodiment, the p-dopant may include a quinone derivative, a cyano group-containing compound, a compound including element EL1 and element EL2, or any combination thereof.

Examples of a quinone derivative may include TCNQ, F4-TCNQ, and the like.

Examples of a cyano group-containing compound may include HAT-CN, a compound represented by Formula 221, and the like:

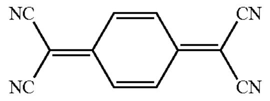

TCNQ

-continued

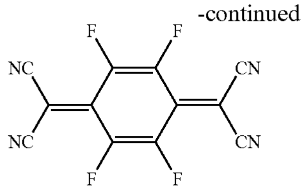

F4-TCNQ

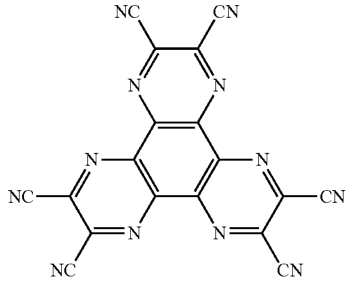

HAT-CN

[Formula 221]

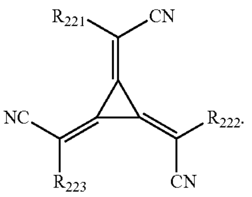

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of a metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (PD13), terbium (Tb), dysprosium (Dy), holmium (Ho), erbium (Er), thulium (Tm), ytterbium (Yb), lutetium (Lu), etc.); and the like.

Examples of a metalloid may include silicon (Si), antimony (Sb), tellurium (Te), and the like.

Examples of a non-metal may include oxygen (O), a halogen (for example, F, Cl, Br, I, etc.), and the like.

Examples of a compound including element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of a metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), a rhenium oxide (for example, $ReO_3$, etc.), and the like.

Examples of a metal halide may include an alkali metal halide, an alkaline earth metal halide, a transition metal halide, a post-transition metal halide, a lanthanide metal halide, and the like.

Examples of an alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of an alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of a transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of a post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of a lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of a metalloid halide may include an antimony halide (for example, $SbCl_5$, etc.) and the like.

Examples of a metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, PD13Te, TbTe, DyTe, HoTe, ErTe, TmTe, YbTe, LuTe, etc.), and the like.

In an embodiment, the p-dopant compound described above may be included in a charge generation layer as disclosed herein. For example, the p-dopant compound described above may be included in a p-type charge generation layer.

[Emission Layer in Interlayer 130]

In an embodiment, the emission layer may include a host and a dopant. The dopant may include a phosphorescent dopant, a fluorescent dopant, or any combination thereof.

An amount of the dopant in the emission layer may be in a range of about 0.01 part by weight to about 15 parts by weight based on 100 parts by weight of the host.

In one or more embodiments, the emission layer may include a quantum dot.

In one or more embodiments, the emission layer may include a delayed fluorescence material. The delayed fluorescence material may serve as a host or as a dopant in the emission layer.

A thickness of the emission layer may be in a range of about 100 Å to about 1,000 Å, for example, about 200 Å to about 600 Å. In case that the thickness of the emission layer is within these ranges, excellent luminescence characteristics may be obtained without a substantial increase in driving voltage.

[Host]

In an embodiment, the host may include a compound represented by Formula 301:

[Formula 301]

$$[Ar_{301}]_{xb11}—[(L_{301})_{xb1}-R_{301}]_{xb21}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$) ($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ may each independently be as defined in connection with $Q_1$.

For example, in Formula 301, in case that xb11 is 2 or more, two or more of $Ar_{301}$ may be linked to each other via a single bond.

In one or more embodiments, the host may include a compound represented by Formula 301-1, a compound represented by Formula 301-2, or any combination thereof:

[Formula 301-1]

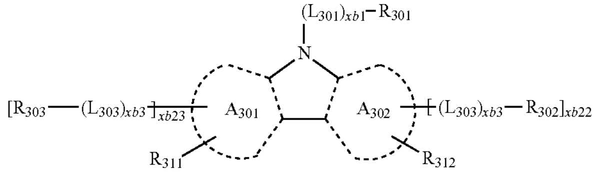

[Formula 301-2]

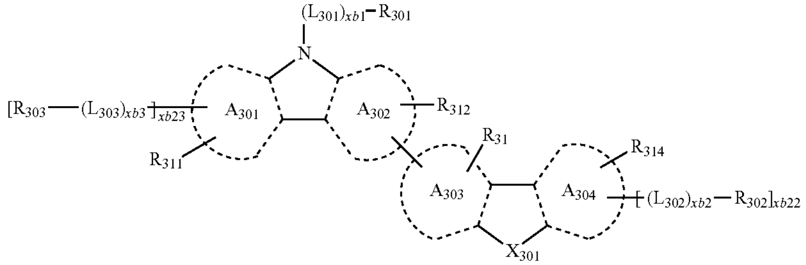

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N—[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be as defined herein, $L_{302}$ to $L_{304}$ may each independently be as defined in connection with $L_{301}$, xb2 to xb4 may each independently be as defined in connection with xb1, and $R_{302}$ to $R_{305}$ and $R_{311}$ to $R_{314}$ may each independently be as defined in connection with $R_{301}$.

In one or more embodiments, the host may include an alkali earth metal complex, a post-transition metal complex, or any combination thereof. In one or more embodiments, the host may include a Be complex (for example, Compound H55), a Mg complex, a Zn complex, or any combination thereof.

In one or more embodiments, the host may include: one of Compounds H1 to H126; 9,10-di(2-naphthyl)anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di-9-carbazolylbenzene (mCP); 1,3,5-tri(carbazol-9-yl)benzene (TCP); or any combination thereof:

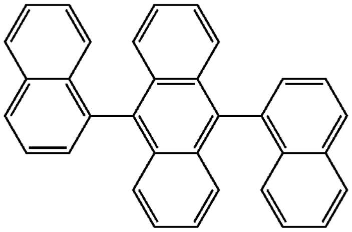
H1
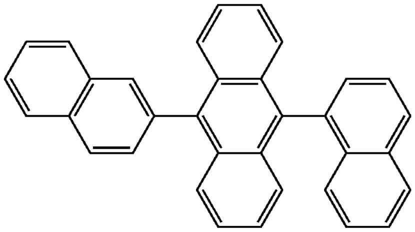
H2
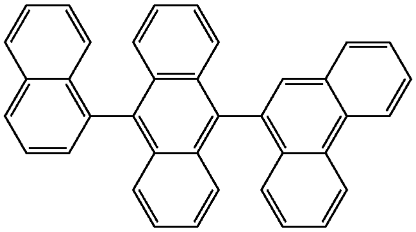
H3
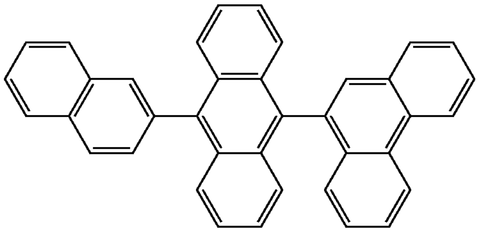
H4
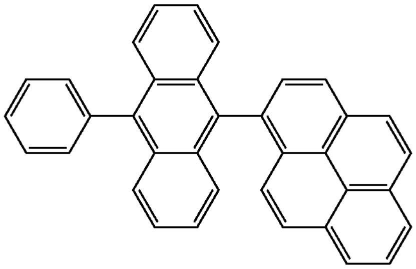
H5
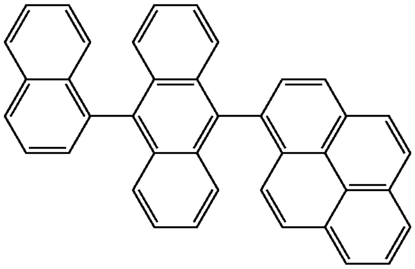
H6
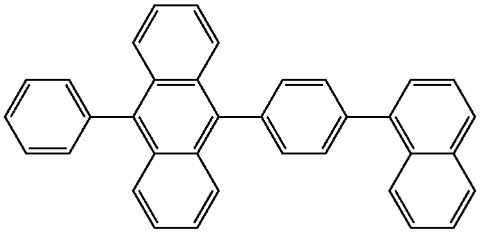
H7
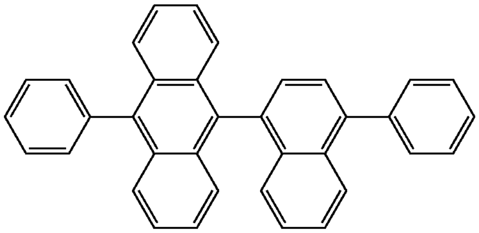
H8
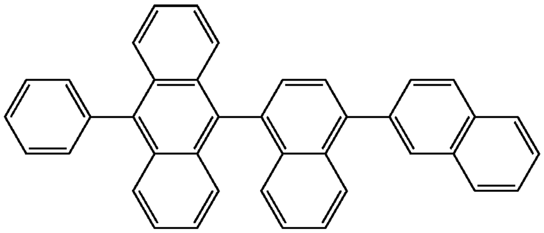
H9
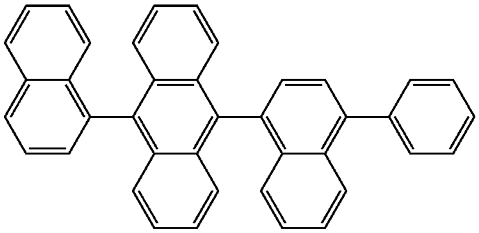
H10
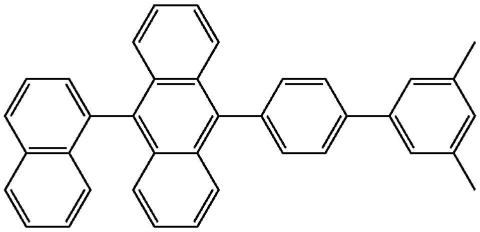
H11
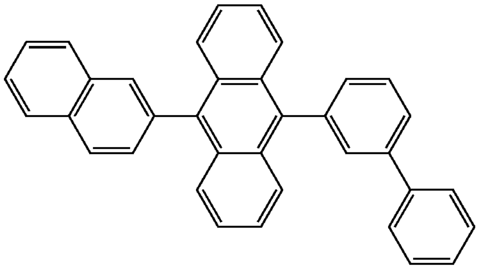
H12

-continued
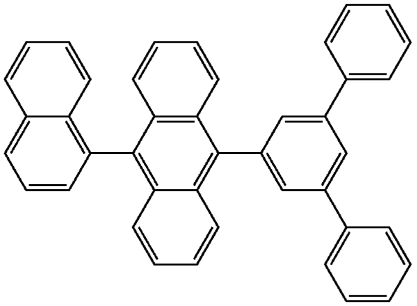
H13
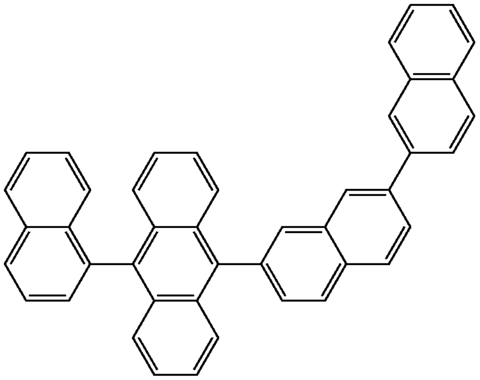
H14
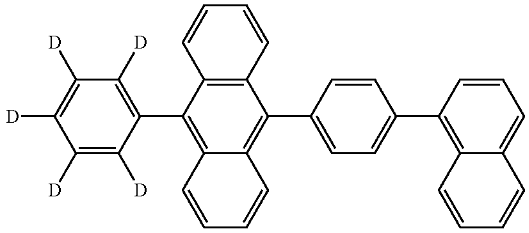
H15
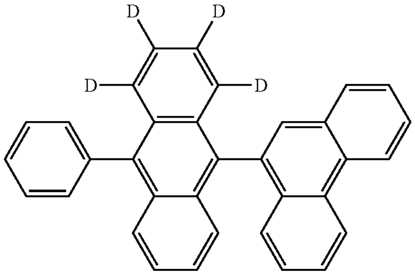
H16
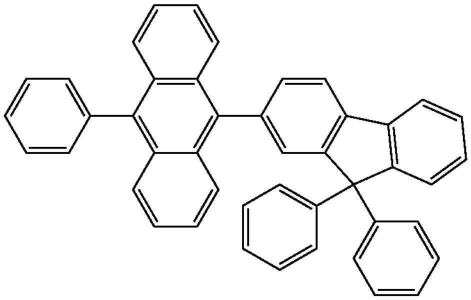
H17
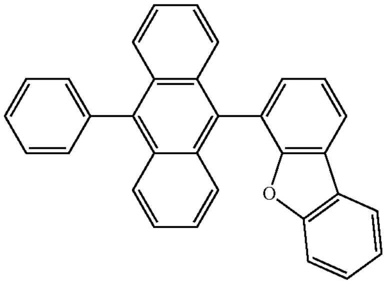
H18
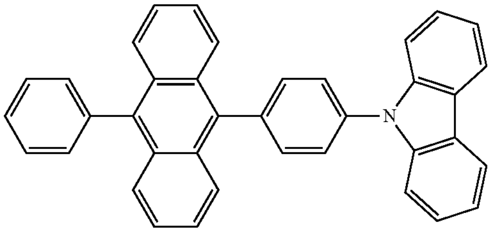
H19
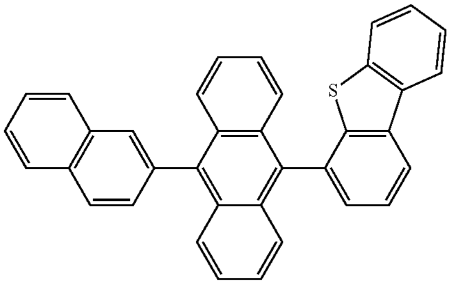
H20

-continued
H21
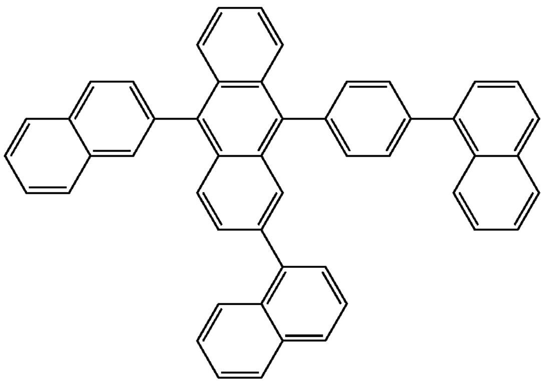
H22
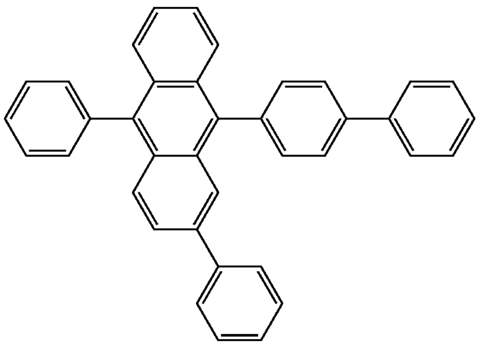
H23
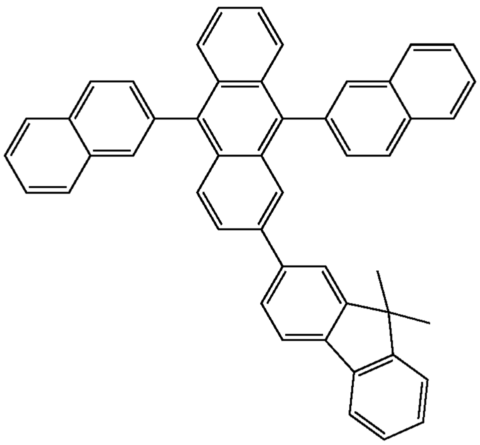
H24
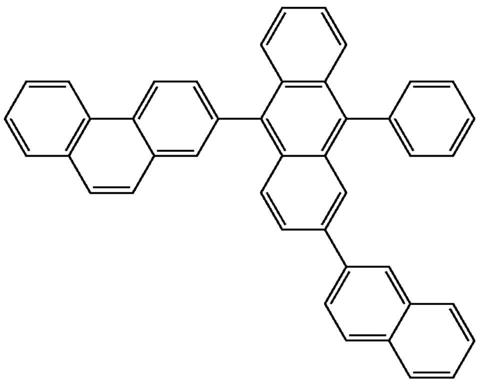
H25
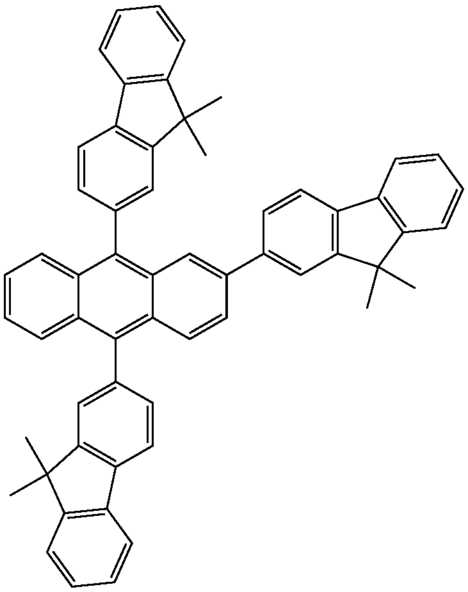
H26
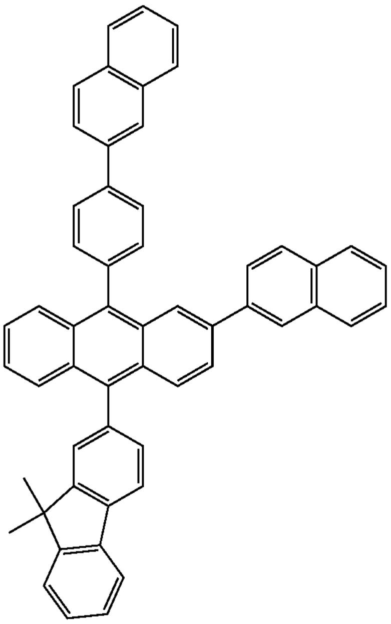

-continued
H27
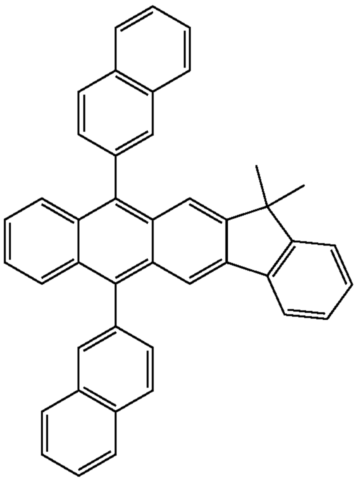
H28
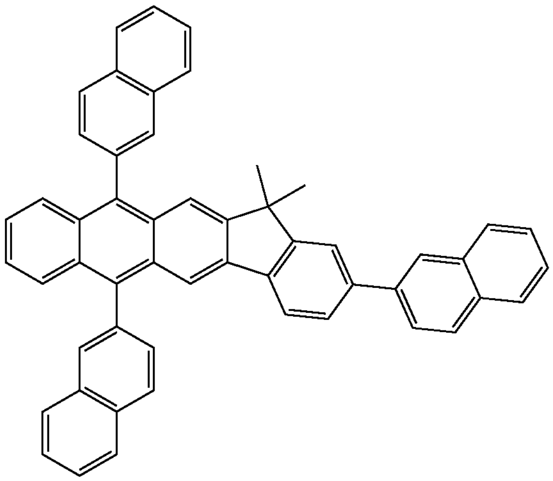
H29
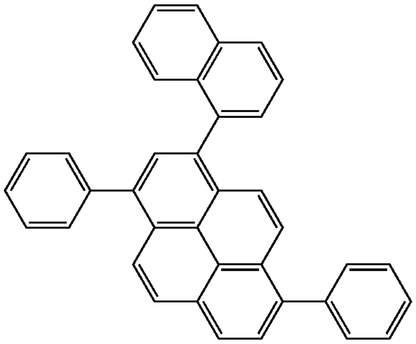
H30
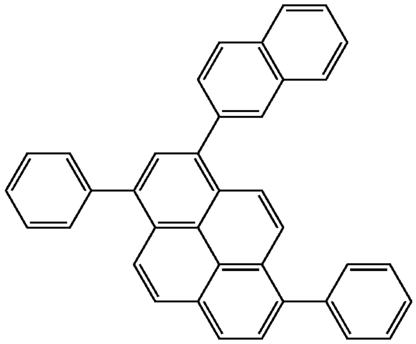
H31
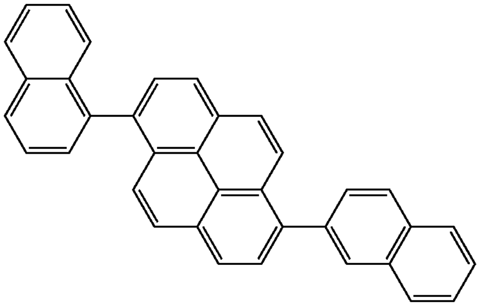
H32
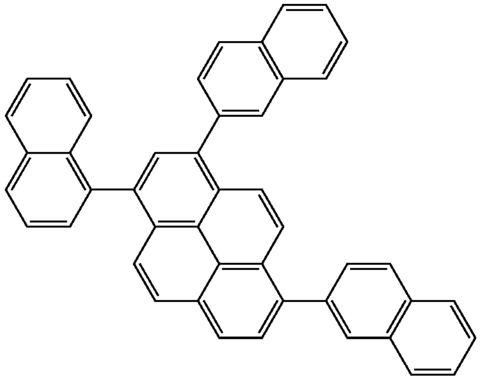
H33
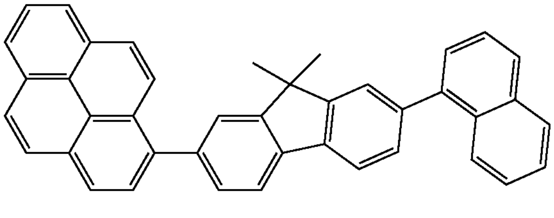
H34
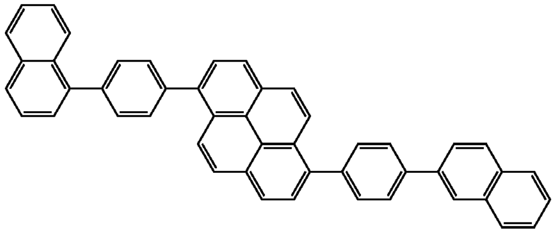

-continued
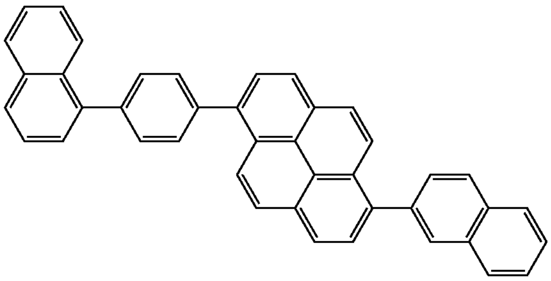
H35
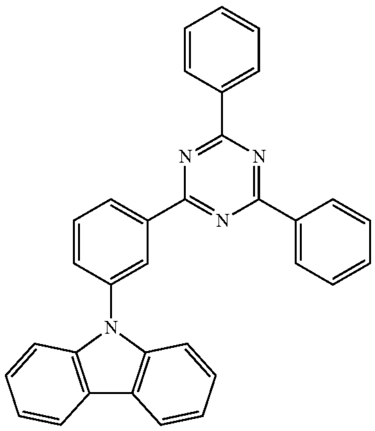
H36
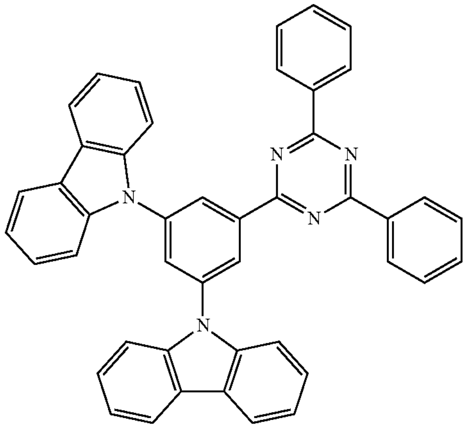
H37
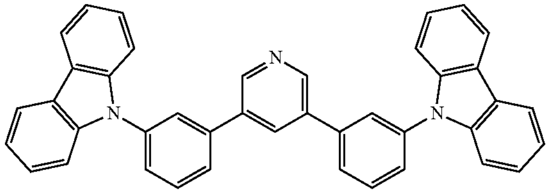
H38
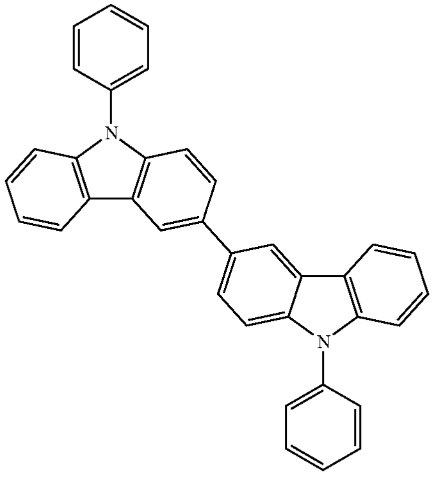
H39
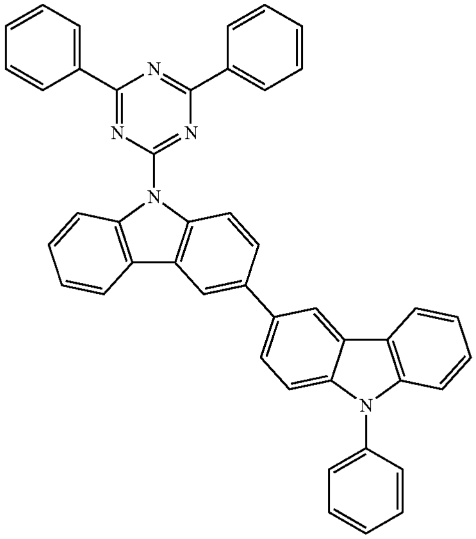
H40

-continued
H41
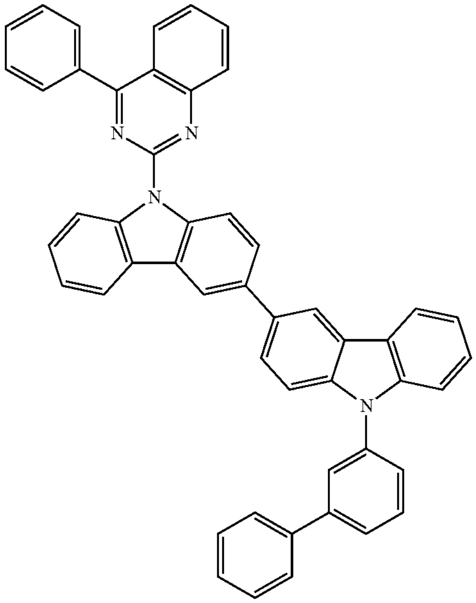
H42
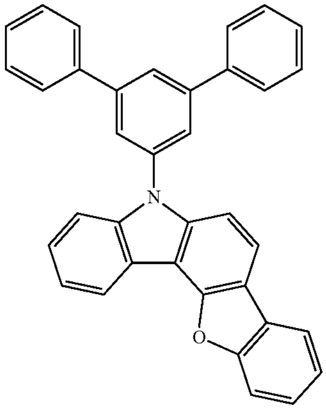
H43
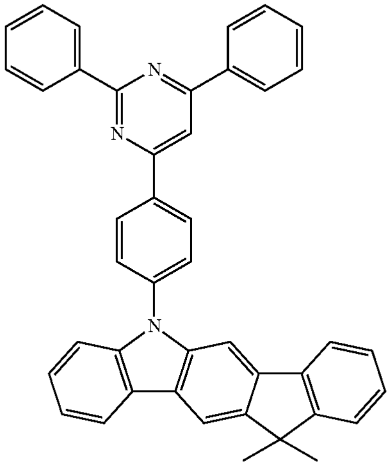
H44
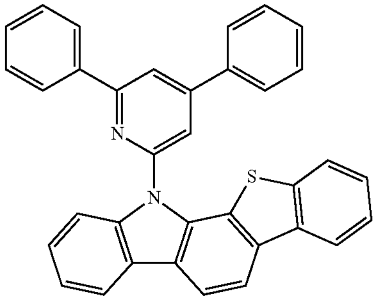
H45
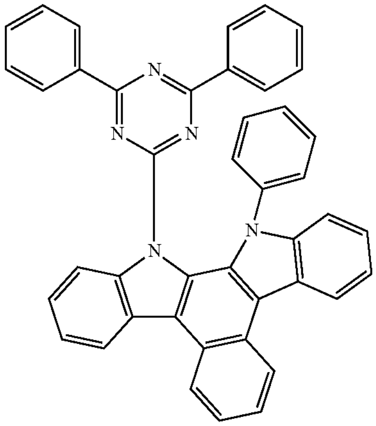
H46
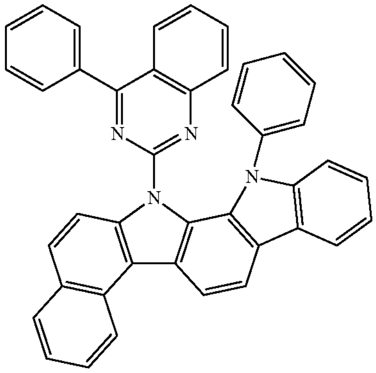

-continued
H47
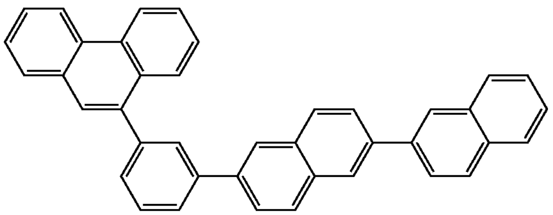
H48
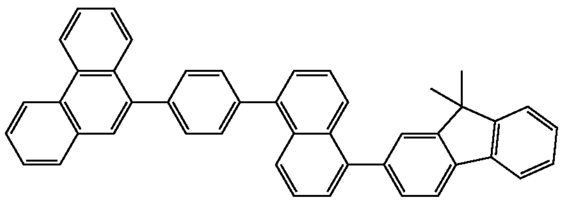
H49
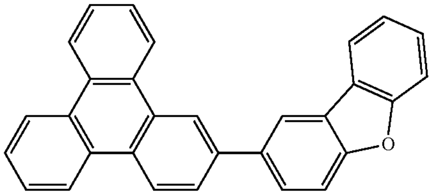
H50
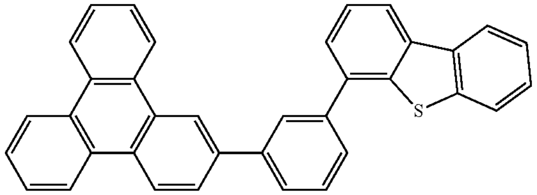
H51
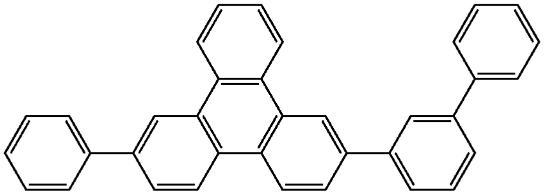
H52
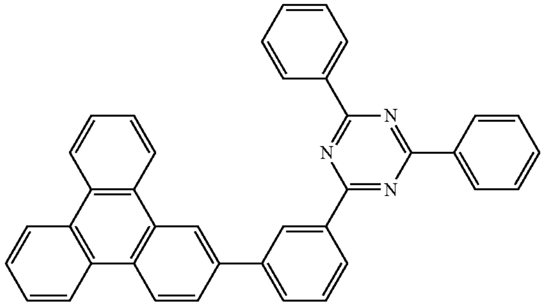
H53
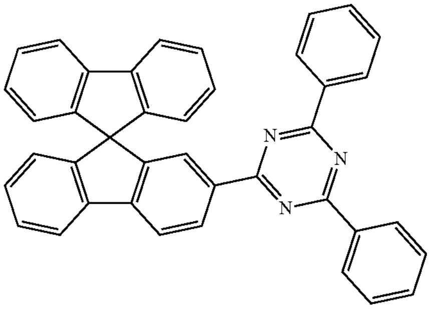
H54
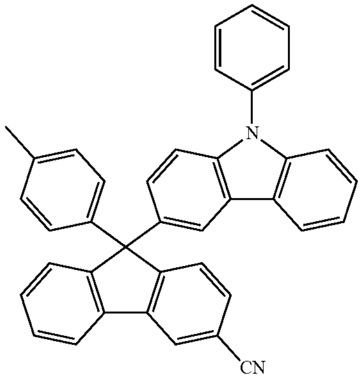
H55
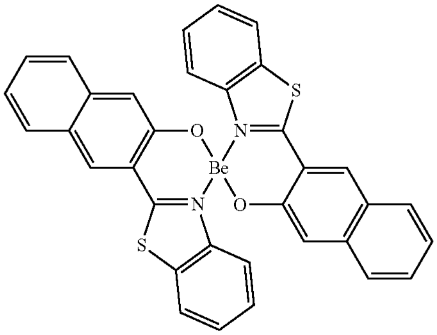
H56
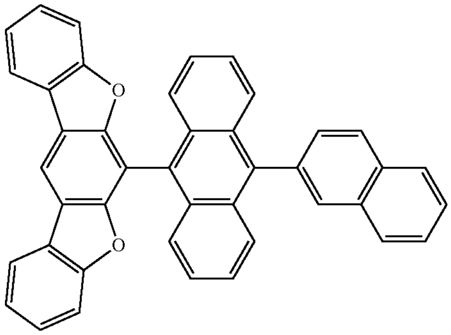

-continued
H57
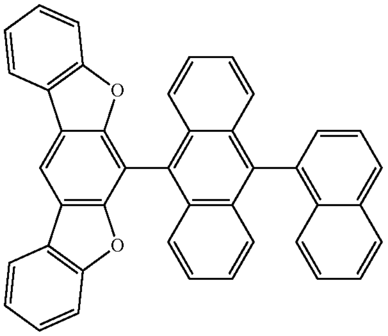
H58
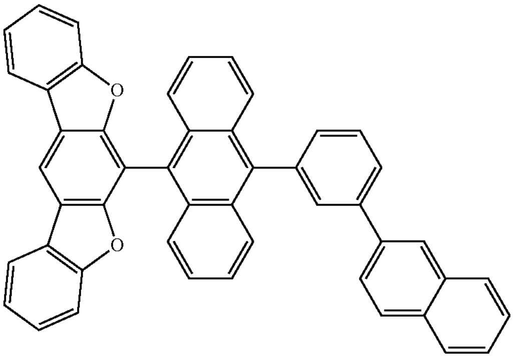
H59
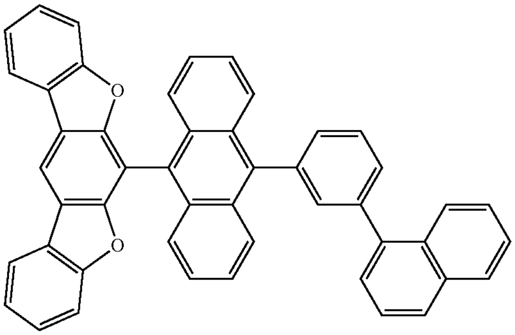
H60
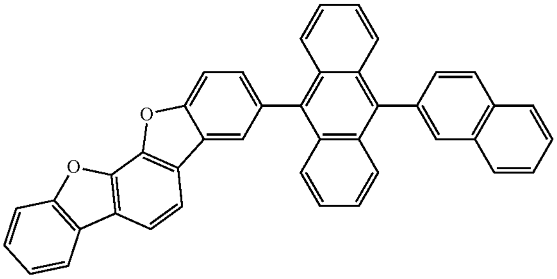
H61
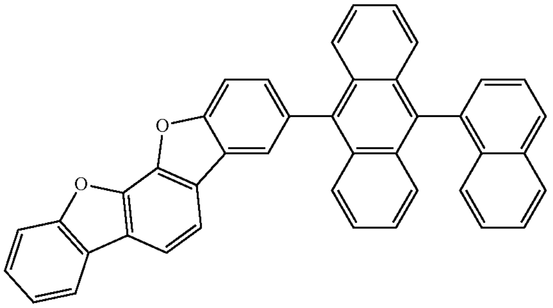
H62
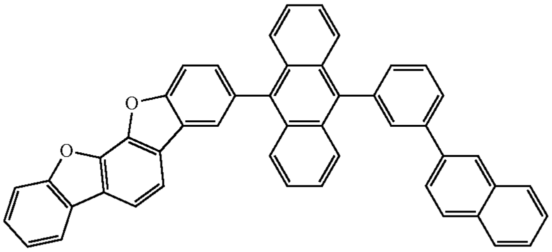
H63
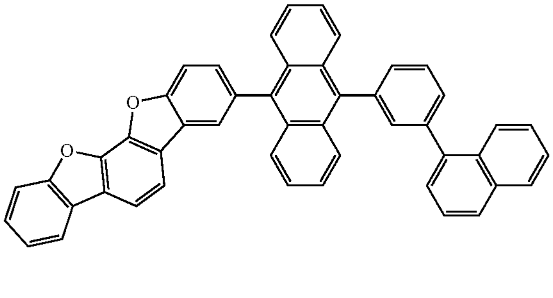
H64
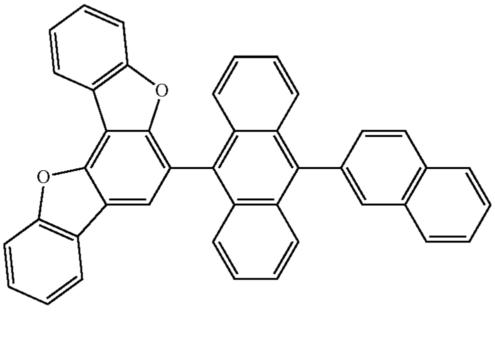

-continued
H65
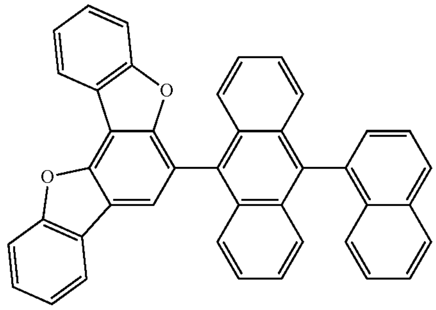
H66
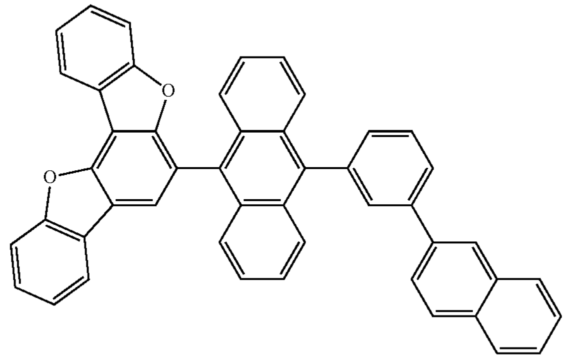
H67
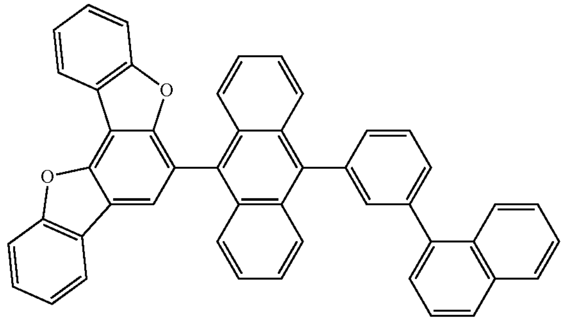
H68
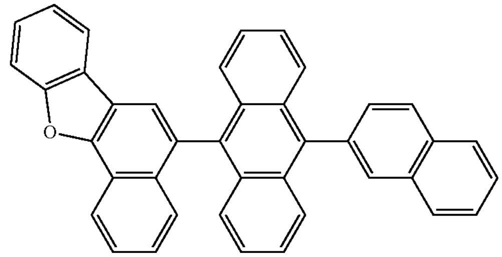
H69
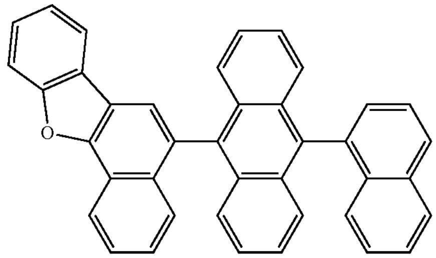
H70
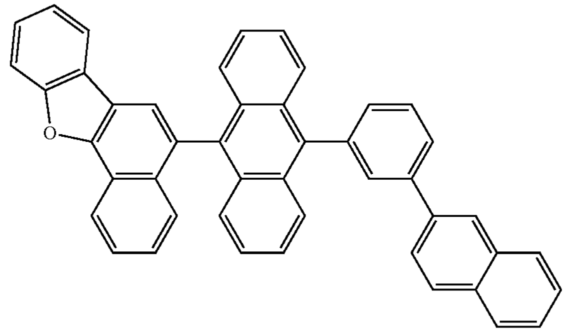
H71
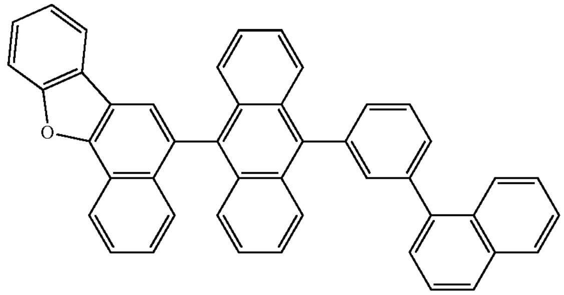
H72
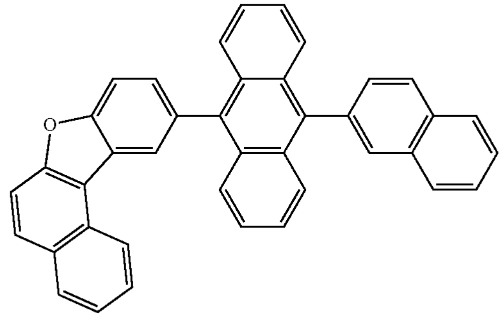

-continued
H73
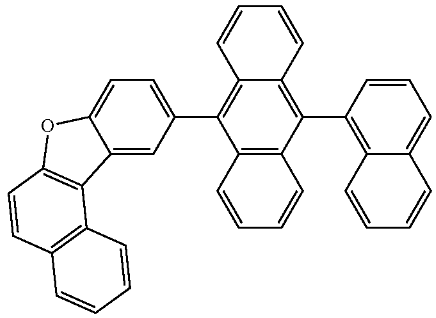
H74
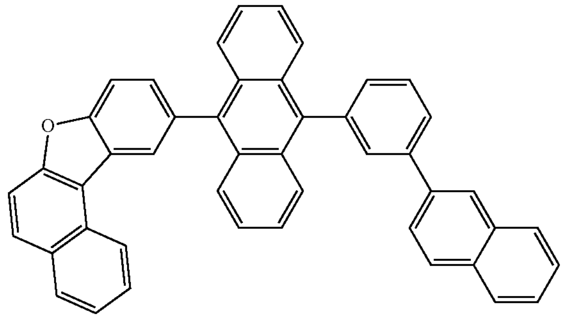
H75
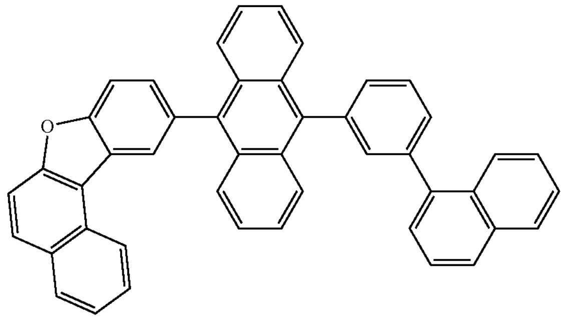
H76
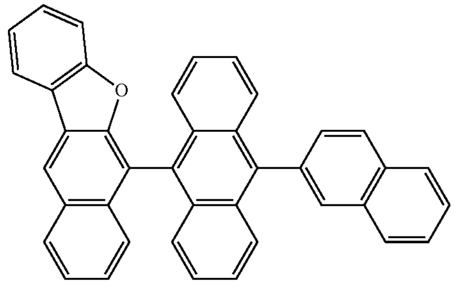
H77
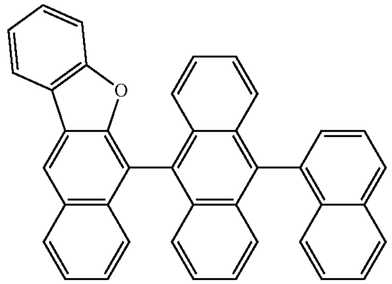
H78
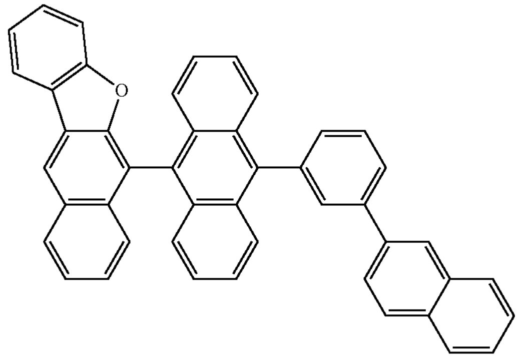
H79
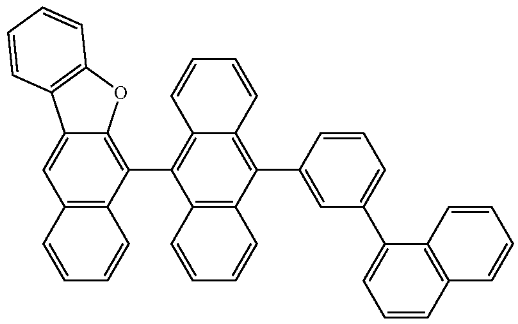
H80
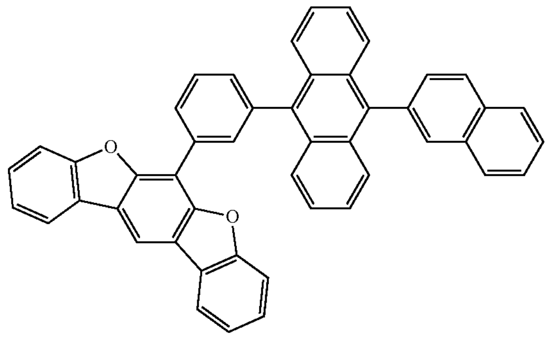

-continued
H81
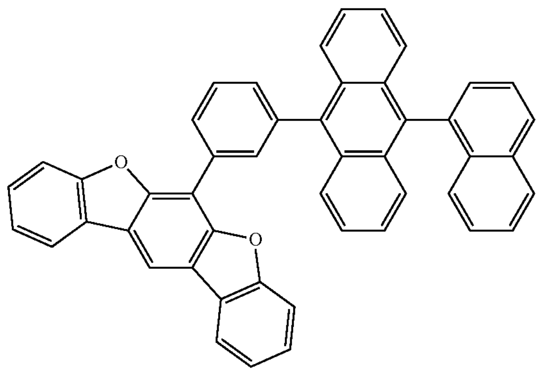
H82
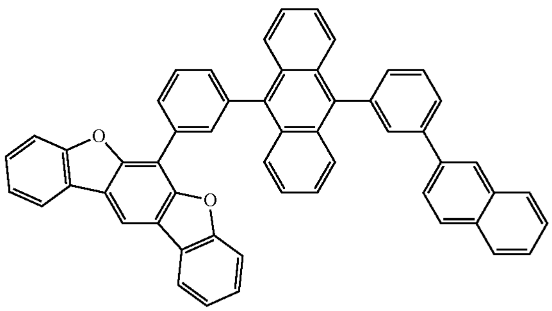
H83
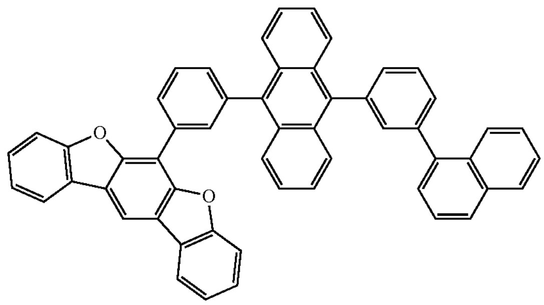
H84
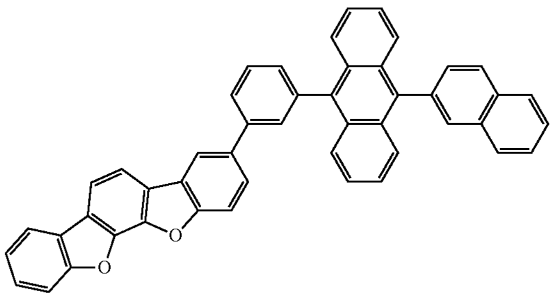
H85
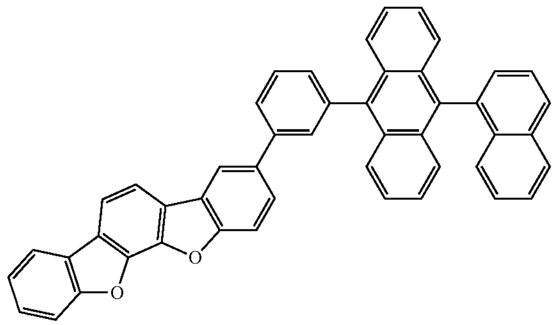
H86
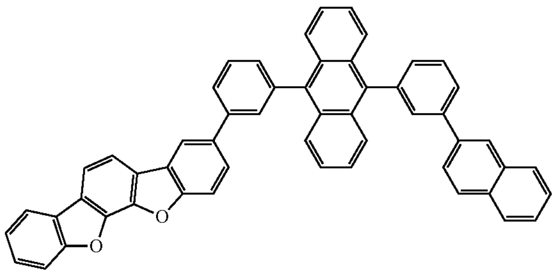
H87
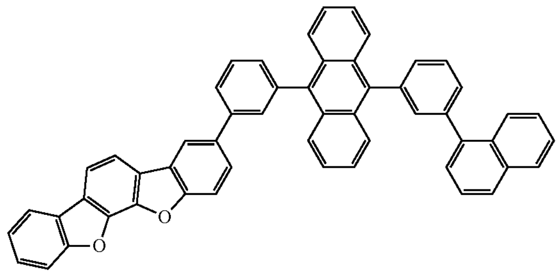
H88
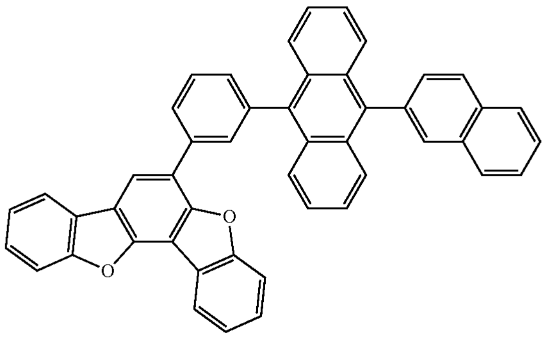

-continued
H89
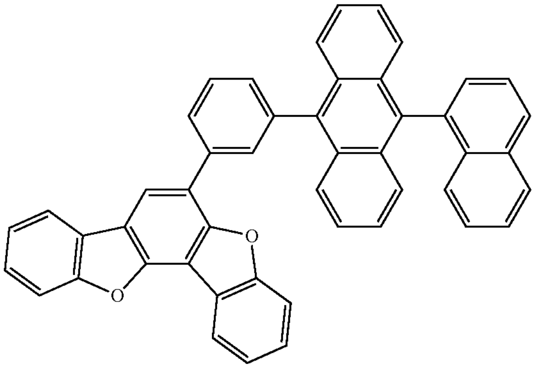
H90
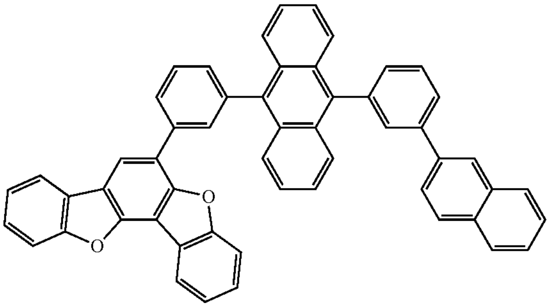
H91
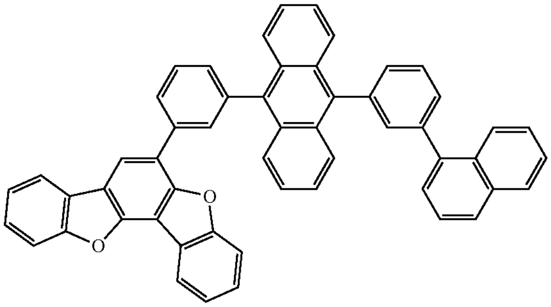
H92
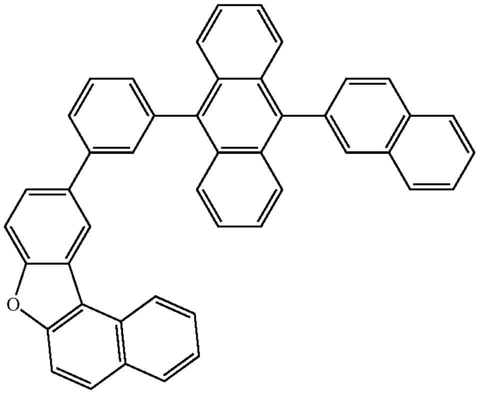
H93
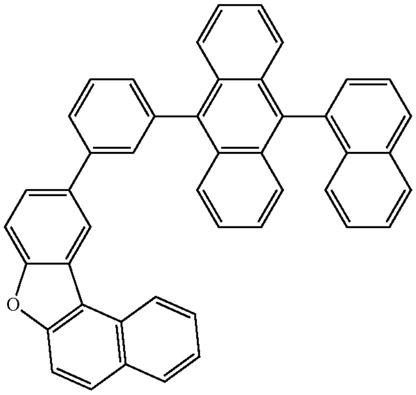
H94
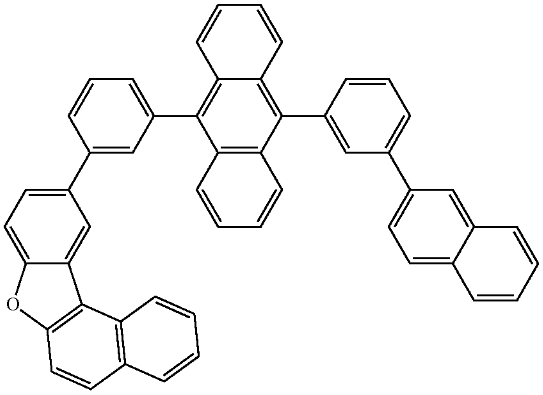
H95
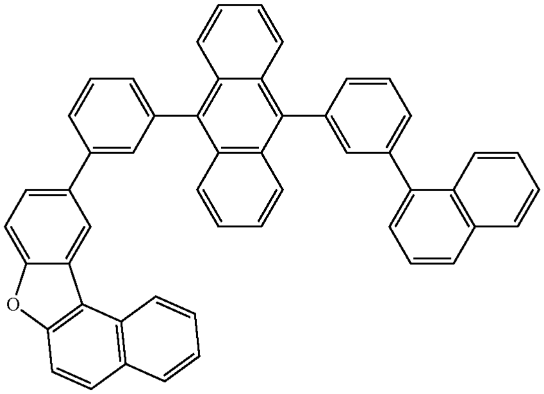
H96
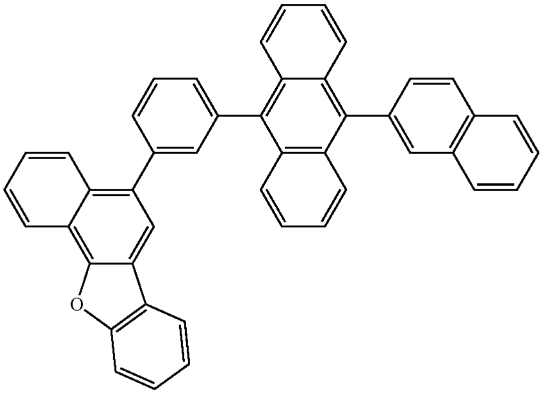

-continued
H97
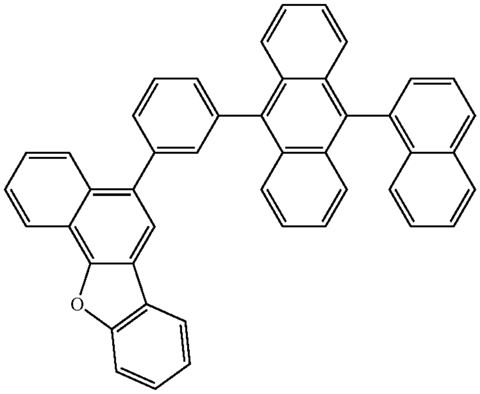
H98
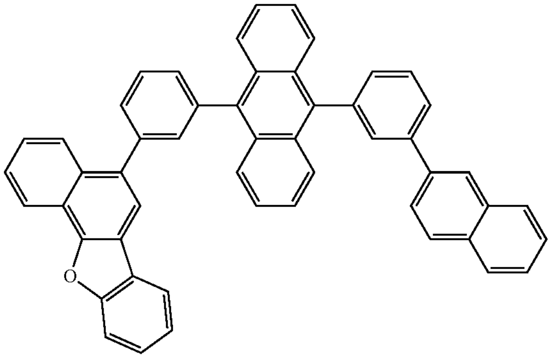
H99
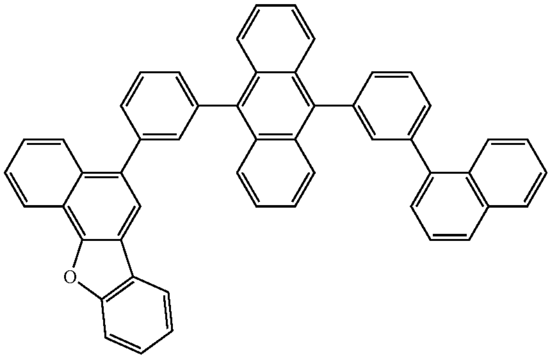
H100
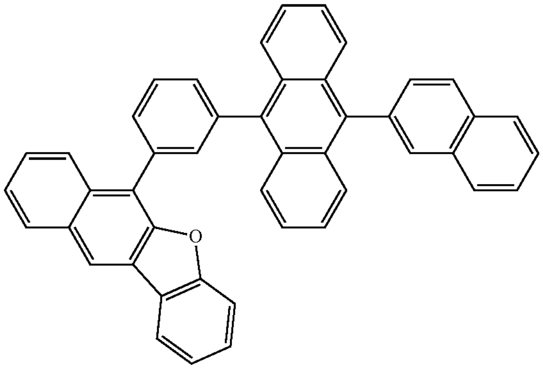
H101
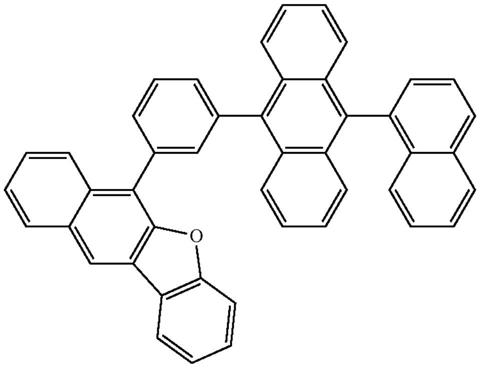
H102
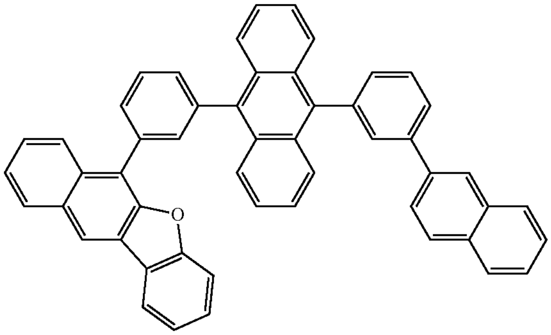

-continued
H103
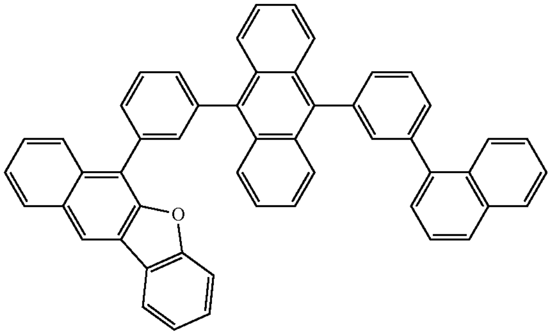
H104
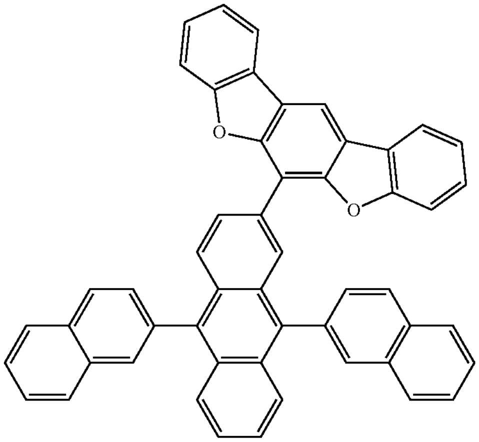
H105
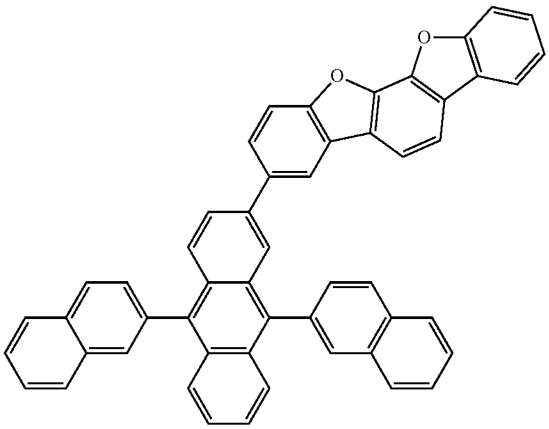
H106
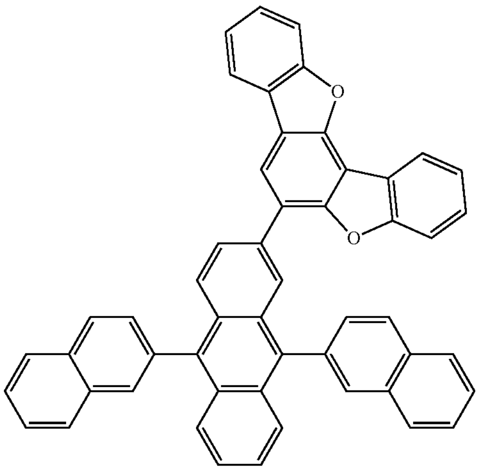
H107
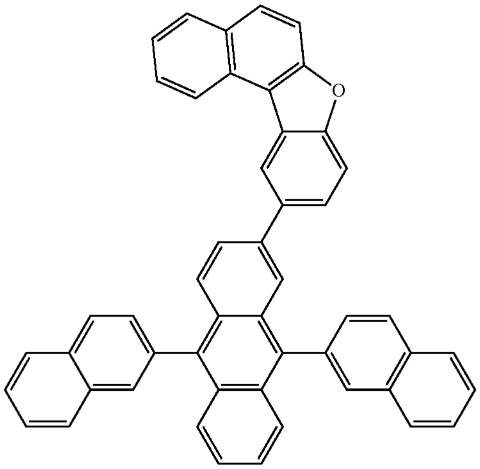
H108
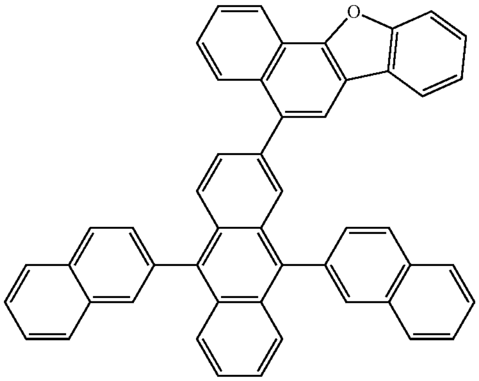

-continued
H109
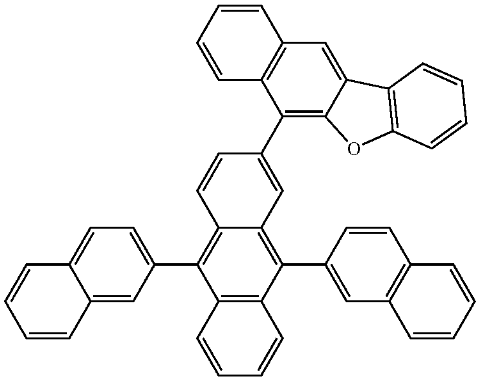
H110
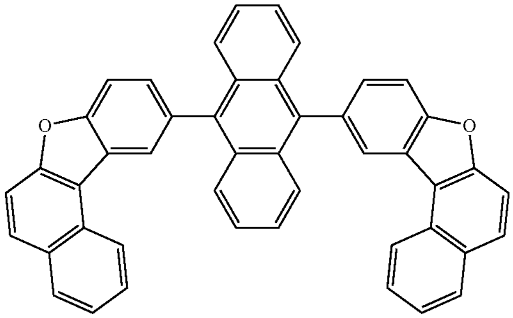
H111
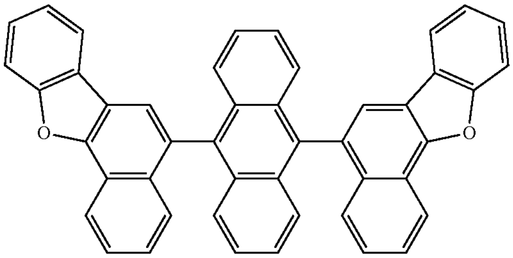
H112
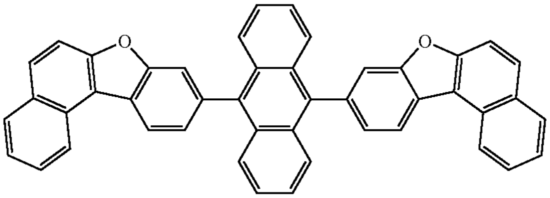
H113
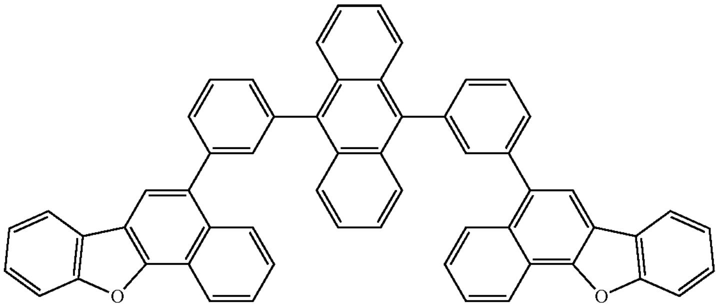
H114
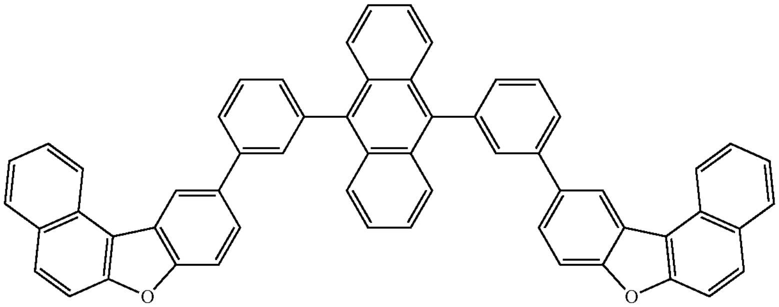

-continued
H115
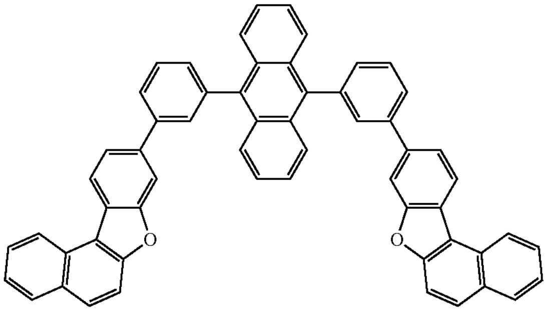
H116
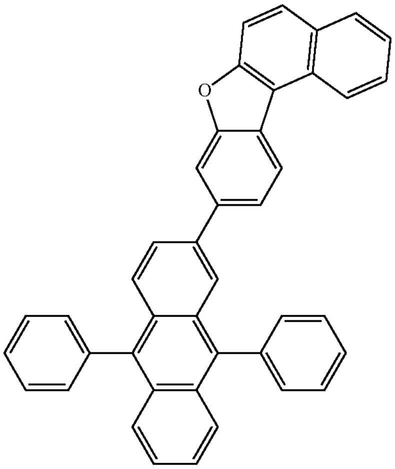
H117
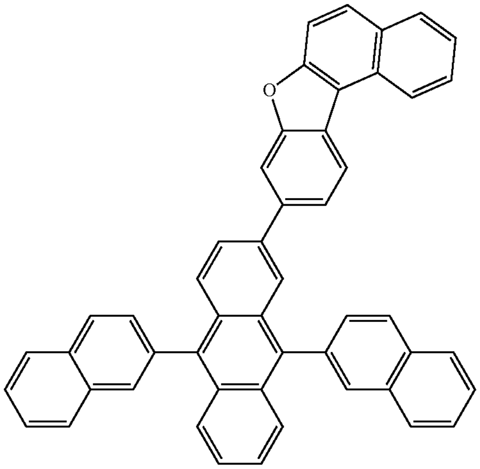
H118
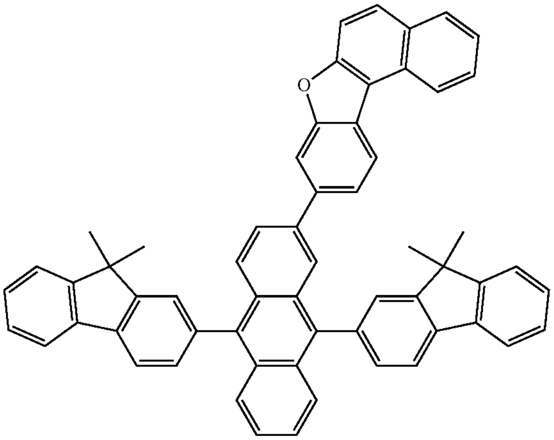
H119
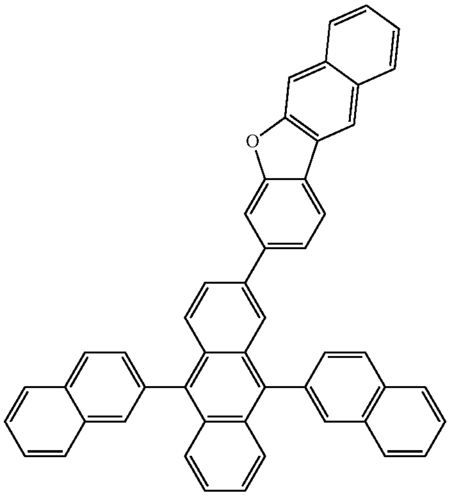
H120
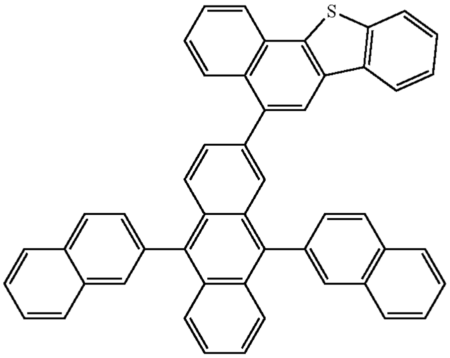

-continued
H121
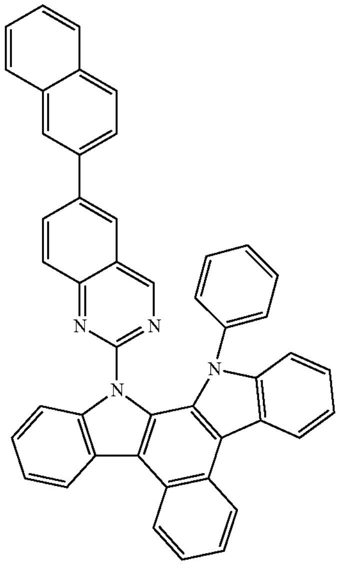
H122
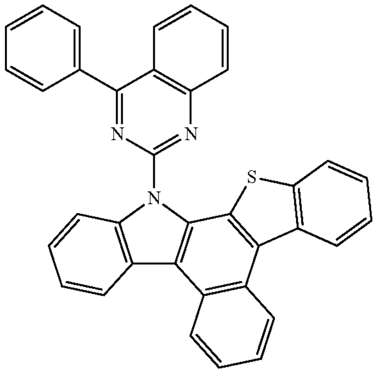
H123
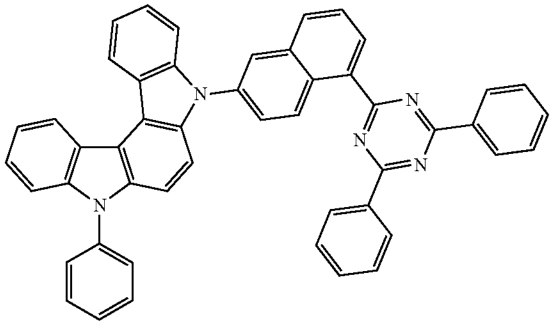
H124
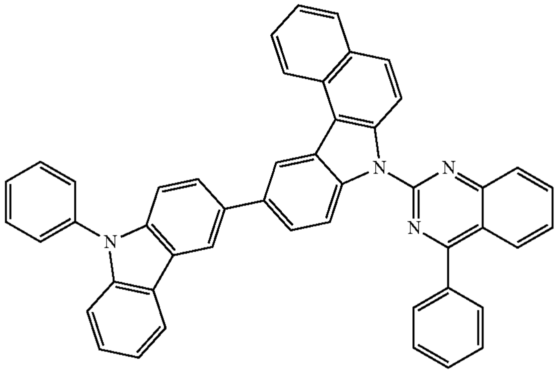
H125
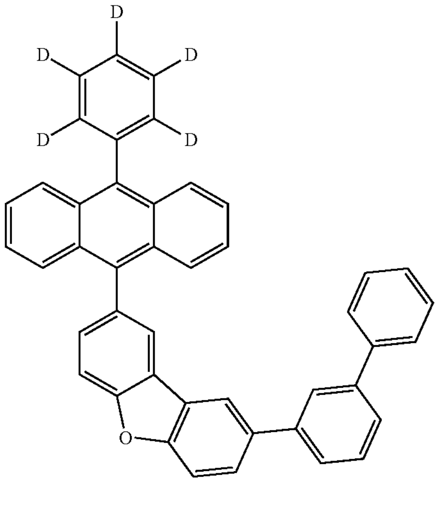
H126
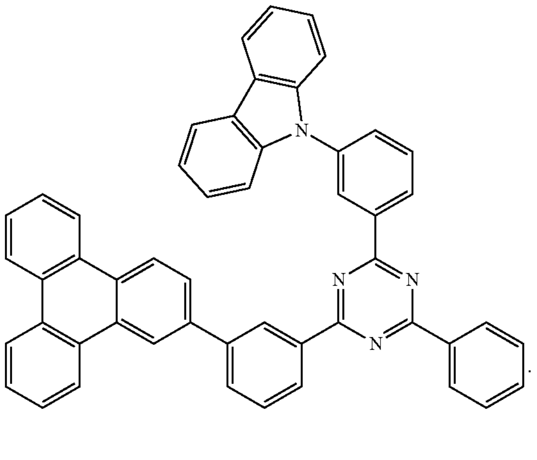

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

[Formula 401]

$M(L_{401})_{xc1}(L402)_{xc2}$

[Formula 402]

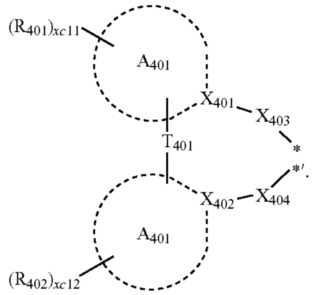

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, in case that xc1 is 2 or more, two or more of $L_{401}$ may be identical to or different from each other, $L_{402}$ may be an organic ligand, and xc2 may be 0, 1, 2, 3, or 4, wherein, in case that xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be as defined in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be as defined in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In an embodiment, in case that xc1 in Formula 401 is 2 or more, in two or more of $L_{401}$, two ring $A_{401}$(s) may optionally be linked to each other via $T_{402}$, which is a linking group, and two ring $A_{402}$(s) may optionally be linked to each other via $T_{403}$, which is a linking group (see Compounds PD1 to PD4 and PD7). $T_{402}$ and $T_{403}$ may each independently be as defined in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, a—CN group, a phosphorus group (for example, a phosphine group, a phosphite group, etc.), or any combination thereof.

For example, the emission layer in a light-emitting unit emitting green light may include the phosphorescent dopant.

The phosphorescent dopant may include, for example, one of Compounds PD1 to PD39, or any combination thereof:

PD1

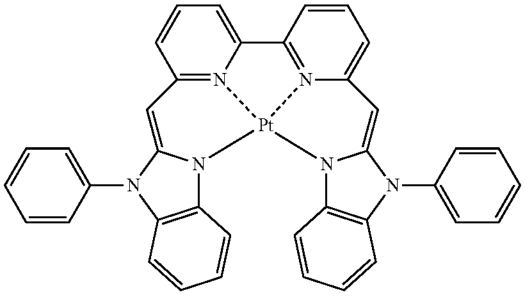

PD2

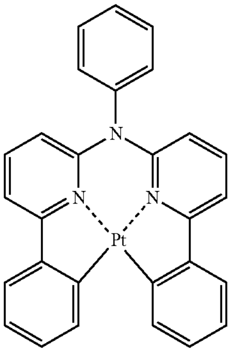

PD3

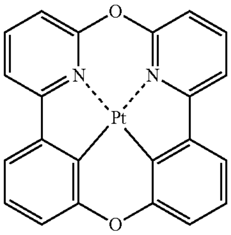

-continued
PD4
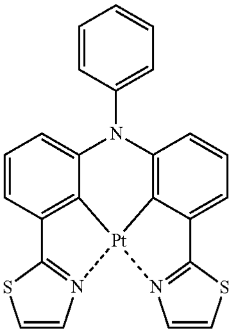
PD5
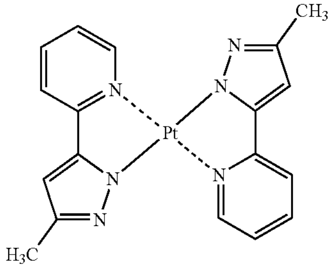
PD6
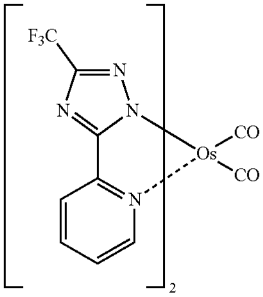
PD7
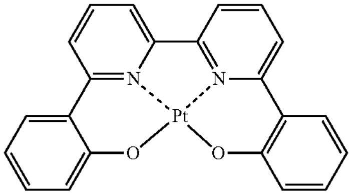
PD8
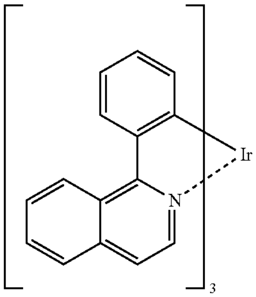
-continued
PD9
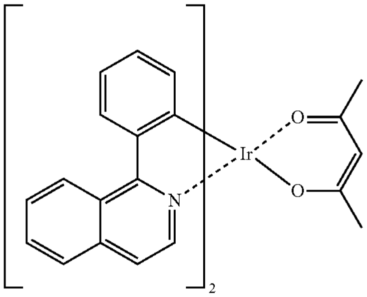
PD10
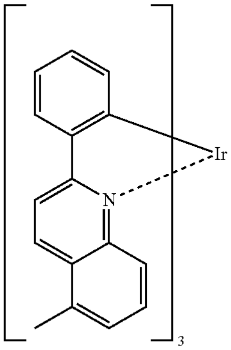
PD11
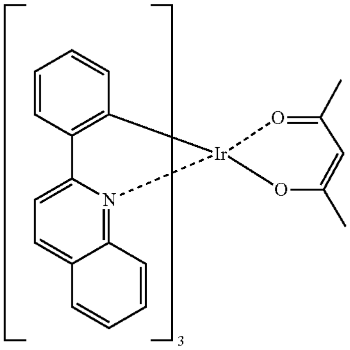
PD12
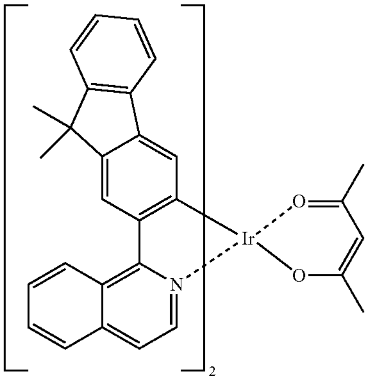

PD13
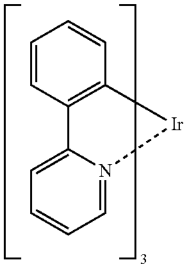
PD14
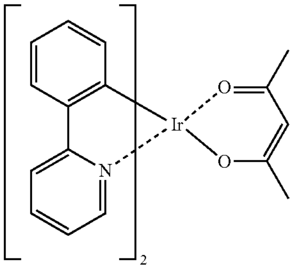
PD15
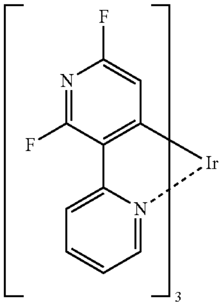
PD16
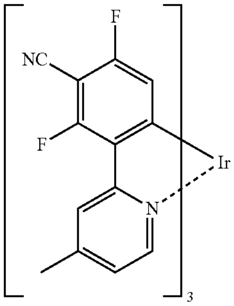
PD17
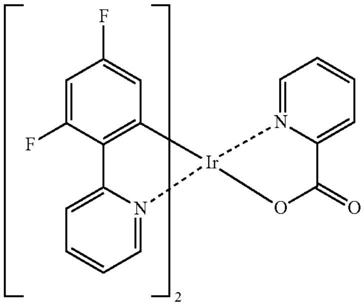
PD18
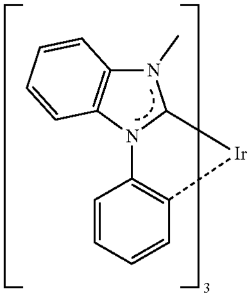
PD19
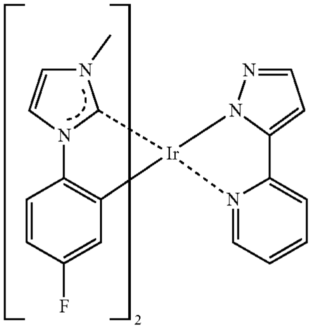
PD20
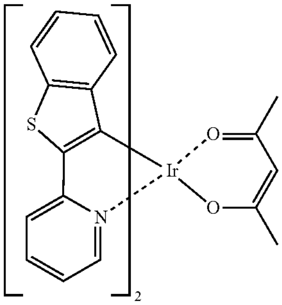
PD21
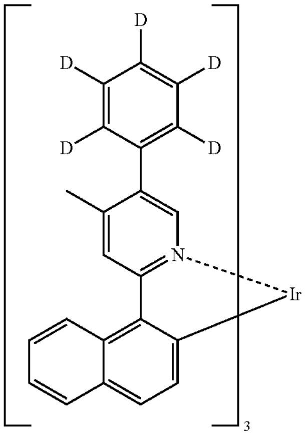

-continued
PD22
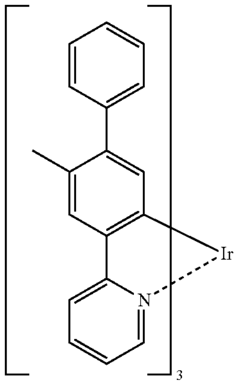
PD23
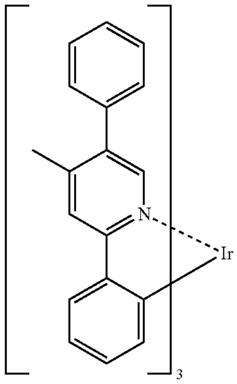
PD24
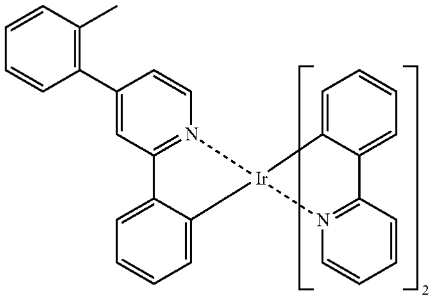
PD25
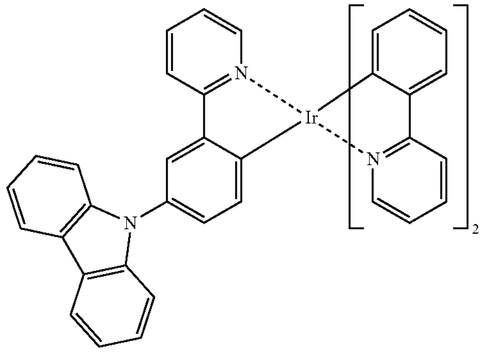
-continued
PD26
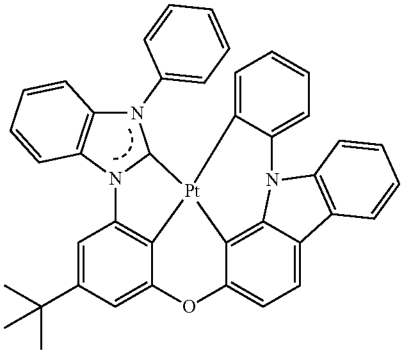
PD27
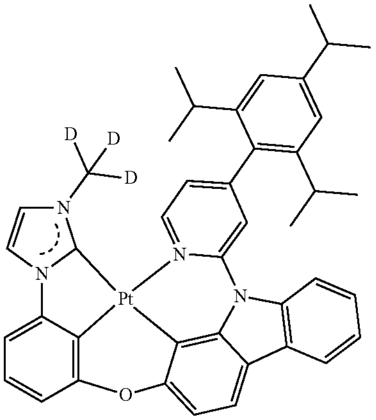
PD28
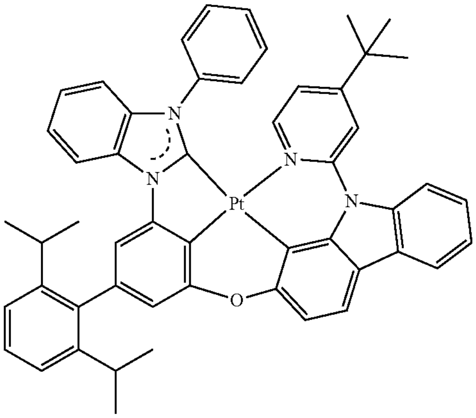
PD29
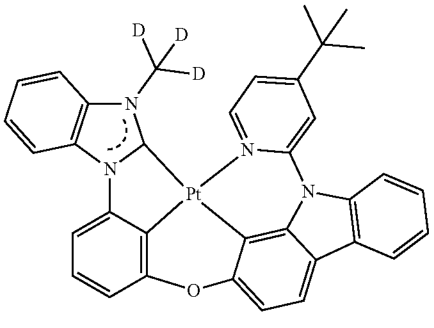

-continued
PD30
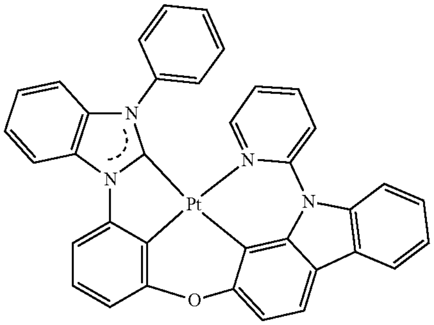
PD31
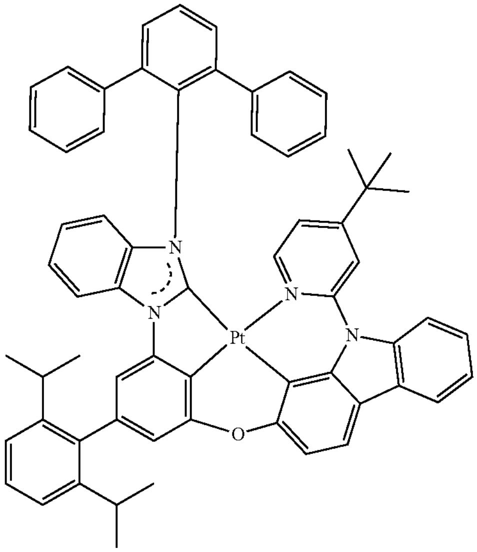
PD32
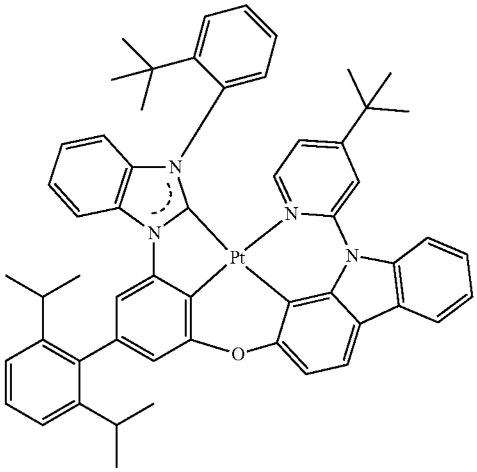
-continued
PD33
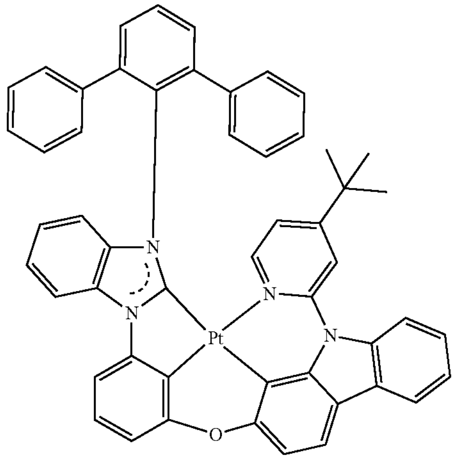
PD34
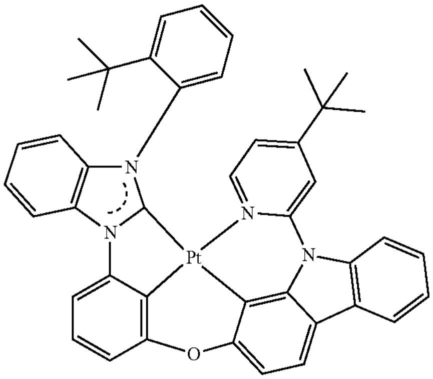
PD35
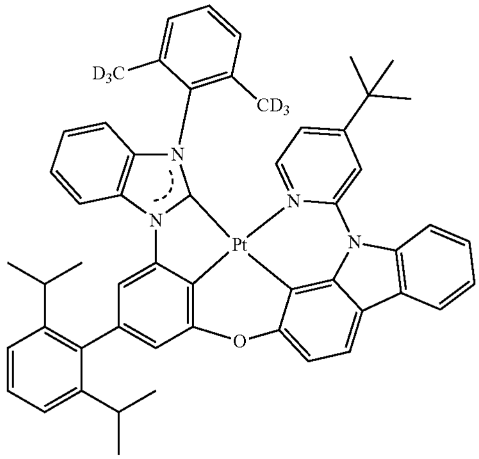

-continued

PD36

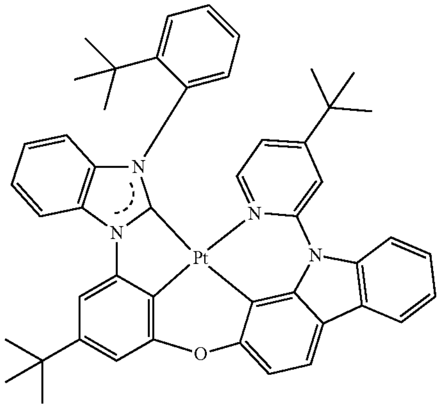

PD37

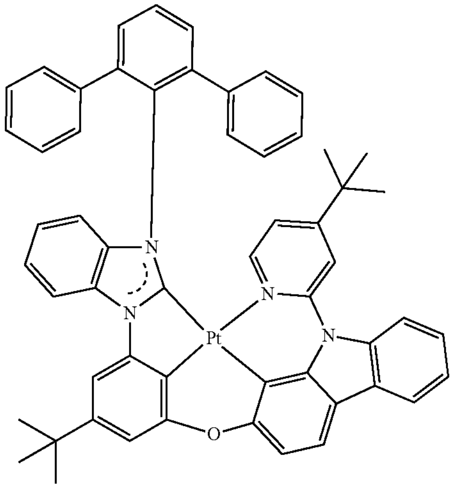

PD38

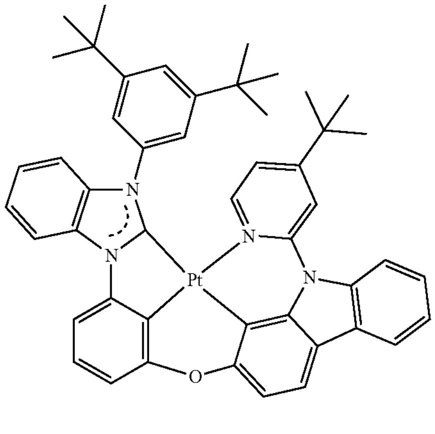

-continued

PD39

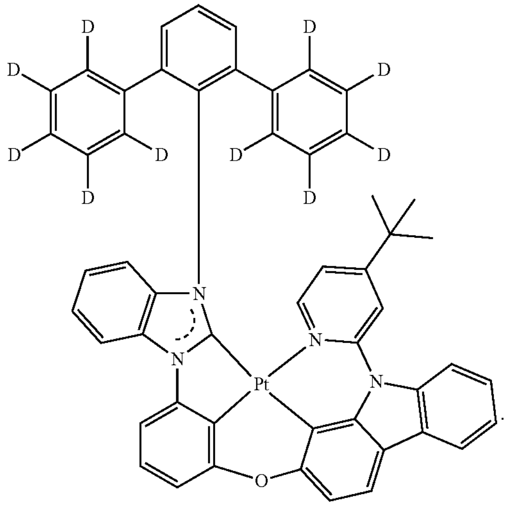

[Fluorescent Dopant]

The fluorescent dopant may include an amine group-containing compound, a styryl group-containing compound, or any combination thereof.

For example, the fluorescent dopant may include a compound represented by Formula 501:

[Formula 501]

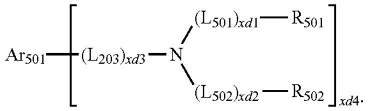

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, a pyrene group, etc.) in which three or more monocyclic groups are condensed together.

In an embodiment, in Formula 501, xd4 may be 2.

For example, the fluorescent dopant may include: one of Compounds FD1 to FD36; DPVBi; DPAVBi; or any combination thereof:

FD1
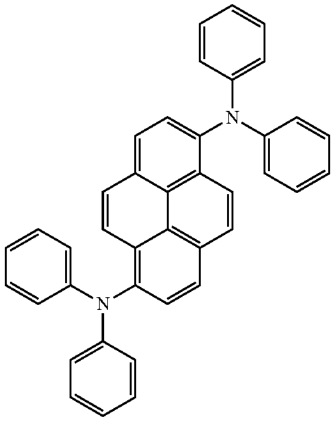
FD2
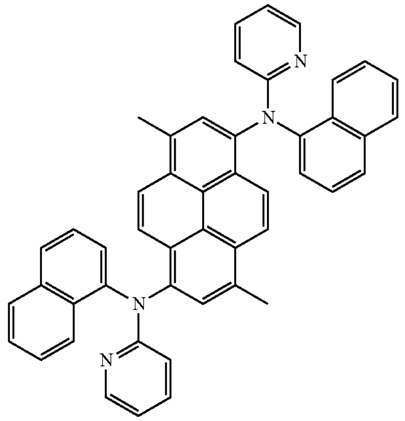
FD3
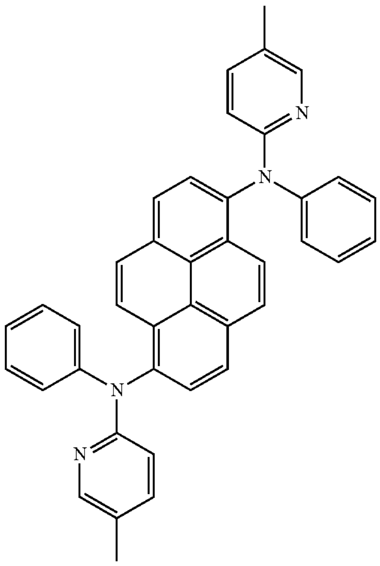
FD4
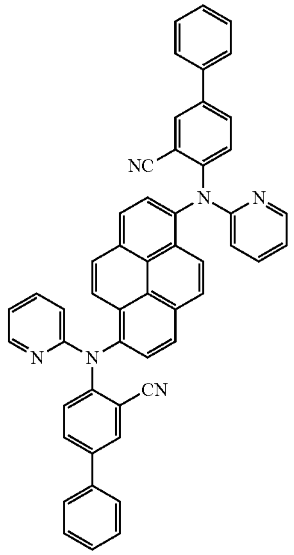
FD5
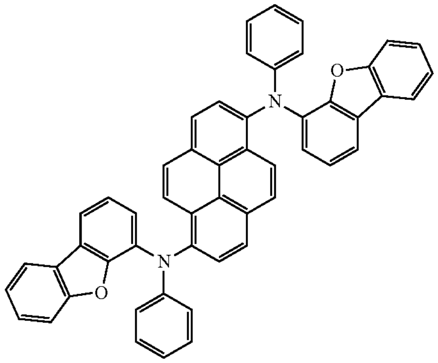
FD6
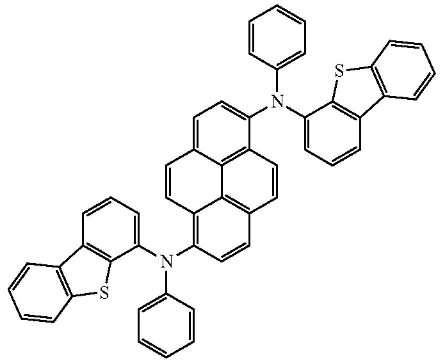

-continued
FD7
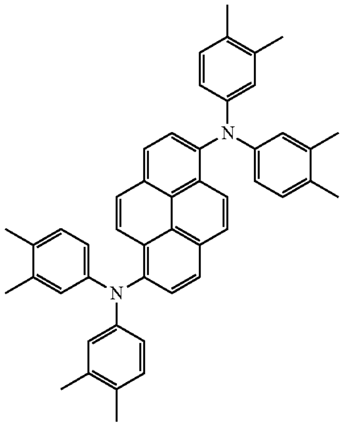
FD8
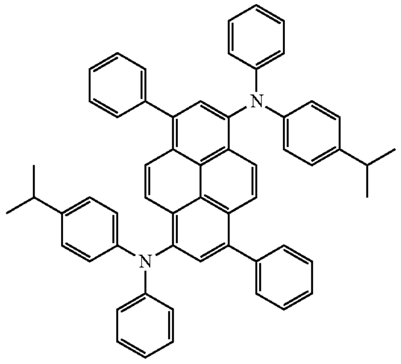
FD9
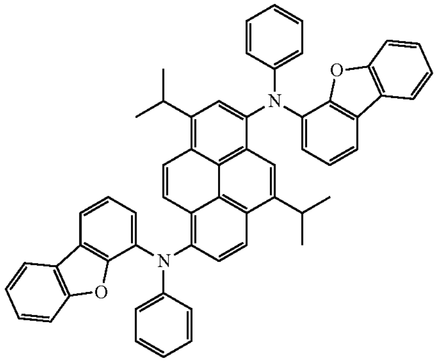
FD10
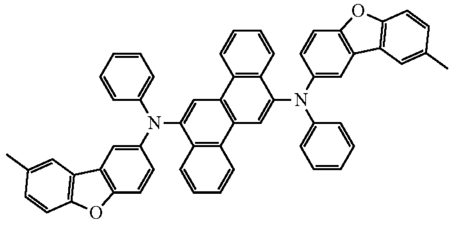
FD11
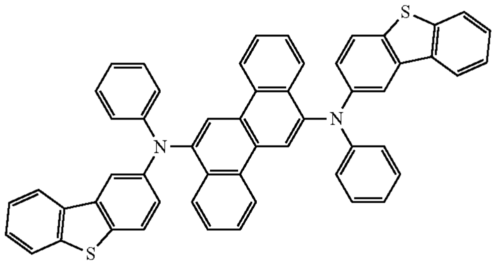
FD12
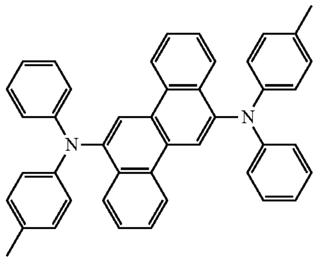
FD13
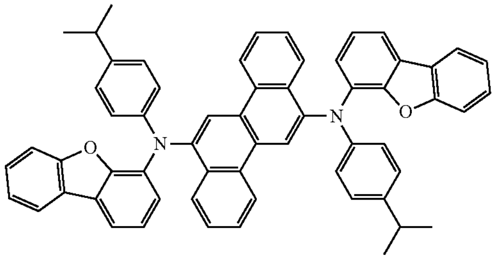
FD14
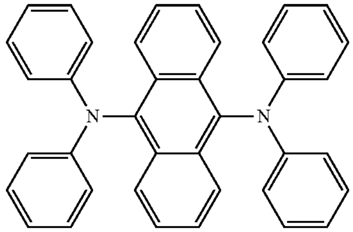
FD15
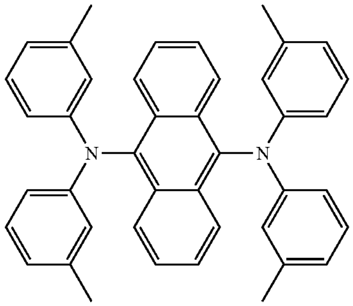
FD16
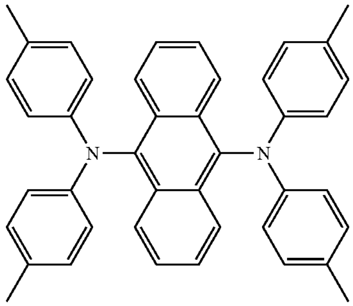

-continued
FD17
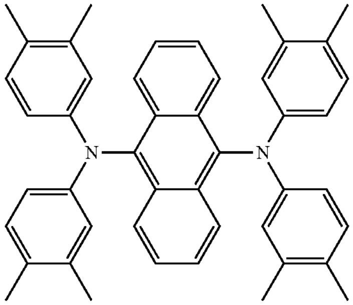
FD18
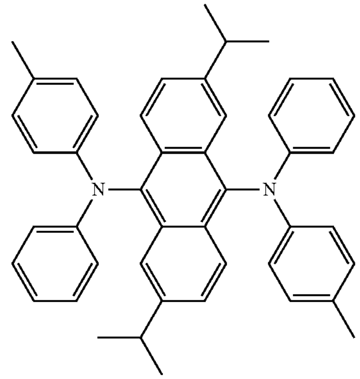
FD19
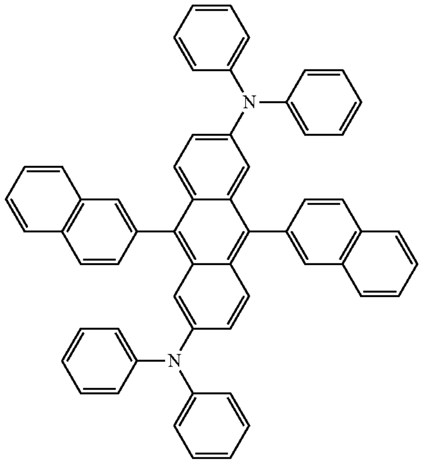
FD20
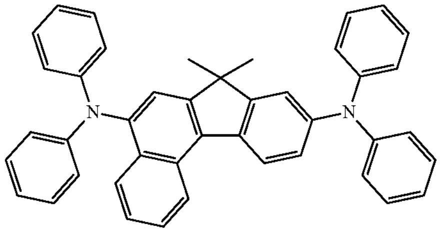
FD21
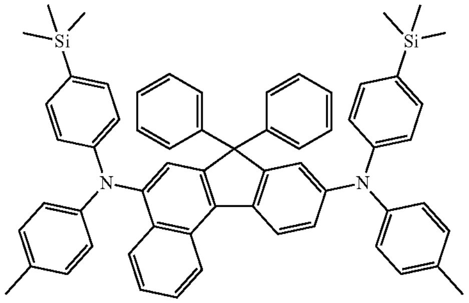
FD28
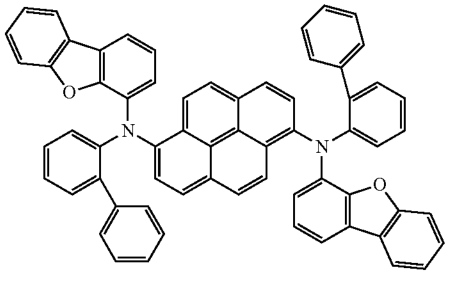
FD29
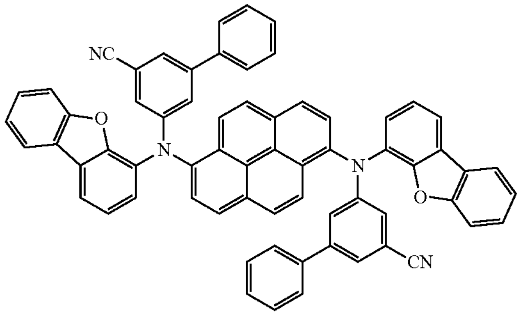
FD30
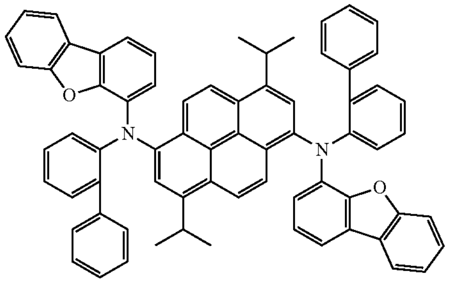

-continued
FD31
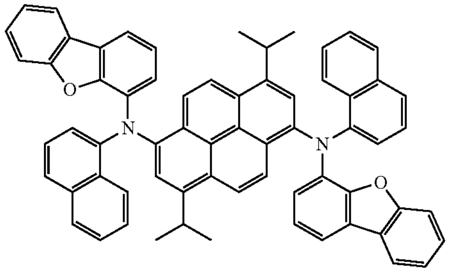
FD32
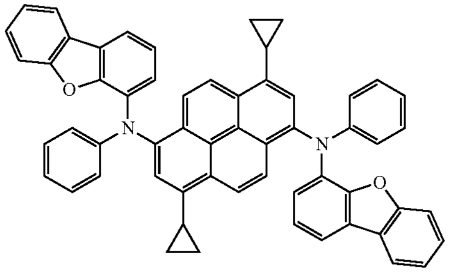
FD33
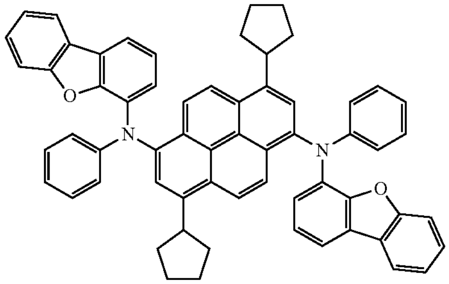
FD34
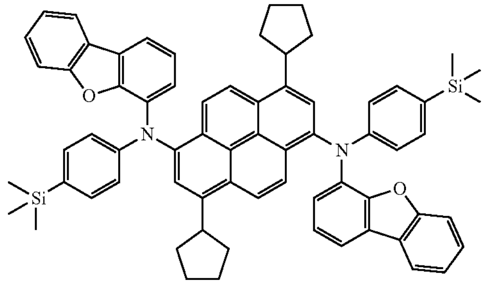
FD35
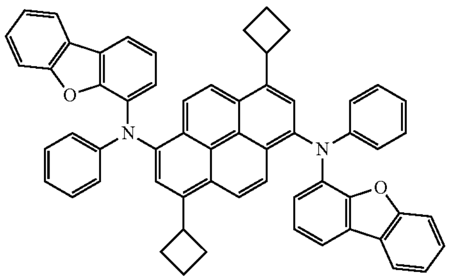
FD36
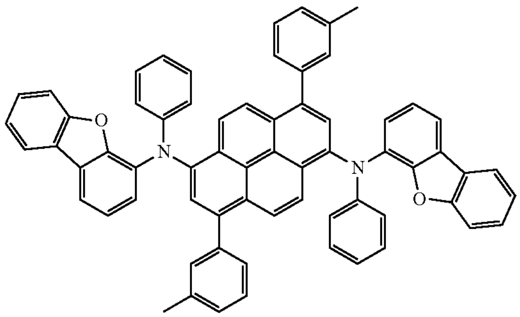
DPVBi
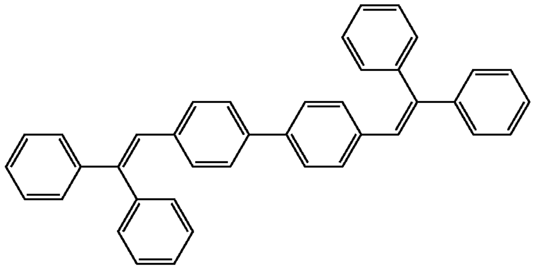
DPAVBi
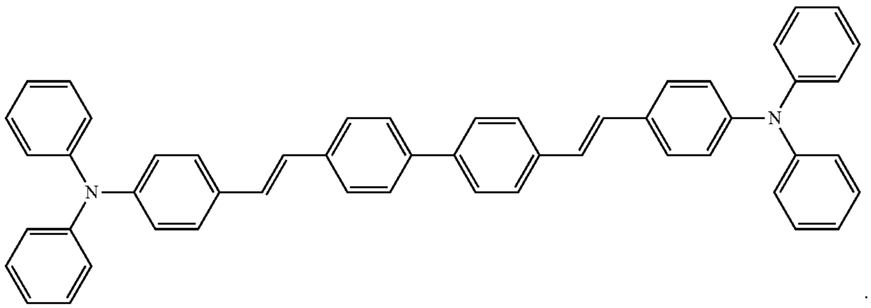
.

[Delayed Fluorescence Material]

The emission layer may include a delayed fluorescence material.

In the specification, the delayed fluorescence material may be selected from compounds capable of emitting delayed fluorescence, based on a delayed fluorescence emission mechanism.

The delayed fluorescence material included in the emission layer may serve as a host or as a dopant, depending on the types of other materials included in the emission layer.

In an embodiment, a difference between a triplet energy level (eV) of the delayed fluorescence material and a singlet energy level (eV) of the delayed fluorescence material may be greater than or equal to 0 eV and less than or equal to 0.5 eV. In case that the difference between the triplet energy level (eV) of the delayed fluorescence material and the singlet energy level (eV) of the delayed fluorescence material is satisfied within the range above, up-conversion from the triplet state to the singlet state of the delayed fluorescence materials may effectively occur, and thus, the light-emitting device 10 may have improved luminescence efficiency.

For example, the delayed fluorescence material may include: i) a material including at least one electron donor (for example, a IT electron-rich $C_3$-$C_{60}$ cyclic group and the like, such as a carbazole group) and at least one electron acceptor (for example, a sulfoxide group, a cyano group, a TT electron-deficient nitrogen-containing $C_1$-$C_{60}$ cyclic group, and the like); ii) a material including a $C_8$-$C_{60}$ polycyclic group including at least two cyclic groups condensed to each other while sharing boron (B); or the like.

In an embodiment, the delayed fluorescence material may be represented by Formula 200:

[Formula 200]

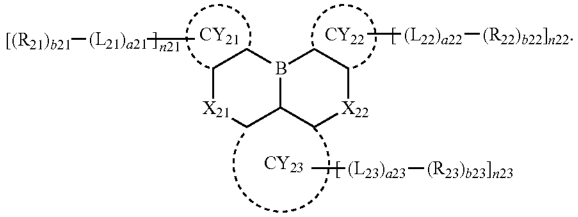

In Formula 200, $X_{21}$ may be $C(R_{24})(R_{25})$, $N(R_{24})$, O, or S, $X_{22}$ may be $C(R_{26})(R_{27})$, $N(R_{26})$, O, or S, $CY_{21}$ to $CY_{23}$ and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 may each independently be an integer from 0 to 5, $R_{21}$ to $R_{27}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b21 to b23 may each independently be an integer from 1 to 10, n21 to n23 may each independently be an integer from 0 to 3, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

For example, the emission layer in a light-emitting unit emitting blue light may include the delayed fluorescence dopant.

Examples of the delayed fluorescence material may include at least one of Compounds DF1 to DF10:

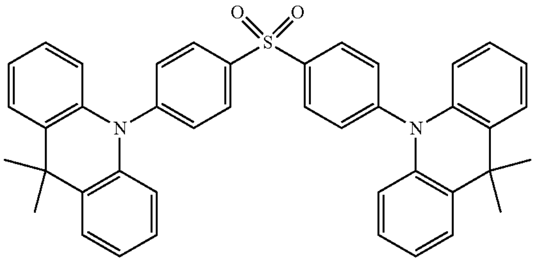

DF1(DMAC-DPS)

-continued
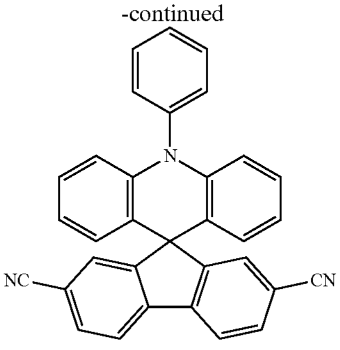
DF2(ACRFLCN)
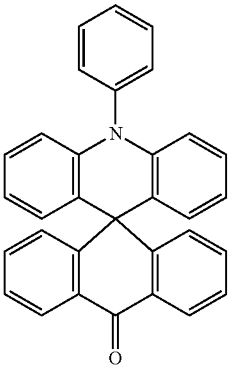
DF3(ACRSA)
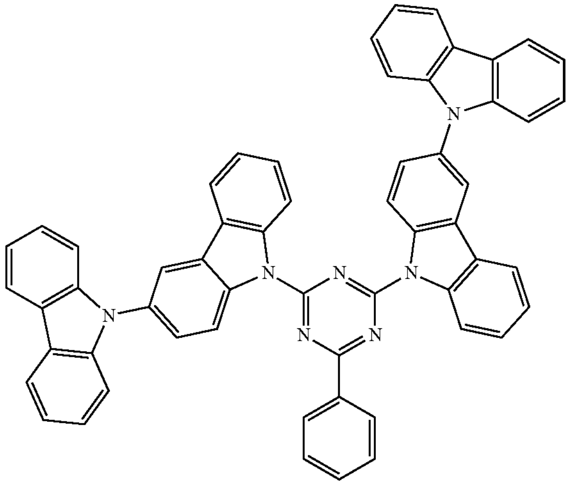
DF4(CC2TA)
-continued
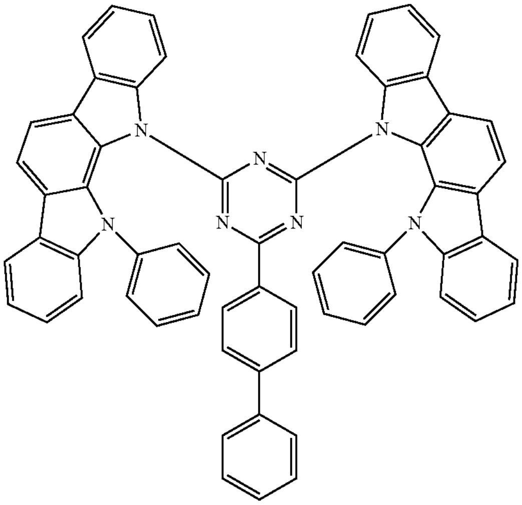
DF5(PIC-TRZ)
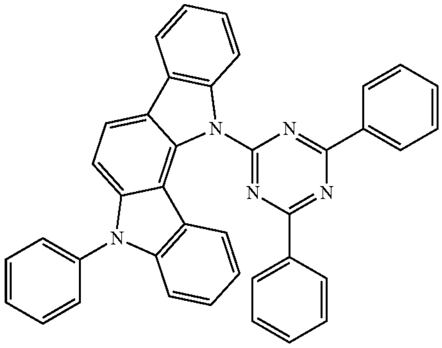
DF6(PIC-TRZ2)
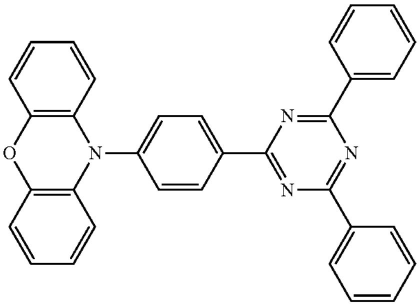
DF7(PXZ-TRZ)
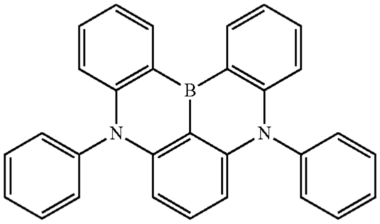
DF8(DABNA-1)

-continued

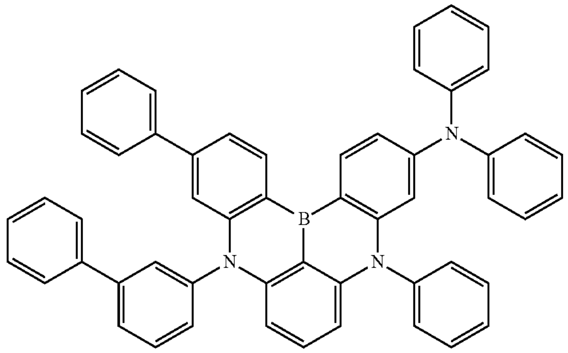

DF9(DABNA-2)

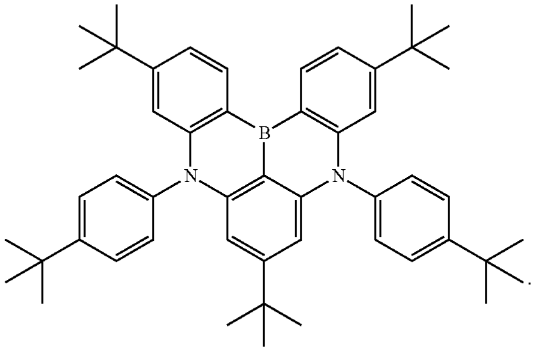

DF10

[Quantum Dot]

The emission layer may include a quantum dot.

The term "quantum dot" as used herein may refer to a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process may be a method including mixing a precursor material with an organic solvent and growing quantum dot particle crystals. In case that the crystal grows, the organic solvent naturally acts as a dispersant coordinated on the surface of the quantum dot crystal and controls the growth of the crystal so that the growth of quantum dot particles can be controlled through a process which costs less, and may be more readily performed than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of a Group II-VI semiconductor compound may include: a binary compound, such as CdS, CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of a Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAS, AlPSb, InGaP, InNP, InAlP, InNAs, InNSb, InPAS, InPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. In an embodiment, the Group III-V semiconductor compound may further include a Group II element. Examples of a Group III-V semiconductor compound further including a Group II element may include InZnP, InGaZnP, InAlZnP, and the like.

Examples of a Group III-VI semiconductor compound may include: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of a Group I-III-VI semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of a Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of a Group IV element or compound may include: a single element material such as Si, Ge, and the like; a binary compound, such as SiC, SiGe, and the like; or any combination thereof.

Each element included in a multi-element compound, such as a binary compound, a ternary compound, or a quaternary compound, may be present at a uniform concentration or non-uniform concentration in a particle.

In an embodiment, the quantum dot may have a single structure in which the concentration of each element in the quantum dot is uniform, or may have a core-shell structure. For example, a material included in the core and a material included in the shell may be different from each other.

The shell of the quantum dot may serve as a protective layer which prevents chemical denaturation of the core to maintain semiconductor characteristics, and/or may serve as a charging layer which imparts electrophoretic characteristics to the quantum dot. The shell may be single-layered or multi-layered. An interface between the core and the shell may have a concentration gradient in which the concentration of a material in the shell decreases toward the core.

Examples of a shell of a quantum dot may include a metal oxide, a metalloid oxide, a non-metal oxide, a semiconductor compound, or a combination thereof. Examples of a metal oxide, a metalloid oxide, or a non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof.

Examples of a semiconductor compound may include: as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of the emission wavelength spectrum of less than or equal to about 45 nm, less than or equal to about 40 nm, or for example, less than or equal to about 30 nm. In case that the FWHM of the quantum dot is within these ranges, the quantum dot may have improved color purity or improved color reproducibility. Since light emitted through the quantum dot is emitted in all directions, the wide viewing angle may be improved.

The quantum dot may be in the form of spherical, pyramidal, multi-arm, or cubic nanoparticles, nanotubes, nanowires, nanofibers, or nanoplate particles.

Since the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. In an embodiment, the size of the quantum dot may be selected to emit red light, green light, and/or blue light. The size of the quantum dot may be configured to emit white light by combination of light of various colors.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from the emission layer in its respective stated order, but the structure of the electron transport region is not limited thereto.

In an embodiment, the electron transport region (for example, the buffer layer, the hole blocking layer, the electron control layer, or the electron transport layer in the electron transport region) may include a metal-free compound including at least one TT electron-deficient nitrogen-containing $C_1$-$C_{60}$ cyclic group.

For example, the electron transport region may include a compound represented by Formula 601:

$$[Ar_{601}]_{xe11}-[(L_{601})_{xe1}-R_{601}]_{xe21}$$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be as defined in connection with $Q_1$, xe21 may be 1, 2, 3, 4, or 5, and at least one of $Ar_{601}$, $L_{601}$, and $R_{601}$ may each independently be a IT electron-deficient nitrogen-containing $C_1$-$C_{60}$ cyclic group unsubstituted or substituted with at least one $R_{10a}$.

For example, in Formula 601, in case that xe11 is 2 or more, two or more of $Ar_{601}$ may be linked to each other via a single bond.

In an embodiment, in Formula 601, $Ar_{601}$ may be a substituted or unsubstituted anthracene group.

In one or more embodiments, the electron transport region may include a compound represented by Formula 601-1:

[Formula 601-1]

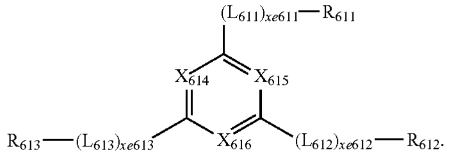

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be as defined in connection with $L_{601}$, xe611 to xe613 may each independently be as defined in connection with xe1, $R_{611}$ to $R_{613}$ may each independently be as defined in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

In an embodiment, the electron transport region may include: one of Compounds ET1 to ET45; 2,9-dimethyl-4,7-diphenyl-1,10-phenanthroline (BCP); 4,7-diphenyl-1,10-phenanthroline (Bphen); $Alq_3$; BAlq; TAZ; NTAZ; TPM-TAZ; T2T; or any combination thereof:

-continued
ET1
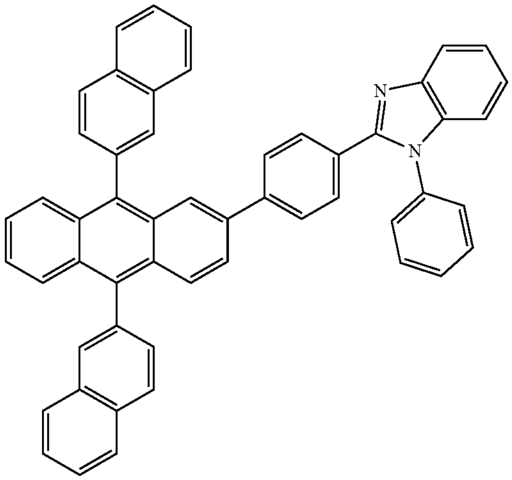
ET2
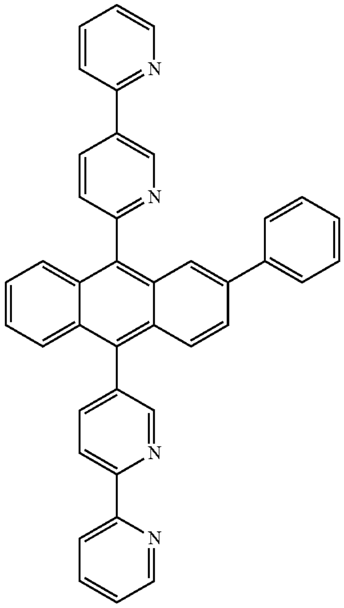
ET3
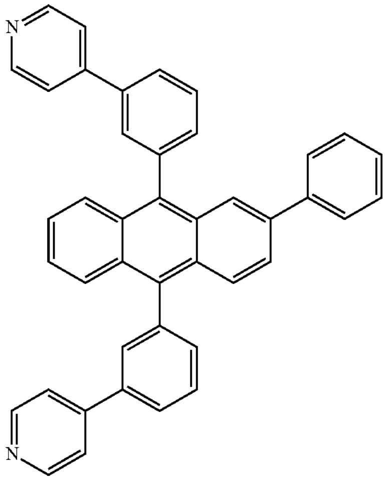
ET4
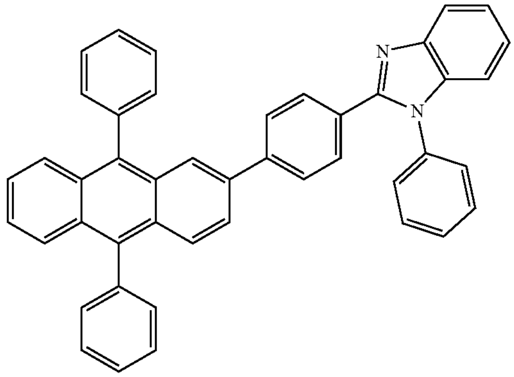
ET5
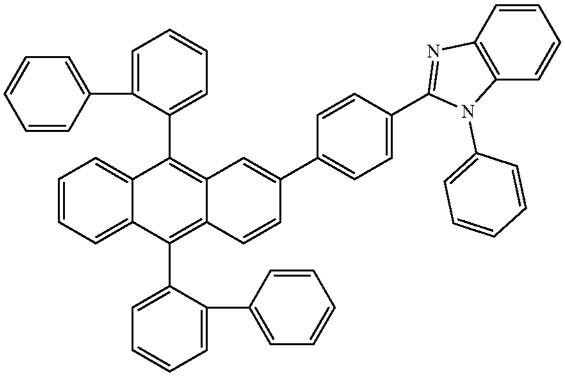
ET6
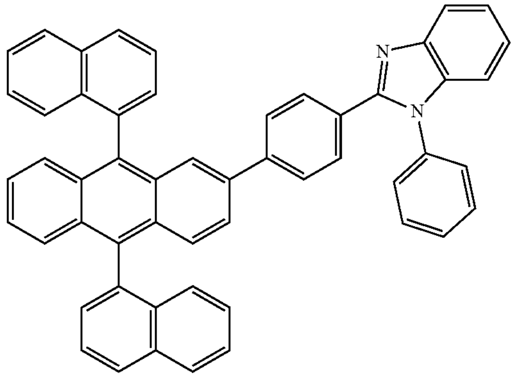

-continued
ET7
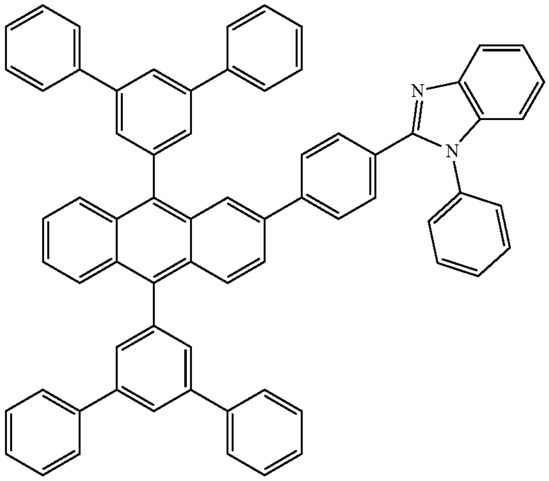
ET8
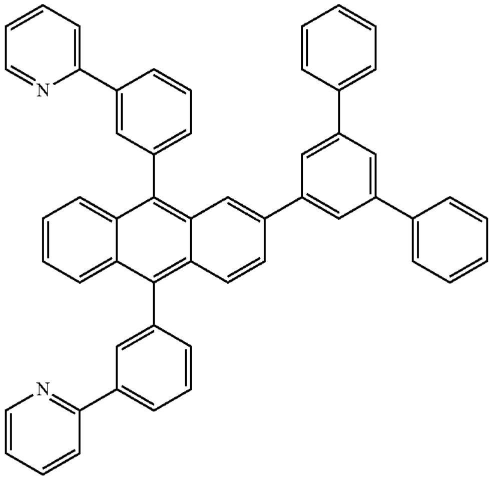
ET9
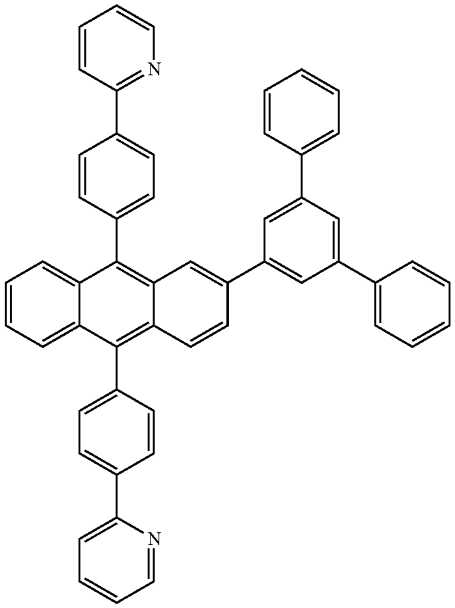
-continued
ET10
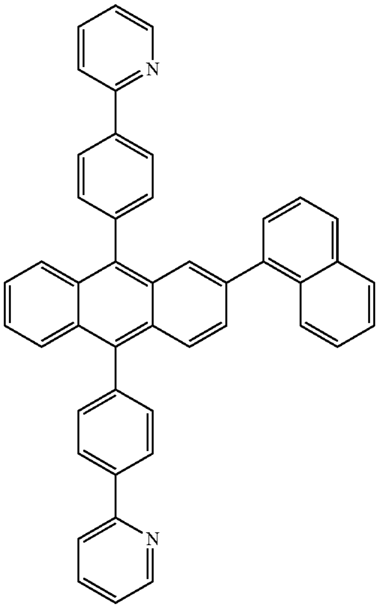
ET11
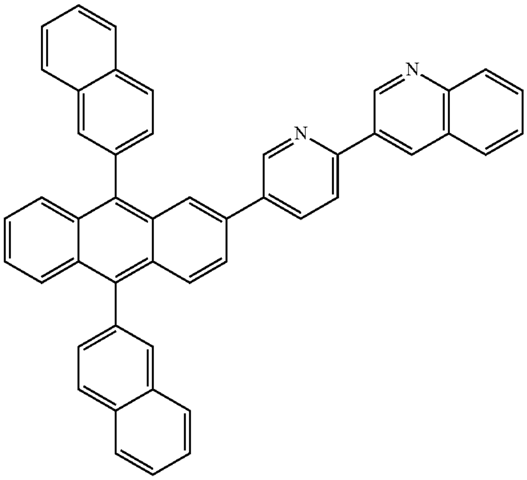
ET12
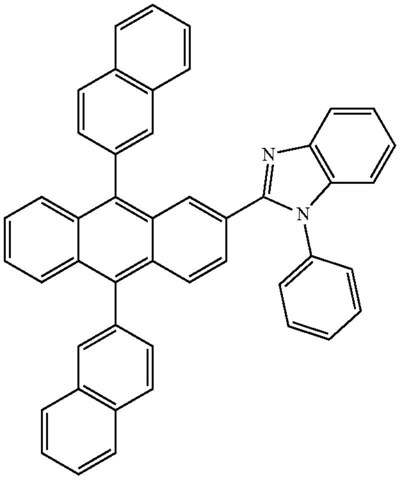

-continued
ET13
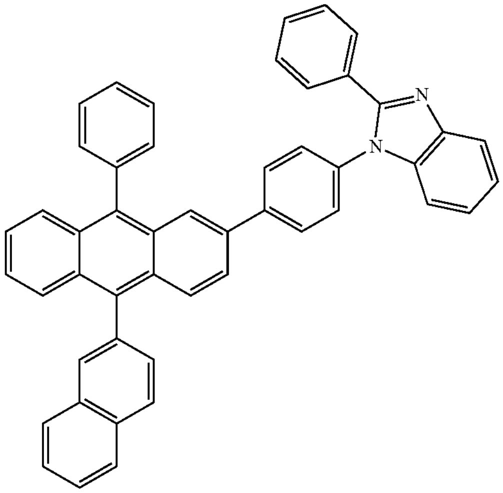
ET14
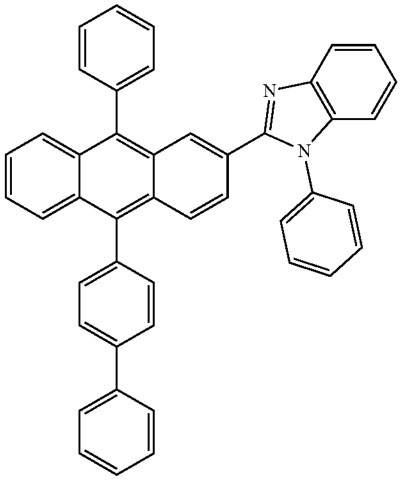
ET15
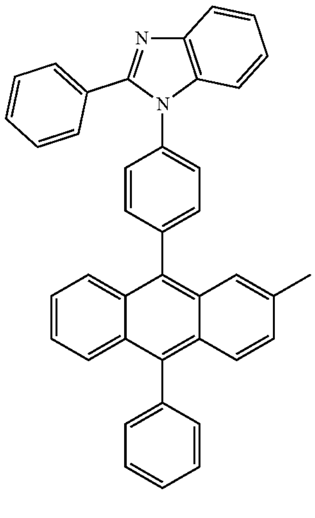
-continued
ET16
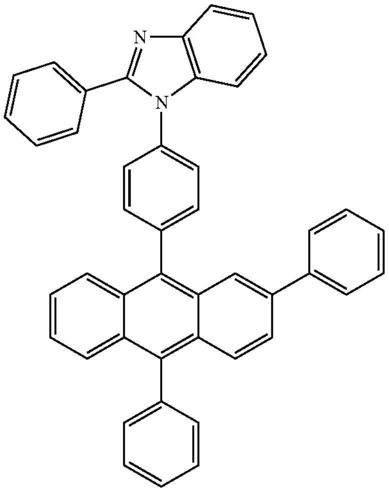
ET17
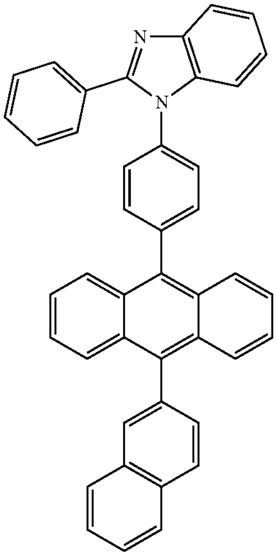
ET18
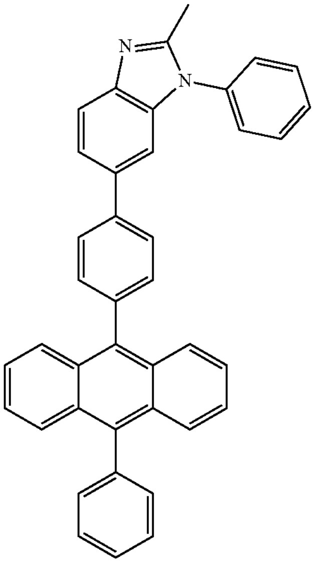

-continued
ET19
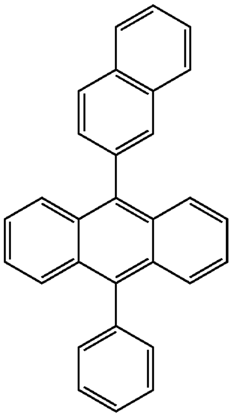
ET20
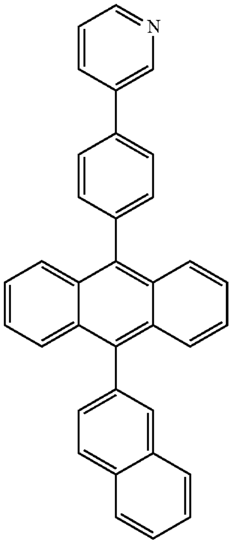
ET21
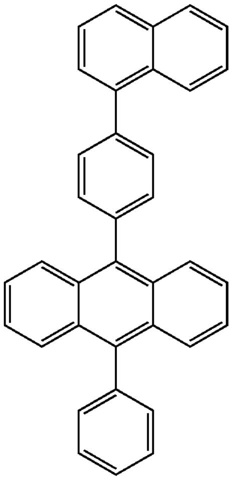
-continued
ET22
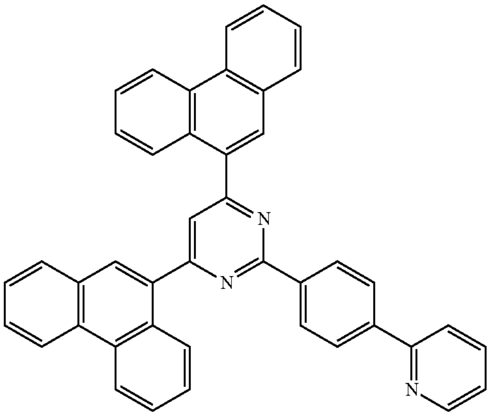
ET23
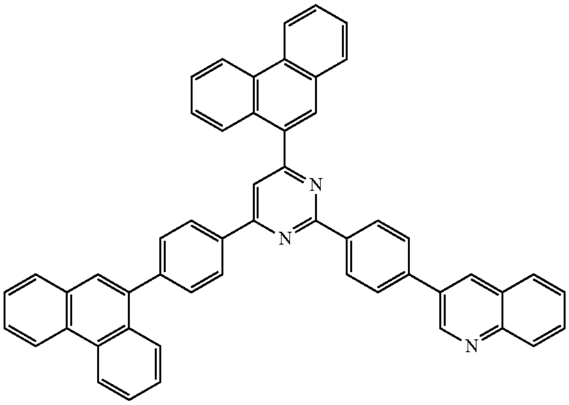
ET24
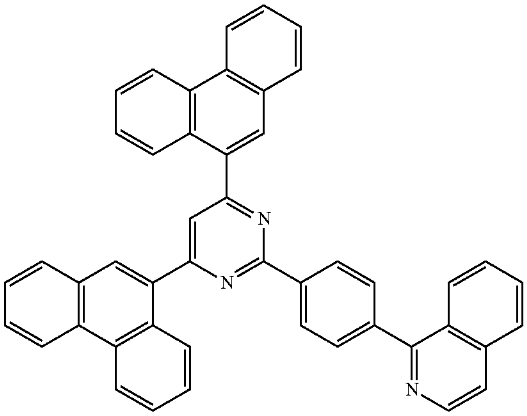

-continued
ET25
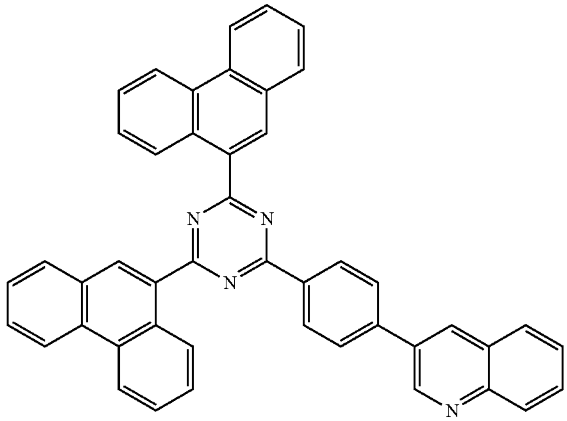
ET26
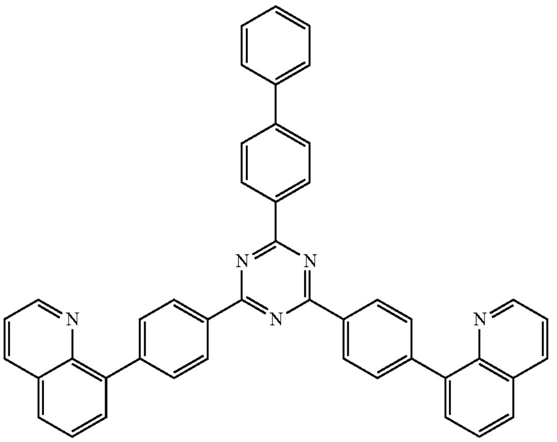
ET27
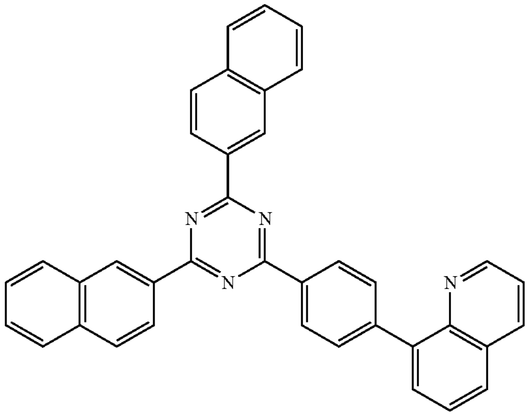
-continued
ET28
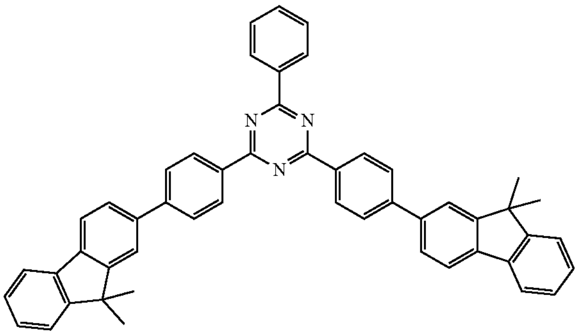
ET29
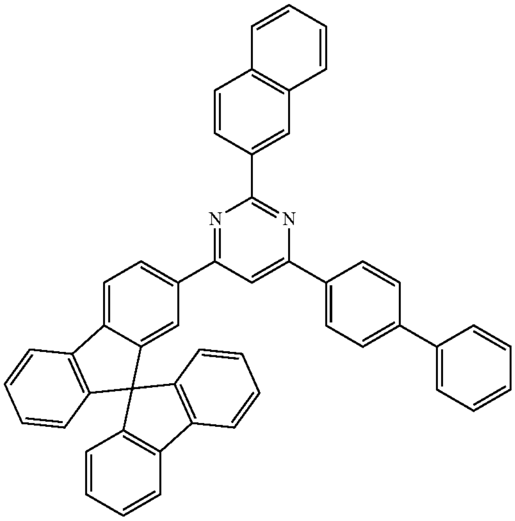
ET30
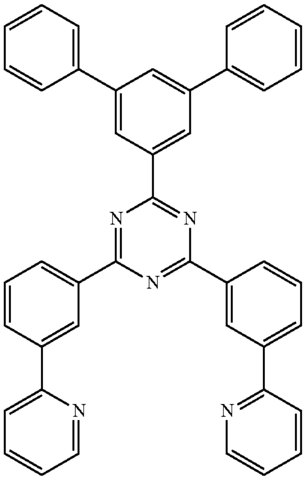

-continued
ET31
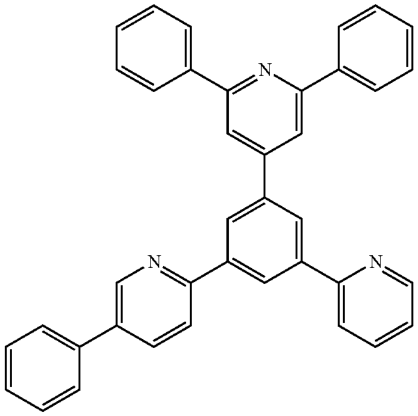
ET32
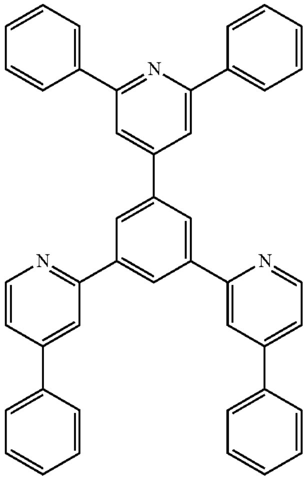
ET33
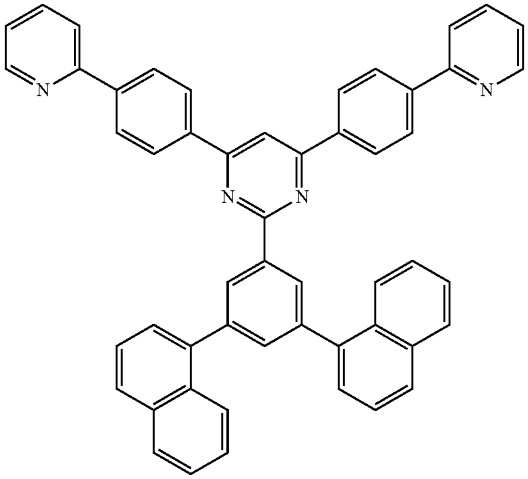
-continued
ET34
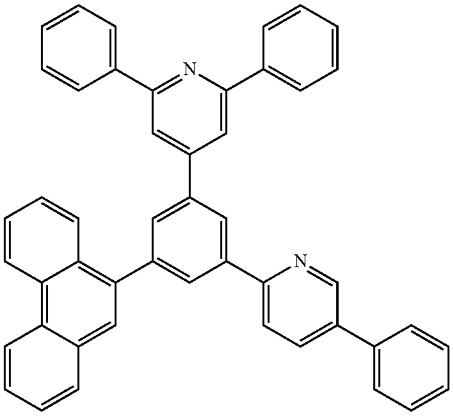
ET35
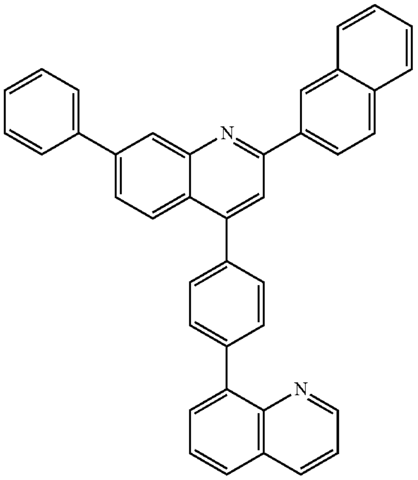
ET36
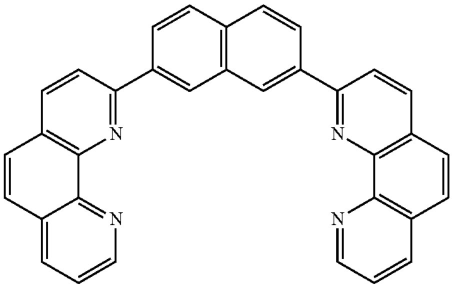
ET37
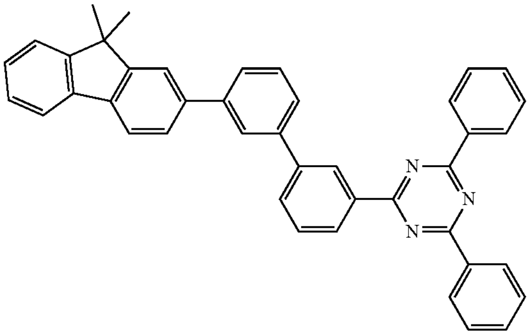

-continued
ET38
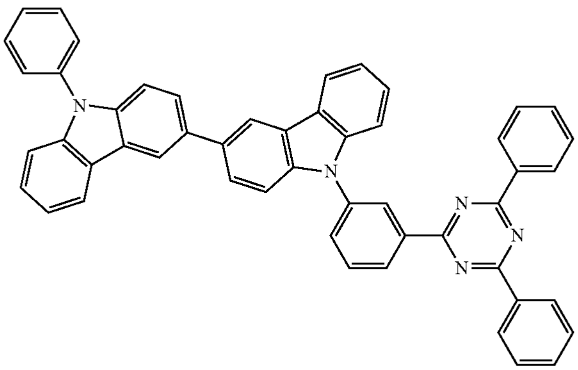
ET39
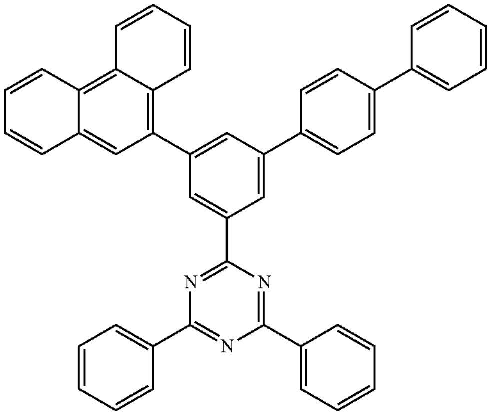
ET40
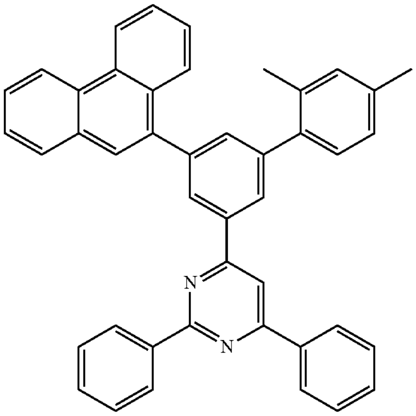
-continued
ET41
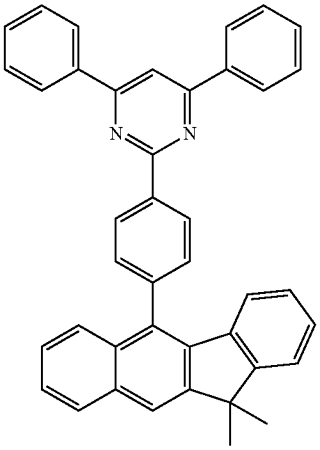
ET42
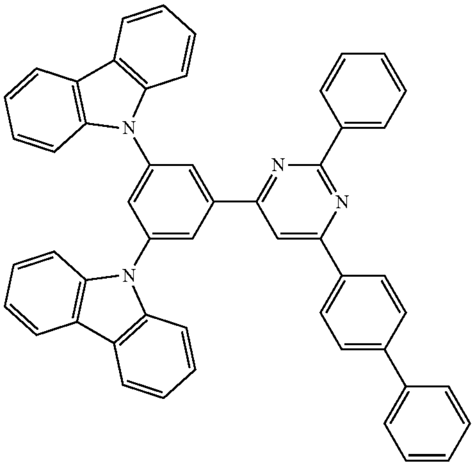
ET43
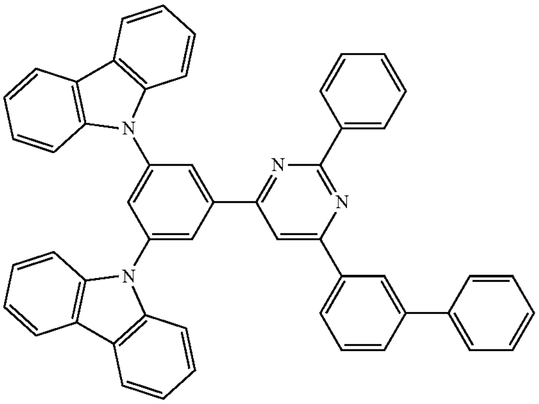

-continued

ET44

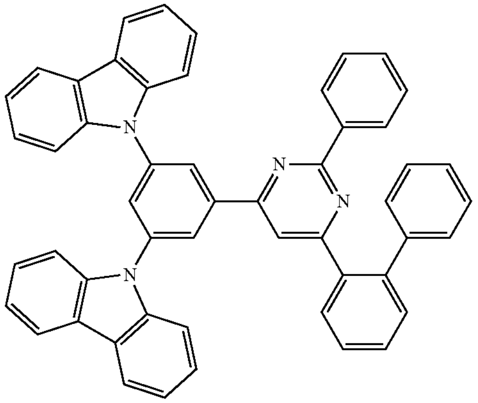

ET45

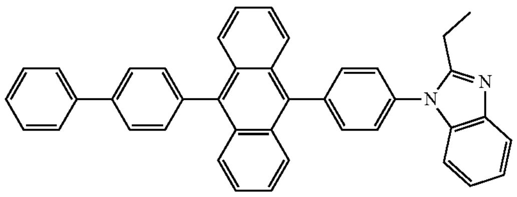

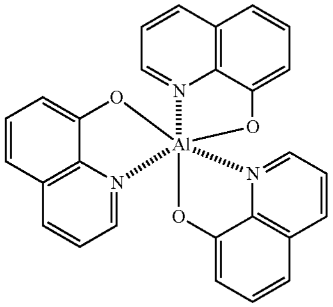

Alq3

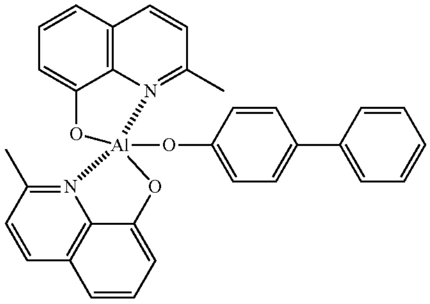

BAlq

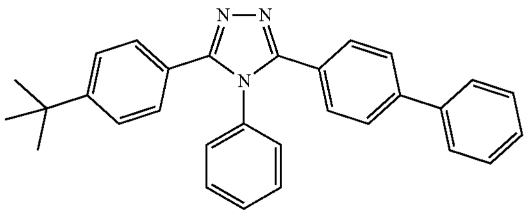

TAZ

-continued

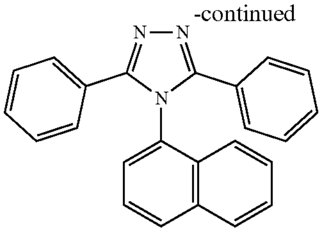

NTAZ

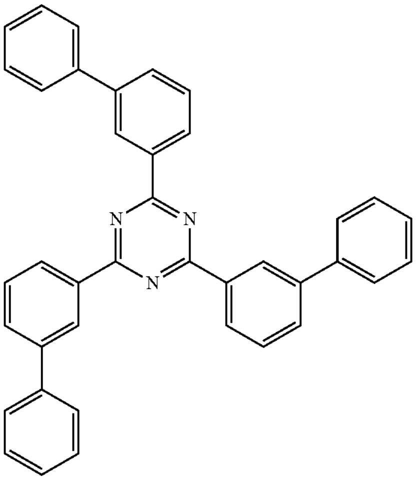

T2T

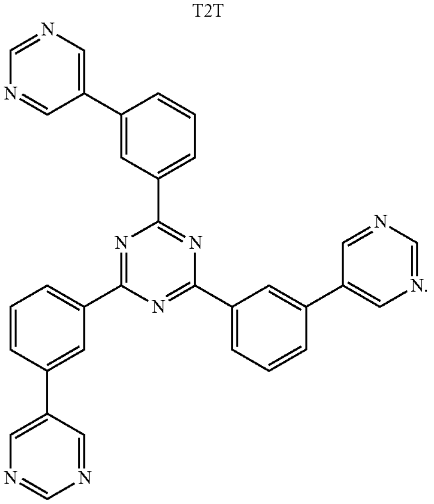

TRM-TAZ

A thickness of the electron transport region may be in a range of about 100 Å to about 5,000 Å, for example, about 160 Å to about 4,000 Å. In case that the electron transport region includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. In case that the thicknesses of the buffer layer, the hole blocking layer, the electron control layer, the electron transport layer, and/or the electron transport layer are within these ranges, satisfactory electron transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion.

A ligand coordinated with the metal ion of the alkali metal complex or the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or Compound ET-D2:

ET-D1

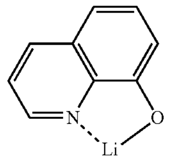

ET-D2

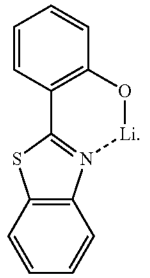

The electron transport region may include an electron injection layer that facilitates the injection of electrons from the second electrode 190. The electron injection layer may directly contact the second electrode 190.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, PD13, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; an alkali metal halide, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $SC_2O_3$, $Y_2O_3$, $Ce_2O_3$, $PD13F_3$, $TbF_3$, $YbI_3$, $ScI_3$, $TbI_3$, or any combination thereof. In one or more embodiments, the rare earth metal-containing compound may include a lanthanide metal telluride. Examples of a lanthanide metal telluride may include LaTe, CeTe, PrTe, NdTe, PmTe, SmTe, EuTe, PD13Te, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $PD13_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include: an alkali metal ion, an alkaline earth metal ion, or a rare earth metal ion; and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In an embodiment, the electron injection layer may consist of i) an alkali metal-containing compound (for example, alkali metal halide); or ii) a) an alkali metal-containing compound (for example, alkali metal halide), and b) an alkali metal, an alkaline earth metal, a rare earth metal, or any combination thereof. For example, the electron injection layer may be a KI: Yb co-deposited layer, an RbI: Yb co-deposited layer, a LiF: Yb co-deposited layer, and the like.

In case that the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. In case that the thickness of the electron injection layer is within the ranges above, satisfactory electron injection characteristics may be obtained without a substantial increase in driving voltage.

[Second Electrode 190]

The second electrode 190 may be located on the interlayer 130 having a structure as described above. The second electrode 190 may be a cathode, which is an electron injection electrode, and a material for forming the second electrode 190 may be a material having a low work function, such as a metal, an alloy, an electrically conductive compound, or any combination thereof.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a semi-transmissive electrode, or a reflective electrode.

The second electrode 190 may have a single-layer structure or a multi-layer structure.

[Capping Layer]

A first capping layer may be located outside the first electrode 110, and/or a second capping layer may be located outside the second electrode 190. For example, the light-emitting device 10 may have a structure in which the first electrode 110, a light-emitting unit 153(1), a charge generation layer 155(1), a light-emitting unit 153(2), a charge generation layer 155(2), a light-emitting unit 153(3), a charge generation layer 155(3), a light-emitting unit 153(4), a charge generation layer 155(4), a light-emitting unit 153 (5), the second electrode 190, and the second capping layer (not shown) are sequentially stacked in this stated order.

Light generated in the interlayer 130 of the light-emitting device 10 may be extracted toward the outside through the first electrode 110, which may be a semi-transmissive electrode or a transmissive electrode, and through the first capping layer. Light generated in the interlayer 130 of the light-emitting device 10 may be extracted toward the outside through the second electrode 190, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index of greater than or equal to about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

For example, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP7, β-NPB, or any combination thereof:

CP1

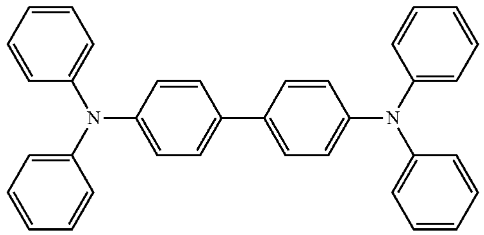

CP2

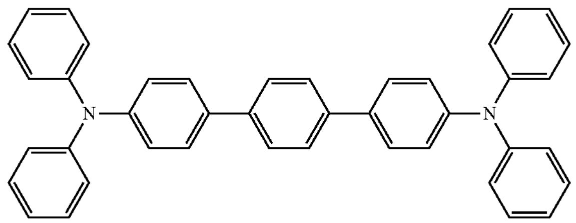

CP3

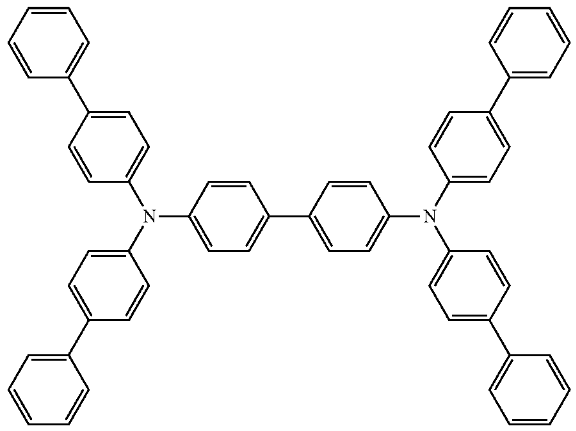

CP4

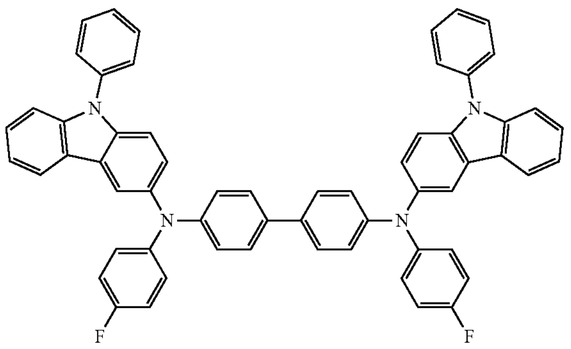

-continued

CP5

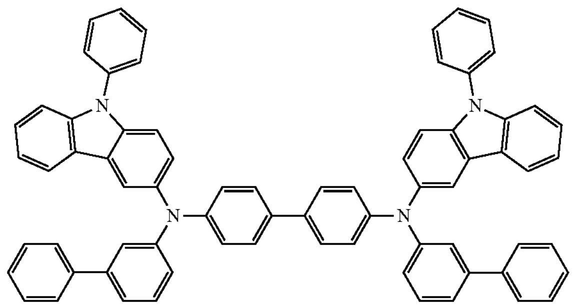

CP6

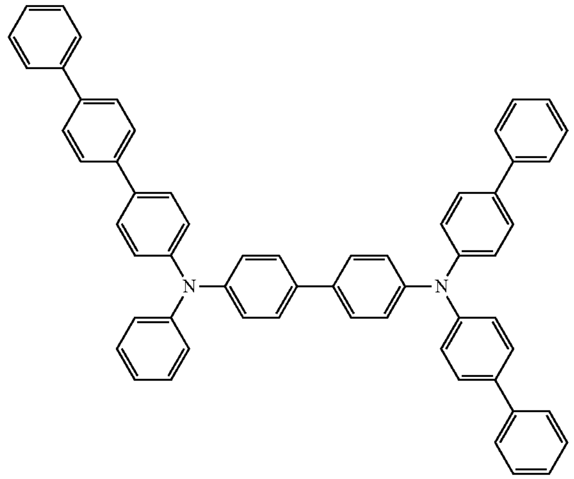

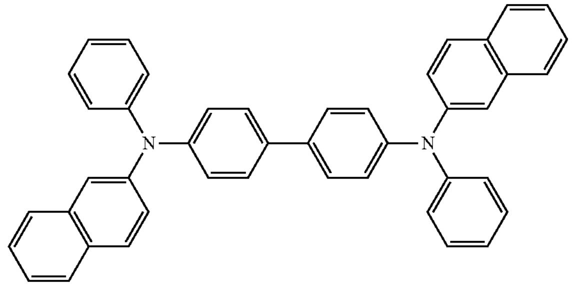

β-NPB

CPL7

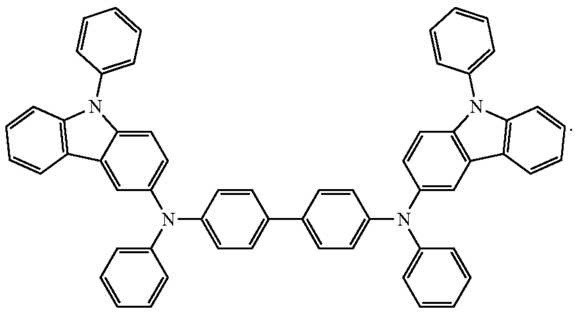

[Electronic Apparatus]

The light-emitting device may be included in various electronic apparatuses. For example, the electronic apparatus including the light-emitting device may be a light-emitting apparatus, an authentication apparatus, and the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one direction in which light emitted from the light-emitting device travels. For example, the light emitted from the light-emitting device may be blue light or white light. Details on the light-emitting device may be referred to the descriptions provided herein. In an embodiment, the color conversion layer may include a quantum dot. The quantum dot may be, for example, the quantum dot as described herein.

The electronic apparatus may include a first substrate. The first substrate may include multiple subpixel areas, the color filter may include multiple color filter areas respectively corresponding to the subpixel areas, and the color conversion layer may include multiple color conversion areas respectively corresponding to the subpixel areas.

A pixel-defining film may be located among the subpixel areas to define each of the subpixel areas.

The color filter may further include multiple color filter areas and light-shielding patterns located among the color filter areas, and the color conversion layer may further include multiple color conversion areas and light-shielding patterns located among the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. For example, the color filter areas (or the color conversion areas) may include quantum dots. In particular, the first area may include a red quantum dot, the second area may include a green quantum dot, and the third area may not include a quantum dot. Details on the quantum dot may be referred to the descriptions provided herein. The first area, the second area, and/or the third area may each further include a scatter.

For example, the light-emitting device may emit first light, the first area may absorb the first light to emit first-first color light, the second area may absorb the first light to emit second-first color light, and the third area may absorb the first light to emit third-first color light. Here, the first-first color light, the second-first color light, and the third-first color light may have different maximum emission wavelengths. In particular, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, and the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color filter and/or the color conversion layer and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. In case that the sealing portion is a thin-film encapsulation layer, the electronic apparatus may be flexible.

Various functional layers may be additionally located on the sealing portion, in addition to the color filter and/or the color conversion layer, according to the use of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 3:
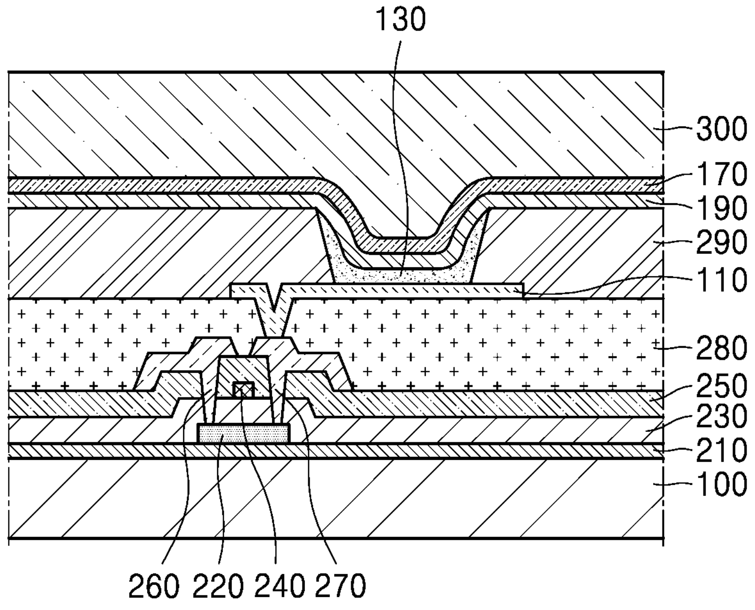
FIG. 3 is a schematic view of an electronic device according to an embodiment.
Figure 4:
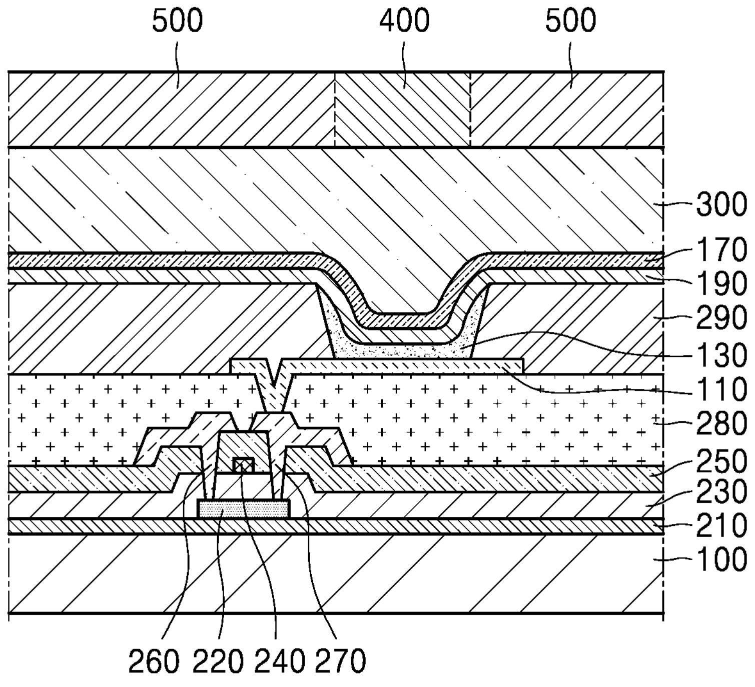
FIG. 4 is a schematic view of an electronic device according to another embodiment.

[Description of FIGS. 3 and 4]

FIG. 3 is a cross-sectional view of an electronic device according to an embodiment.

The electronic device of FIG. 3 may include a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, and/or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include the first electrode 110, the interlayer 130, and the second electrode 190.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The interlayer 130 may include the light-emitting units of the tandem light-emitting device according to the embodiments described above.

The pixel defining layer 290 may be a polyimide-based organic film or a polyacrylic-based organic film. Although not shown in FIG. 3, at least some layers of the interlayer 130 may extend beyond the upper portion of the pixel defining layer 290 to be located in the form of a common layer.

The second electrode 190 may be located on the interlayer 130, and a capping layer 170 may be additionally formed on the second electrode 190. The capping layer 170 may be formed to cover the second electrode 190.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or a combination of the inorganic film and the organic film.

FIG. 4 is a cross-sectional view of an electronic device according to another embodiment.

The electronic device of FIG. 4 may be the same as the light-emitting device of FIG. 3, except at least that a light-shielding pattern 500 and a functional region 400 may additionally be located on the encapsulation portion 300. The functional region 400 may be i) a color filter area, ii) a color conversion area, or iii) a combination of the color filter area and the color conversion area.

Figure 5:
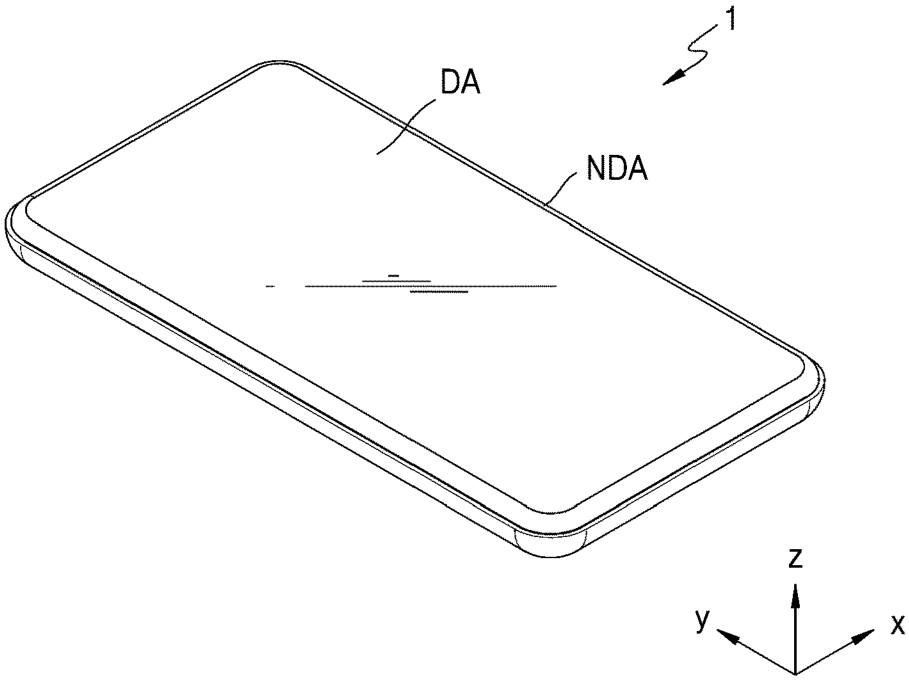
FIG. 5 is a schematic perspective view of electronic equipment including a light-emitting device according to an embodiment.

[Description of FIG. 5]

FIG. 5 is a schematic perspective view of electronic equipment 1 including a light-emitting device according to an embodiment. The electronic equipment 1 may be, as a device apparatus that displays a moving image or still image, a portable electronic equipment, such as a mobile phone, a smart phone, a tablet personal computer (PC), a mobile communication terminal, an electronic notebook, an electronic book, a portable multimedia player (PMP), a navigation, or a ultra mobile PC (UMPC), as well as various products, such as a television, a laptop, a monitor, a billboard, or an Internet of Things (IOT) device. The electronic equipment 1 may be such a product above or a part thereof. The electronic equipment 1 may be a wearable device, such as a smart watch, a watch phone, a glasses-type display, or a head mounted display (HMD), or a part of the wearable device. However, embodiments of the disclosure are not limited thereto. For example, the electron equipment 1 may include a dashboard of a vehicle, a center fascia of a vehicle, a center information display located on a dashboard of a vehicle, a room mirror display replacing a side mirror of a vehicle, an entertainment display for the rear seat of a vehicle or a display located on the back of the front seat, a heads up display (HUD) installed in the front of a vehicle or projected on a front window glass, or a computer generated hologram augmented reality head up display (CGH AR HUD). FIG. 5 illustrates a case in which the electronic equipment 1 is a smart phone for convenience of explanation.

The electronic equipment 1 may include a display area DA and a non-display area NDA outside the display area DA. A display device may implement an image through an array of pixels that are two-dimensionally arranged in the display area DA.

The non-display area NDA may be an area that does not display an image, and in an embodiment, may entirely surround the display area DA. On the non-display area NDA, a driver for providing electrical signals or power to display devices located in the display area DA may be located. On the non-display area NDA, a pad, which is an area to which an electronic element or a printed circuit board may be electrically connected, may be located.

In the electronic equipment 1, a length in the x-axis direction and a length in the y-axis direction may be different from each other. In an embodiment, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

[Description of FIGS. 6 and 7A to 7C]

Figure 6:
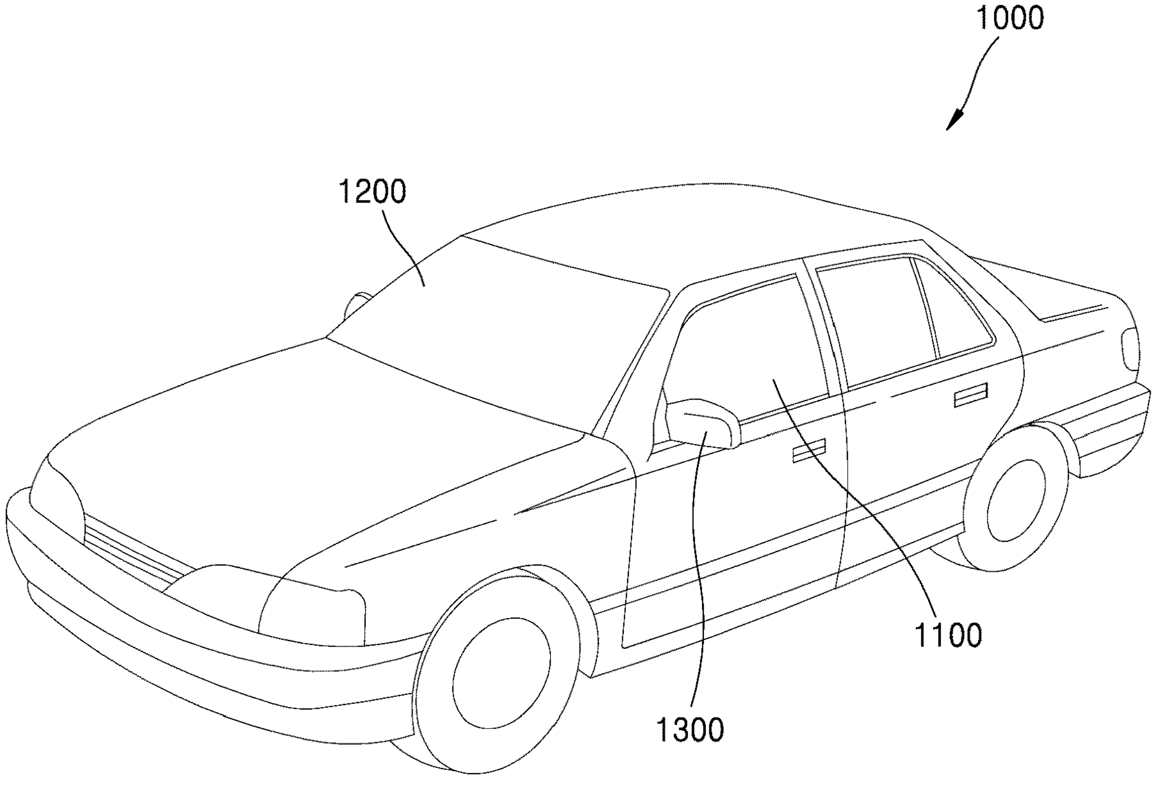
FIG. 6 is a schematic view of the exterior of a vehicle as electronic equipment including a light-emitting device according to an embodiment.
Figure 7A:
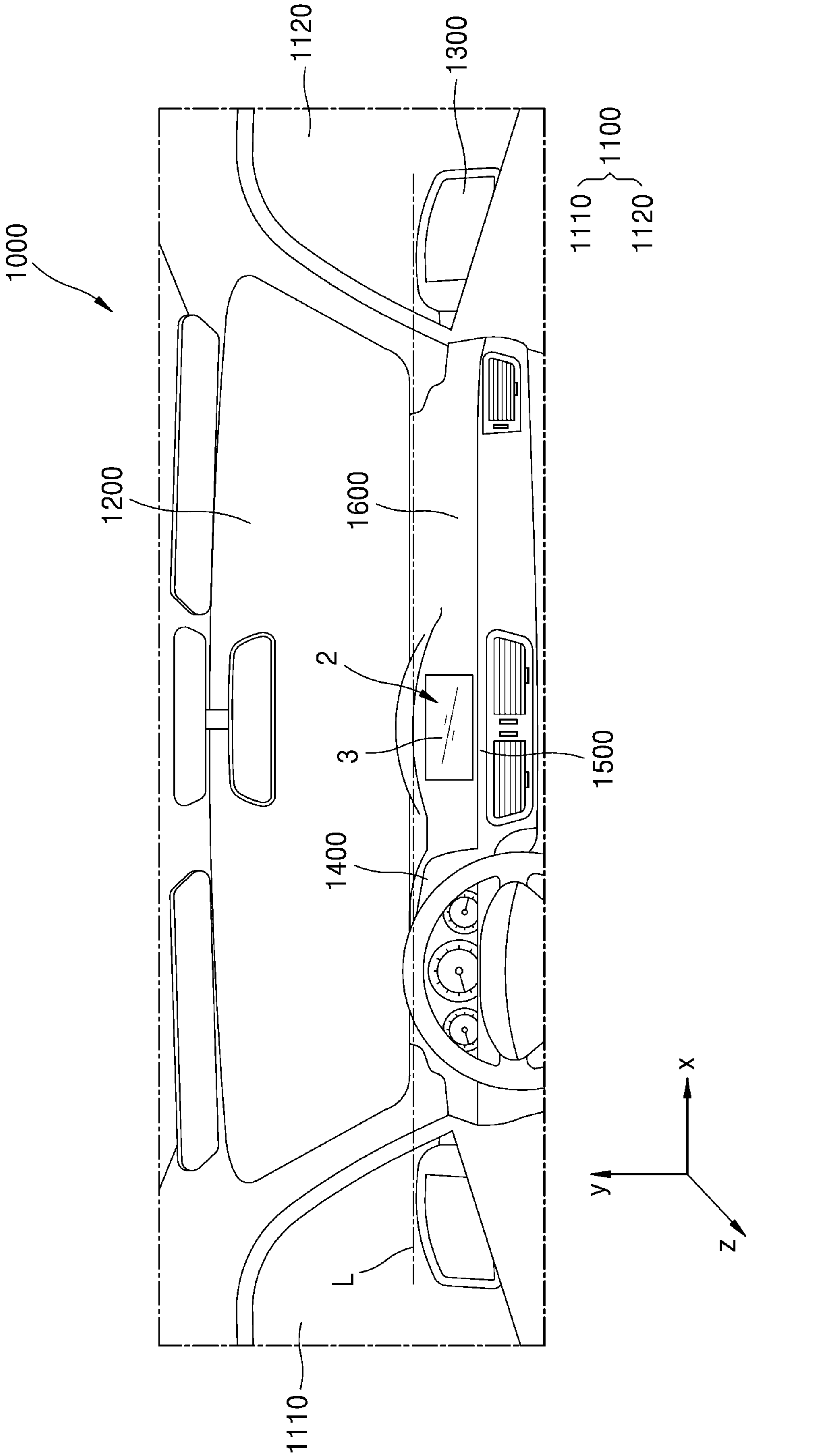
FIGS. 7A to 7C are each a schematic view of the interior of a vehicle according to various embodiments.
Figure 7B:
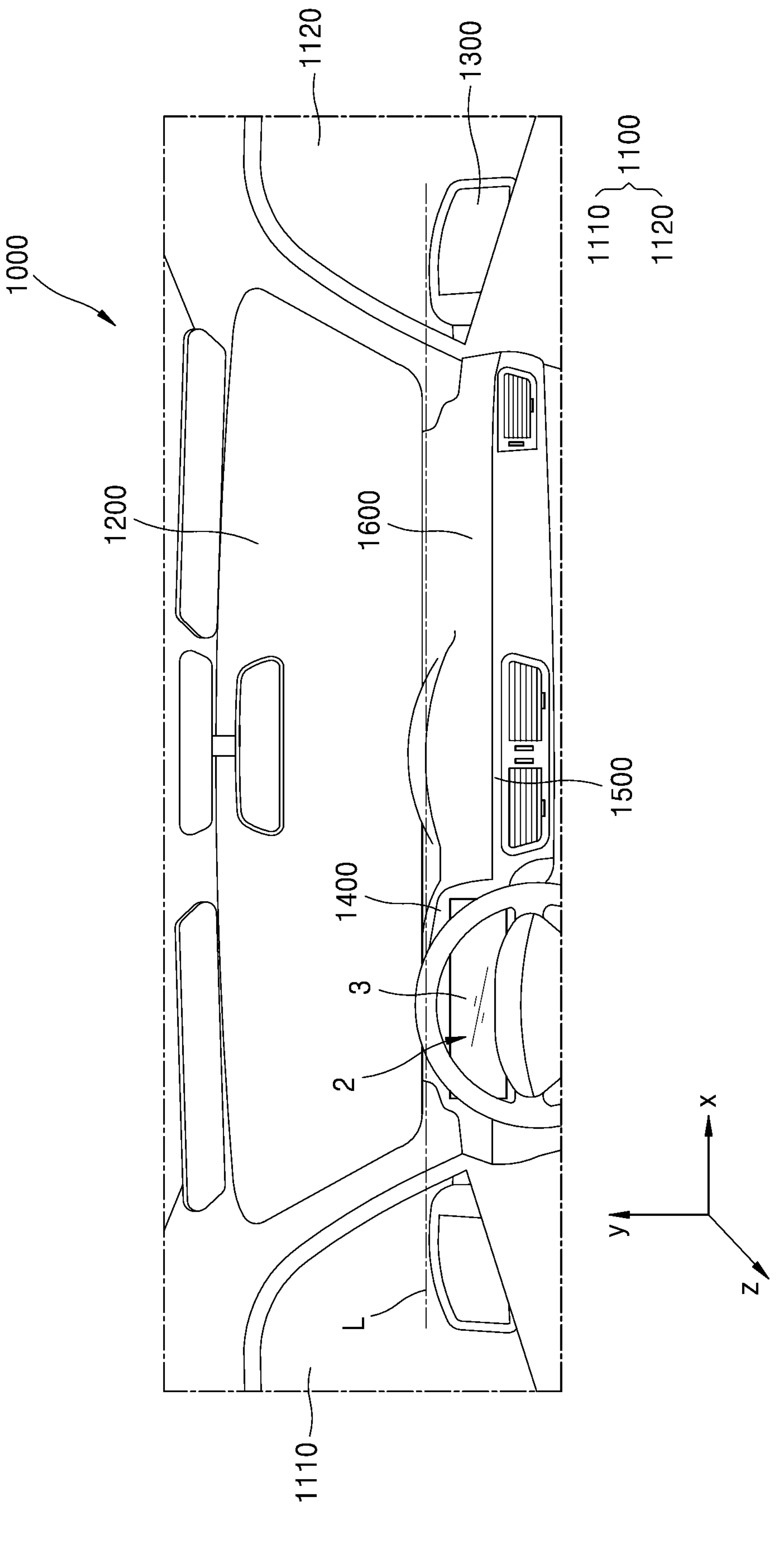
Figure 7C:
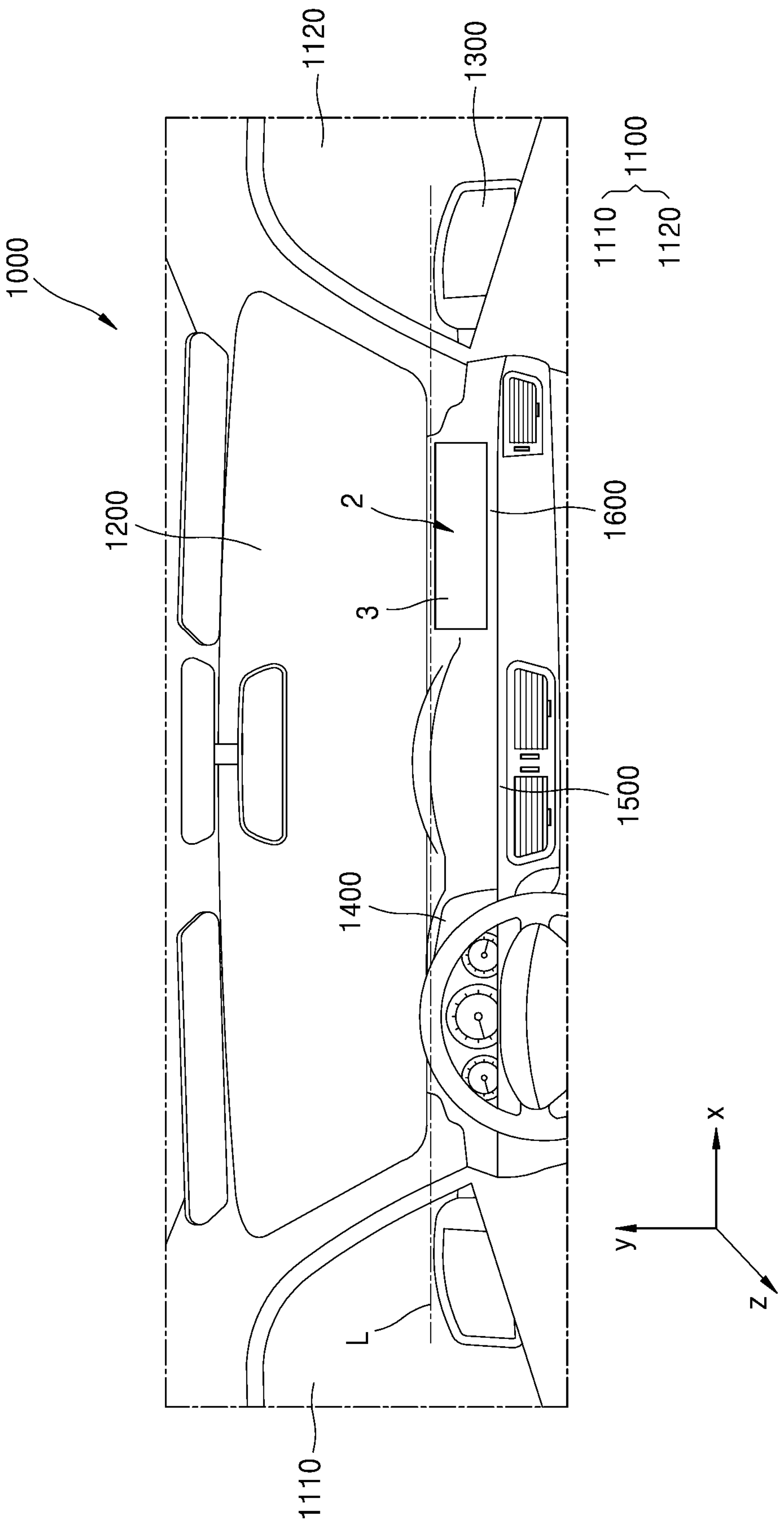

FIG. 6 is a schematic view of the exterior of a vehicle 1000 as electronic equipment including a light-emitting device according to an embodiment. FIGS. 7A to 7C are each a schematic view of the interior of the vehicle 1000 according to various embodiments.

Referring to FIGS. 6 and 7A to 7C, the vehicle 1000 may refer to various apparatuses for moving a subject to be transported, such as a human, an object, or an animal, from a departure point to a destination point. The vehicle 1000 may include a vehicle traveling on a road or track, a vessel moving over the sea or river, an airplane flying in the sky using the action of air, and the like.

The vehicle 1000 may travel on a road or a track. The vehicle 1000 may move in a certain direction according to rotation of at least one wheel. For example, the vehicle 1000 may include a three-wheeled or four-wheeled vehicle, a construction machine, a two-wheeled vehicle, a prime mover device, a bicycle, and a train running on a track.

The vehicle 1000 may include a body having an interior and an exterior, and a chassis in which mechanical apparatuses necessary for driving are installed as other parts except for the body. The exterior of the body may include a front panel, a bonnet, a roof panel, a rear panel, a trunk, a pillar provided at a boundary between doors, and the like. The chassis of the vehicle 1000 may include a power generating device, a power transmitting device, a driving device, a steering device, a braking device, a suspension device, a transmission device, a fuel device, front and rear wheels, left and right wheels, and the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a pillar located between the side window glass 1100 and the front window glass 1200.

The side window glass 1100 may be installed on the side of the vehicle 1000. In an embodiment, the side window glass 1100 may be installed on a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be located adjacent to the cluster 1400. The second side window glass 1120 may be located adjacent to the passenger seat dashboard 1600.

In an embodiment, the side window glasses 1100 may be spaced apart from each other in the x-direction or the −x-direction. For example, the first side window glass 1110 and the second side window glass 1120 may be spaced apart from each other in the x direction or the −x direction. In other words, an imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in the front of the vehicle 1000. The front window glass 1200 may be located between the side window glasses 1100 facing each other.

The side mirror 1300 may provide a rear view of the vehicle 1000. The side mirror 1300 may be installed on the exterior of the body. In an embodiment, multiple side mirrors 1300 may be provided. Any of side mirrors 1300 may be located outside the first side window glass 1110. The other of side mirrors 1300 may be located outside the second side window glass 1120.

The cluster 1400 may be located in front of the steering wheel. The cluster 1400 may include a tachometer, a speedometer, a coolant thermometer, a fuel gauge, a turn indicator, a high beam indicator, a warning lamp, a seat belt warning lamp, an odometer, a hodometer, an automatic shift selector indicator lamp, a door open warning lamp, an engine oil warning lamp, and/or a low fuel warning light.

The center fascia 1500 may include a control panel on which buttons for adjusting an audio device, an air conditioning device, and a heater of a seat are located. The center fascia 1500 may be located on one side of the cluster 1400.

The passenger seat dashboard 1600 may be spaced apart from the cluster 1400 with the center fascia 1500 therebetween. In an embodiment, the cluster 1400 may be located to correspond to a driver seat (not shown), and the passenger seat dashboard 1600 may be located to correspond to a passenger seat (not shown). In an embodiment, the cluster 1400 may be adjacent to the first side window glass 1110, and the passenger seat dashboard 1600 may be adjacent to the second side window glass 1120.

In an embodiment, the display device 2 may include a display panel 3, and the display panel 3 may display an image. The display device 2 may be located inside the vehicle 1000. In an embodiment, the display device 2 may be located between the side window glasses 1100 facing each other. The display device 2 may be located on at least one of the cluster 1400, the center fascia 1500, and the passenger seat dashboard 1600.

The display device 2 may include an organic light-emitting display device, an inorganic light-emitting display device, a quantum dot display device, and the like. Hereinafter, as the display device 2 according to an embodiment, an organic light-emitting display device including the light-emitting device according to the disclosure will be described as an example, but various types of display devices as described above may be used in embodiments.

Referring to FIG. 7A, the display device 2 may be located on the center fascia 1500. In an embodiment, the display device 2 may display navigation information. In an embodiment, the display device 2 may display audio, video, or information regarding vehicle settings.

Referring to FIG. 7B, the display device 2 may be located on the cluster 1400. In case that the display device 2 is located on the cluster 1400, the cluster 1400 may display driving information and the like through the display device 2. For example, the cluster 1400 may be implemented digitally. The digital cluster 1400 may display vehicle information and driving information as images. For example, a needle and a gauge of a tachometer and various warning light icons may be displayed by a digital signal.

Referring to FIG. 7C, the display device 2 may be located on the passenger seat dashboard 1600. The display device 2 may be embedded in the passenger seat dashboard 1600 or located on the passenger seat dashboard 1600. In an embodiment, the display device 2 located on the passenger seat dashboard 1600 may display an image related to information displayed on the cluster 1400 and/or information displayed on the center fascia 1500. In one or more embodiments, the display device 2 located on the passenger seat dashboard 1600 may display information different that is from information displayed on the cluster 1400 and/or information displayed on the center fascia 1500.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging (LITI), and/or the like.

In case that respective layers included in the hole transport region, the emission layer, and respective layers included in the electron transport region are formed by vacuum deposition, the deposition may be performed at a deposition temperature of about 100° ° C. to about 500° C., a vacuum degree of about 10-8 torr to about 10-3 torr, and a deposition speed of about 0.01 Å/sec to about 100 Å/sec, depending on a material to be included in a layer to be formed and the structure of a layer to be formed.

[Definitions of Terms]

The term "$C_3$-$C_{60}$ carbocyclic group" as used herein may be a cyclic group consisting of carbon as the only ring-forming atom and having 3 to 60 carbon atoms, and the term "$C_1$-$C_{60}$ heterocyclic group" as used herein may be a cyclic group that has 1 to 60 carbon atoms and further has, in addition to a carbon atom, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may be a $C_3$-$C_{60}$ carbocyclic group or a $C_1$-$C_{60}$ heterocyclic group.

The term "IT electron-rich $C_3$-$C_{60}$ cyclic group" as used herein may be a cyclic group that has 3 to 60 carbon atoms and may not include *-N═*' as a ring-forming moiety, and the term "TT electron-deficient nitrogen-containing $C_1$-$C_{60}$ cyclic group" as used herein may be a heterocyclic group that has 1 to 60 carbon atoms and may include *-N═*' as a ring-forming moiety.

In embodiments, a $C_3$-$C_{60}$ carbocyclic group may be i) a T1 group or ii) a group in which at least two T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), a $C_1$-$C_{60}$ heterocyclic group may be i) a T2 group, ii) a group in which at least two T2 groups are condensed with each other, or iii) a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), a π electron-rich $C_3$-$C_{60}$ cyclic group may be i) a T1 group, ii) a group in which at least two T1 groups are condensed with each other, iii) a T3 group, iv) a group in which at least two T3 groups are condensed with each other, or v) a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), a π electron-deficient nitrogen-containing $C_1$-$C_{60}$ cyclic group may be i) a T4 group, ii) a group in which at least two T4 groups are condensed with each other, iii) a group in which at least one T4 group and at least one T1 group are condensed with each other, iv) a group in which at least one T4 group and at least one T3 group are condensed with each other, or v) a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "IT electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group or a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group or a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having the same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having the same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having the same structure as the $C_2$-$C_{60}$ alkynyl group.

The term "$C_1$-$C_{60}$ alkoxy group" as used herein may be a monovalent group represented by —O($A_{101}$) (wherein $A_{101}$ may be $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, a bicyclo[2.2.2]octyl group, and the like. The term "$C_3$-$C_{10}$ cycloalkylene group" as used herein may be a divalent group having the same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having the same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having the same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of a $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having the same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. In case that the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and the like. In case that the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of a monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having the same structure as the monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of a monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl a group, a benzofurodibenzofuranyl group, benzofurodibenzothiophenyl group, a benzothienodibenzothiophenyl group, and the like. The term "divalent non-aromatic condensed heteropolycyclic group" as used herein may be a divalent group having the same structure as the monovalent non-aromatic condensed heteropolycyclic group.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by –($A_{104}$) ($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by –($A_{106}$)($A_{107}$) (wherein $A_{106}$ may be a $C_1$-$C_{59}$ alkylene group, and $A_{107}$ may be a $C_1$-$C_{59}$ heteroaryl group).

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_5$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein may be any atom other than a carbon atom or a hydrogen atom. Examples of a heteroatom may include O, S, N, P, Si, B, Ge, Se, or any combination thereof.

In the specification, examples of a "third-row transition metal" may include hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the terms "tert-Bu" or "But" as used herein each refer to a tert-butyl group, and the term "OMe" as used herein refers to a methoxy group.

The term "biphenyl group" as used herein may be a "phenyl group substituted with a phenyl group." For example, a "biphenyl group" may be a substituted phenyl group having a $C_6$-$C_{60}$ aryl group as a substituent.

The term "terphenyl group" as used herein may be a "phenyl group substituted with a biphenyl group." For example, a "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the following Synthesis Examples and Examples. The wording "B was used instead of A" used in describing Synthesis Examples means that an identical molar equivalent of B was used in place of A.

EXAMPLES

Example 1 (BGBGB)

Formation of Anode

As a substrate and an anode, a glass substrate with 15 Ω/cm² (50 Å) ITO thereon, which was manufactured by Corning Inc., was cut to a size of 50 mm×50 mm×0.5 mm, sonicated with acetone, isopropyl alcohol, and pure water for 15 minutes each, and cleaned by exposure to ultraviolet rays and ozone for 30 minutes. Then, the glass substrate was loaded onto a vacuum deposition apparatus, Ag was patterned thereon to a thickness of 1,000 Å, and ITO was patterned thereon to a thickness of 70 Å, thereby forming an anode.

Formation of First Light-Emitting Unit

HATCN was deposited on the ITO/Ag/ITO anode to form a hole injection layer having a thickness of 50 Å, and then, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a first-first emission layer having a thickness of 85 Å, and then, H125 and DF10 (1 wt %) were co-deposited on the first-first emission layer to form a first-second emission layer having a thickness of 85 Å.

T2T was deposited on the first-second emission layer to form a hole blocking layer having a thickness of 50 Å, and then, TPM-TAZ and Liq were co-deposited at a weight ratio of 50:50 on the hole blocking layer to form an electron transport layer having a thickness of 100 Å, thereby forming a first light-emitting unit.

Formation of First Charge Generation Layer

BCP and Li (10 wt %) were co-deposited on the first light-emitting unit to form an n-type charge generation layer having a thickness of 65 Å, and then, HAT-CN was deposited on the n-type charge generation layer to form a p-type charge generation layer having a thickness of 50 Å, thereby forming a first charge generation layer.

Formation of Second Light-Emitting Unit

NPB was deposited on the first charge generation layer to form a hole transport layer having a thickness of 50 Å.

H39 and H126 (weight ratio of 1:1) as hosts and PD13 (9 wt %) as a dopant were co-deposited on the hole transport layer to form a second emission layer having a thickness of 250 Å.

TPM-TAZ and Liq were co-deposited at a weight ratio of 50:50 on the second emission layer to form an electron transport layer having a thickness of 100 Å, thereby forming a second light-emitting unit.

Formation of Second Charge Generation Layer

BCP and Li (10 wt %) were co-deposited on the second light-emitting unit to form an n-type charge generation layer having a thickness of 65 Å, and then, HAT-CN was deposited on the n-type charge generation layer to form a p-type charge generation layer having a thickness of 50 Å, thereby forming a second charge generation layer.

Formation of Third Light-Emitting Unit

NPB was deposited on the second charge generation layer to form a hole transport layer having a thickness of 50 Å, and TCTA was deposited on the hole transport layer to form an electron blocking layer having a thickness of 75 Å, thereby forming a hole transport region.

H8 and DF10 (1 wt %) were co-deposited on the hole transport region to form a third-first emission layer having a thickness of 85 Å, and then, H125 and DF10 (1 wt %) were co-deposited on the third-first emission layer to form a third-second emission layer having a thickness of 85 Å.

T2T was deposited on the third-second emission layer to form a hole blocking layer having a thickness of 50 Å, and then, TPM-TAZ and Liq were co-deposited at a weight ratio of 50:50 on the hole blocking layer to form an electron transport layer having a thickness of 50 Å, thereby forming a third light-emitting unit.

Formation of Third Charge Generation Layer

BCP and Li (10 wt %) were co-deposited on the third light-emitting unit to form an n-type charge generation layer having a thickness of 65 Å, and then, HAT-CN was deposited on the n-type charge generation layer to form a p-type charge generation layer having a thickness of 50 Å, thereby forming a third charge generation layer.

Formation of Fourth Light-Emitting Unit

NPB was deposited on the third charge generation layer to form a hole transport layer having a thickness of 50 Å.

H39 and H126 (weight ratio of 1:1) as hosts and PD13 (9 wt %) as a dopant were co-deposited on the hole transport layer to form a fourth emission layer having a thickness of 250 Å.

TPM-TAZ and Liq were co-deposited at a weight ratio of 50:50 on the fourth emission layer to form an electron transport layer having a thickness of 100 Å, thereby forming a fourth light-emitting unit.

Formation of Fourth Charge Generation Layer

BCP and Li (10 wt %) were co-deposited on the fourth light-emitting unit to form an n-type charge generation layer having a thickness of 65 Å, and then, HAT-CN was deposited on the n-type charge generation layer to form a p-type charge generation layer having a thickness of 50 Å, thereby forming a fourth charge generation layer.

Formation of Fifth Light-Emitting Unit

NPB was deposited on the fourth charge generation layer to form a hole transport layer having a thickness of 50 Å, and TCTA was deposited on the hole transport layer to form an electron blocking layer having a thickness of 75 Å, thereby forming a hole transport region.

H8 and DF10 (1 wt %) were co-deposited on the hole transport region to form a fifth-first emission layer having a thickness of 85 Å, and then, H125 and DF10 (1 wt %) were co-deposited on the fifth-first emission layer to form a fifth-second emission layer having a thickness of 85 Å.

T2T was deposited on the fifth-second emission layer to form a hole blocking layer having a thickness of 50 Å, and then, TPM-TAZ and Liq were co-deposited at a weight ratio of 50:50 on the hole blocking layer to form an electron transport layer having a thickness of 100 Å, thereby forming a fifth light-emitting unit.

Formation of Second Electrode

Yb was deposited on the fifth light-emitting unit to form an electron injection layer having a thickness of 10 Å, and then, Ag and Mg (10 wt %) were co-deposited on the electron injection layer to form a second electrode (cathode) having a thickness of 100 Å, and CPL 7 was deposited on the second electrode to form a capping layer having a thickness of 500 Å, thereby completing the manufacture of a light-emitting device including five light-emitting units.

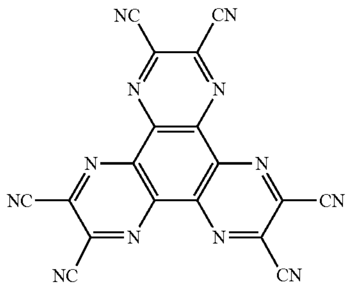

HATCN

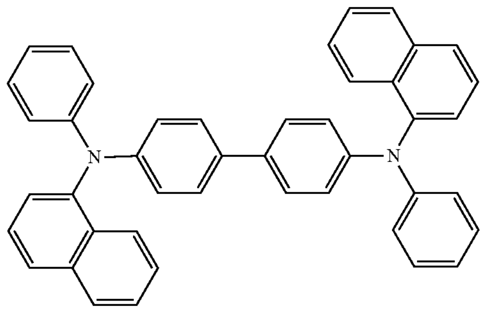

NPB

-continued
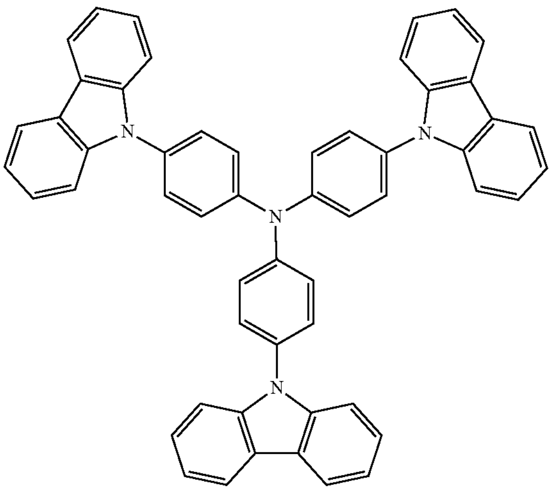
TCTA
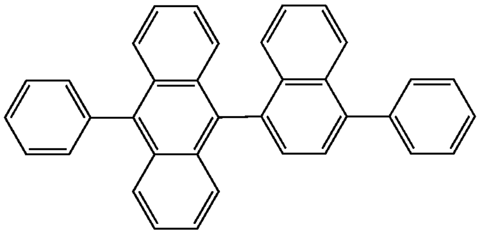
HB
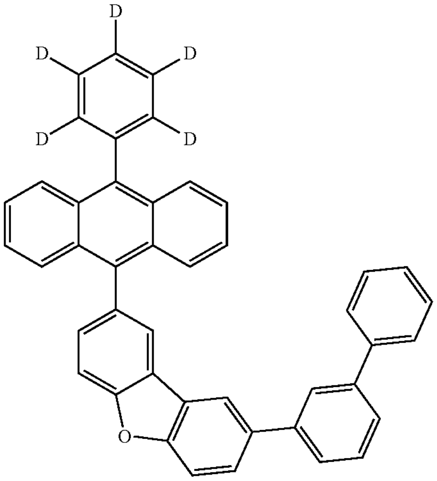
H125
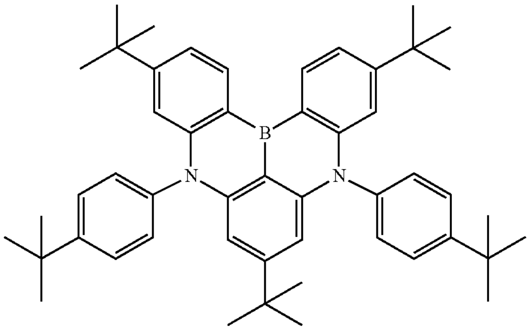
DF10
-continued
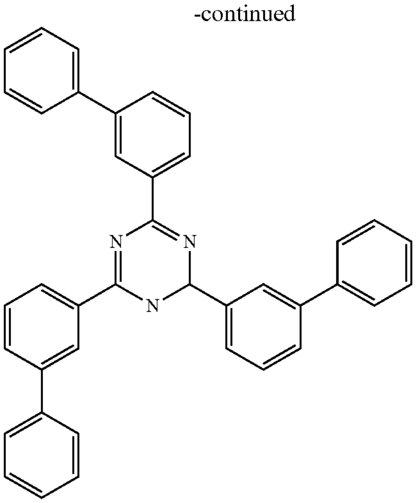
T2T
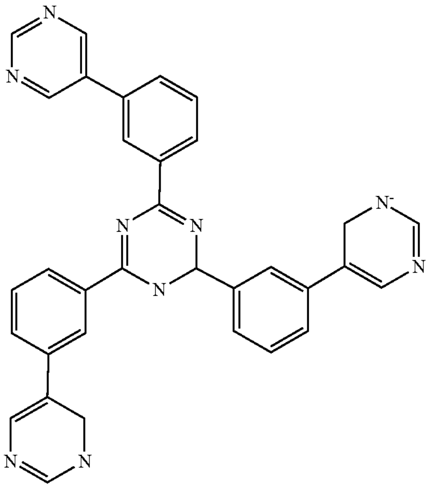
TPM-TAZ
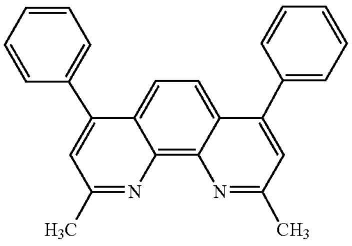
BCP -continued

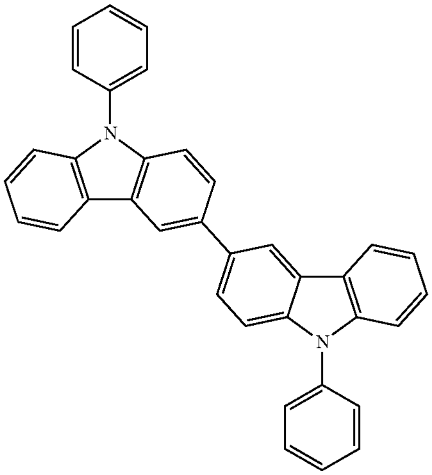

H39

-continued

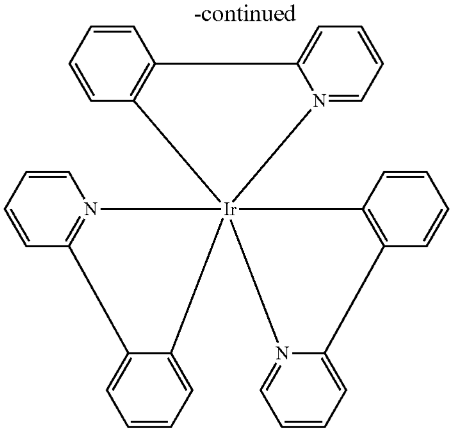

PD13(Ir(ppy)$_3$)

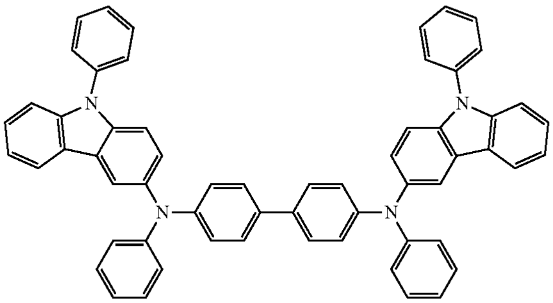

CPL7

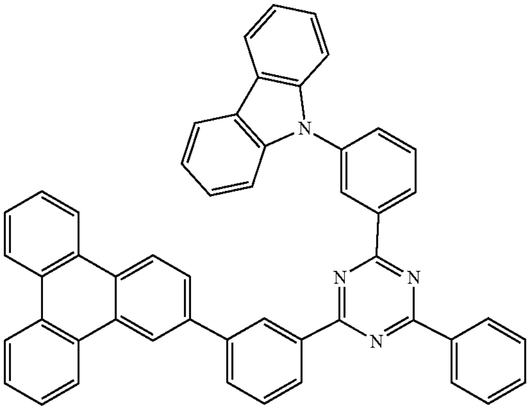

H126

Comparative Example 1

In Comparative Example 1, a light-emitting device including four light-emitting units respectively having configurations shown in Table 1 was manufactured. Here, the light-emitting device of Comparative Example 1 was manufactured in the same manner as in Example 1, except that the fifth light-emitting unit was not included, and the material and thickness of each light-emitting unit were changed as shown in Table 1.

Comparative Examples 2 to 4

In Comparative Examples 2 to 4, light-emitting devices each including five light-emitting units respectively having configurations shown in Table 1 were manufactured. Here, the light-emitting devices of Comparative Examples 2 to 4 were manufactured in the same manner as in Example 1, except that the material and thickness of each light-emitting unit were changed as shown in Table 1.

TABLE 1

| | | Device structure |
|---|---|---|
| Example 1 (BGBGB) | First electrode | Glass/ITO (50 Å)/Ag (1,000 Å)/ITO (70 Å)/ |
| | First light-emitting unit (B) | HATCN (50 Å)/NPB (250 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/ |
| | First charge generation layer | BCP:Li (65 Å, 10%)/HATCN (50 Å)/ |
| | Second light-emitting unit (G) | NPB (50 Å)/G-EML (H39:H126:PD13 (9%), 1:1_250 Å)/TPM-TAZ + Liq (100 Å, 5:5)/ |
| | Second charge generation layer | BCP:Li (65 Å, 10%)/HATCN (50 Å)/ |
| | Third light-emitting unit (B) | NPB (50 Å)/TCTA (75 Å)/B-EML (H8:DF10 (1%), 85 Å/H125:DF10 (1%), 85 Å)/T2T (50 Å)/TPM-TAZ + Liq (50 Å, 5:5)/ |

TABLE 1-continued

| Device structure | | |
|---|---|---|
| | Third charge generation layer | BCP:Li (65 Å, 10%)/HATCN (50 Å)/ |
| | Fourth light-emitting unit (G) | NPB (50 Å)/G-EML (H39:H126:PD13 (9%), 1:1__250 Å)/ TPM-TAZ + Liq (100 Å, 5:5)/ |
| | Fourth charge generation layer | BCP:Li (65 Å, 10%)/HATCN (50 Å)/ |
| | Fifth light-emitting unit (B) | NPB (50 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Second electrode/CPL | Yb (10 Å)/AgMg (100 Å, 10%)/CPL 7 500 Å |
| Comparative Example 1 (BBBG) | First electrode | Glass/ITO (50 Å)/Ag (1,000 Å)/ITO (70 Å)/ |
| | First light-emitting unit (B) | HATCN (50 Å)/NPB (250 Å)/TCTA (75 Å)/B-EML (H8:DF10 (1%), 85 Å/H125:DF10 (1%), 85 Å)/T2T (50 Å)/ TPM-TAZ + Liq (100 Å, 5:5)/ |
| | First charge generation layer | BCP:Li (65 Å, 10%)/HATCN (50 Å)/ |
| | Second light-emitting unit (B) | NPB (250 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Second charge generation layer | BCP:Li (65 Å, 10%)/HATCN (50 Å)/ |
| | Third light-emitting unit (B) | NPB (50 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Third charge generation layer | BCP:Li (65 Å, 10%)/HATCN (50 Å)/ |
| | Fourth light-emitting unit (G) | NPB (50 Å)/G-EML (H39:H126:PD13 (9%), 1:1__250 Å)/ TPM-TAZ + Liq (100 Å, 5:5)/ |
| | Second electrode/CPL | Yb (10 Å)/AgMg (100 Å, 10%)/CPL 7 500 Å |
| Comparative Example 2 (BBGBG) | First electrode | Glass/ITO (50 Å)/Ag (1,000 Å)/ITO (70 Å)/ |
| | First light-emitting unit (B) | HATCN (50 Å)/NPB (250 Å)/TCTA (75 Å)/B-EML (H8:DF10 (1%), 85 Å/H125:DF10 (1%), 85 Å)/T2T (50 Å)/ TPM-TAZ + Liq (100 Å, 5:5)/ |
| | First charge generation layer | BCP:Li (65 Å, 10%)/HATCN (50 Å)/ |
| | Second light-emitting unit (B) | NPB (570 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Second charge generation layer | BCP:Li (65 Å, 10%)/HATCN (50 Å)/ |
| | Third light-emitting unit (G) | NPB (85 Å)/G-EML (H39:H126:PD13 (9%), 1:1__200 Å)/ TPM-TAZ + Liq (100 Å, 5:5)/ |
| | Third charge generation layer | BCP:Li (65 Å, 10%)/HATCN (50 Å)/ |
| | Fourth light-emitting unit (B) | NPB (20 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Fourth charge generation layer | BCP:Li (65 Å, 10%)/HATCN (50 Å)/ |
| | Fifth light-emitting unit (G) | NPB (300 Å)/G-EML (H39:H126:PD13 (9%), 1:1__250 Å)/ TPM-TAZ + Liq (570 Å, 5:5)/ |
| | Second electrode/CPL | Yb (10 Å)/AgMg (100 Å, 10%)/CPL 7 500 Å |
| Comparative Example 3 (GBGBB) | First electrode | Glass/ITO (50 Å)/Ag (1,000 Å)/ITO (70 Å)/ |
| | First light-emitting unit (G) | HATCN (50 Å)/NPB (445 Å)/G-EML (H39:H126:PD13 (9%), 1:1__250 Å)/T2T (50 Å)/TPM-TAZ + Liq (100 Å, 5:5)/ |
| | First charge generation layer | BCP:Li (65 Å, 10%)/HATCN (50 Å)/ |
| | Second light-emitting unit (B) | NPB (370 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Second charge generation layer | BCP:Li (65 Å, 10%)/HATCN (50 Å)/ |
| | Third light-emitting unit (G) | NPB (85 Å)/G-EML (H39:H126:PD13 (9%), 1:1__200 Å)/ TPM-TAZ + Liq (100 Å, 5:5)/ |
| | Third charge generation layer | BCP:Li (65 Å, 10%)/HATCN (50 Å)/ |
| | Fourth light-emitting unit (B) | NPB (20 Å)/TCTA (75 Å)/B-EML (H8:DF10 (1%), 85 Å/ H125:DF10 (1%), 85 Å)/T2T (50 Å)/TPM-TAZ + Liq (100 Å, 5:5)/ |
| | Fourth charge generation layer | BCP:Li (65 Å, 10%)/HATCN (50 Å)/ |
| | Fifth light-emitting unit (B) | NPB (435 Å)/TCTA (75 Å)/B-EML (H8:DF10 (1%), 85 Å/ H125:DF10 (1%), 85 Å)/T2T (50 Å)/TPM-TAZ + Liq (380 Å, 5:5)/ |

TABLE 1-continued

| | | Device structure |
|---|---|---|
| | Second electrode/CPL | Yb (10 Å)/AgMg (100 Å, 10%)/CPL 7 500 Å |
| Comparison Example 4 (GBBGB) | First electrode | Glass/ITO (50 Å)/Ag (1,000 Å)/ITO (70 Å)/ |
| | First light-emitting unit (G) | HATCN (50 Å)/NPB (445 Å)/G-EML (H39:H126:PD13 (9%), 1:1_250 Å)/T2T (50 Å)/TPM-TAZ + Liq (100 Å, 5:5)/ |
| | First charge generation layer | BCP:Li (65 Å, 10%)/HATCN (50 Å)/ |
| | Second light-emitting unit (B) | NPB (370 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/ |
| | Second charge generation layer | BCP:Li (65 Å, 10%)/HATCN (50 Å)/ |
| | Third light-emitting unit (B) | NPB (515 Å)/TCTA (75 Å)/B-EML (H8:DF10 (1%), 85 Å/H125:DF10 (1%), 85 Å)/T2T (50 Å)/TPM-TAZ + Liq (50 Å, 5:5)/ |
| | Third charge generation layer | BCP:Li (65 Å, 10%)/HATCN (50 Å)/ |
| | Fourth light-emitting unit (G) | NPB (90 Å)/G-EML (H39:H126:PD13 (9%), 1:1_125 Å)/TPM-TAZ + Liq (100 Å, 5:5)/ |
| | Fourth charge generation layer | BCP:Li (65 Å, 10%)/HATCN (50 Å)/ |
| | Fifth light-emitting unit (B) | NPB (20 Å)/TCTA (75 Å)/B-EML (H8:DF10 (1%), 85 Å/H125:DF10 (1%), 85 Å)/T2T (50 Å)/TPM-TAZ + Liq (380 Å, 5:5)/ |
| | Second electrode/CPL | Yb (10 Å)/AgMg (100 Å, 10%)/CPL 7 500 Å |
| Comparative Example 1 (BBBG) | First electrode | Glass/ITO (50 Å)/Ag (1,000 Å)/ITO (70 Å)/ |
| | First light-emitting unit (B) | HATCN (50 Å)/NPB (250 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/ |
| | First charge generation layer | BCP:Li (65 Å, 10%)/HATCN (50 Å)/ |
| | Second light-emitting unit (B) | NPB (250 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/ |
| | Second charge generation layer | BCP:Li (65 Å, 10%)/HATCN (50 Å)/ |
| | Third light-emitting unit (B) | NPB (50 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/ |
| | Third charge generation layer | BCP:Li (65 Å, 10%)/HATCN (50 Å)/ |
| | Fourth light-emitting unit (G) | NPB (50 Å)/G-EML (H39:H126:PD13 (9%), 1:1_250 Å)/ \|TPM-TAZ + Liq (100 Å, 5:5)/ |
| | Second electrode/CPL | Yb (10 Å)/AgMg (100 Å, 10%)/CPL 7 500 Å |

Evaluation Example 1

The light-emitting device of Example 1, in which the emission wavelength of a light-emitting unit emitting blue light was 460 nm, and the optical distance of the device was about 2,800 Å, satisfied Formula 1. For example, the light-emitting device of Example 1 satisfied blue third order resonance. In contrast, although the light-emitting devices of Comparative Examples 1 to 4 included light-emitting units emitting blue light of the same wavelength as in Example 1, the optical distance of each of the devices was about 4,000 Å, and thus, Formula 1 was not satisfied.

The driving voltage, current efficiency (cd/A), and lifespan ($T_{95}$) of each of the light-emitting devices manufactured according to Example 1 and Comparative Examples 1 to 4 were measured using Keithley MU 236 and luminance meter PR650, and the values converted relative to 100% of the measured values of Comparative Example 1 are shown in Table 2.

In Table 2, the optical distance refers to a value of the thickness from the interface between the anode (ITO/Ag/ITO) and the hole injection layer (HATCN) to the interface between the electron injection layer (Yb), which is adjacent to the cathode (AgMg), and the electron transport layer (TPM-TAZ+Liq, 570 Å, 5:5). The lifespan ($T_{95}$) refers to the time taken for the luminance to become 95% of the initial luminance of 100%.

TABLE 2

| Structure | Device structure | Optical distance (Å) | Driving voltage (V) | Efficiency (cd/A) | Lifespan | Luminance |
|---|---|---|---|---|---|---|
| Example 1 | BGBGB | 2795 | 109% | 119% | 120% | 1,500 nit |
| Comparative Example 1 | BBBG | 4040 | 100% | 100% | 100% | 1,500 nit |
| Comparative Example 2 | BBGBG | 4040 | 114% | 125% | 122% | 1,500 nit |

TABLE 2-continued

| Structure | Device structure | Optical distance (Å) | Driving voltage (V) | Efficiency (cd/A) | Lifespan | Luminance |
|---|---|---|---|---|---|---|
| Comparative Example 3 | GBGBB | 4040 | 116% | 122% | 125% | 1,500 nit |
| Comparison Example 4 | GBBGB | 4040 | 115% | 120% | 123% | 1,500 nit |

Referring to Table 2, it was confirmed that the light-emitting device of Example 1 had improved driving voltage, efficiency, and lifespan compared to those of the light-emitting device of Comparative Example 1, which included four light-emitting units. It was confirmed that the light-emitting device of Example 1 had a lower driving voltage than those of the light-emitting devices of Comparative Examples 2 to 4, each of which included five light-emitting units, while maintaining similar efficiency and lifespan values to those of the light-emitting devices of Comparative Examples 2 to 4. It was determined that the light-emitting device of Example 1 had a shorter optical distance than those of the light-emitting devices of Comparative Examples 1 to 4, which resulted in a decrease in the thickness of the device and a decrease in the driving voltage. In addition, the decrease in the thickness of the device may reduce an amount of material and a processing time, thereby reducing manufacturing costs of the device.

According to the one or more embodiments, a tandem light-emitting device may include two light-emitting units emitting green light and three light-emitting units emitting blue light, and may use a structure including blue light of third order resonance, and thus, a tandem light-emitting device having low driving voltage while having efficiency and lifespan of a certain level or higher may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A tandem light-emitting device, comprising:

a first electrode;

a second electrode facing the first electrode;

m light-emitting units stacked between the first electrode and the second electrode, the m light-emitting units each comprising an emission layer; and m−1 charge generation layers between two adjacent light-emitting units of the m light-emitting units, wherein m is an integer of 5 or more, the m light-emitting units comprise a first light-emitting unit, a second light-emitting unit, a third light-emitting unit, a fourth light-emitting unit, and a fifth light-emitting unit, in order of proximity to the first electrode, the m−1 charge generation layers comprise a first charge generation layer, a second charge generation layer, a third charge generation layer, and a fourth charge generation layer, in order of proximity to the first electrode, at least one of the first to fifth light-emitting units emits blue light, at least one of the first to fifth light-emitting units emits green light, the formula $3<D/(2*\lambda_b)\leq 4$ is satisfied, D indicates a distance between the first electrode and the second electrode, $\lambda_b$ indicates a maximum emission wavelength of the blue light, and $\lambda_b$ is in a range of about 400 nm to about 480 nm.

2. A tandem light-emitting device, comprising:

a first electrode;

a second electrode facing the first electrode;

m light-emitting units stacked between the first electrode and the second electrode, the m light-emitting units each comprising an emission layer; and m−1 charge generation layers between two adjacent light-emitting units of the m light-emitting units, wherein m is an integer of 5 or more, the m light-emitting units comprise a first light-emitting unit, a second light-emitting unit, a third light-emitting unit, a fourth light-emitting unit, and a fifth light-emitting unit, in order of proximity to the first electrode, the m−1 charge generation layers comprise a first charge generation layer, a second charge generation layer, a third charge generation layer, and a fourth charge generation layer, in order of proximity to the first electrode, at least one of the first to fifth light-emitting units emits blue light, at least one of the first to fifth light-emitting units emits green light, the formula $3\leq D/(2*\lambda_b)\leq 4$ is satisfied, D indicates a distance between the first electrode and the second electrode, $\lambda_b$ indicates a maximum emission wavelength of the blue light, and $\lambda_b$ is in a range of about 400 nm to about 480 nm, wherein m is 5, wherein the m-light emitting parts comprise:

three light-emitting units emitting blue light; and two light-emitting units emitting green light.

3. The tandem light-emitting device of claim 1, wherein D is in a range of about 2,400 Å to about 3,800 Å.

4. The tandem light-emitting device of claim 1, wherein D is in a range of about 2,600 Å to about 3,400 Å.

5. The tandem light-emitting device of claim 1, further comprising:

a capping layer located outside the second electrode.

6. The tandem light-emitting device of claim 2, wherein the first light-emitting unit, the third light-emitting unit, and the fifth light-emitting unit each emit blue light, and the second light-emitting unit and the fourth light-emitting unit each emit green light.

7. The tandem light-emitting device of claim 6, wherein the first light-emitting unit, the third light-emitting unit, and the fifth light-emitting unit emit blue light of a same wavelength.

8. The tandem light-emitting device of claim 6, wherein the second light-emitting unit and the fourth light-emitting unit emit green light of a same wavelength.

9. The tandem light-emitting device of claim 1, wherein at least one of the m−1 charge generation layers comprises:

an n-type charge generation layer and a p-type charge generation layer.

10. The tandem light-emitting device of claim 1, wherein each of the m light-emitting units further comprises:

a hole transport region that transports holes to the emission layer; and an electron transport region that transports electrons to the emission layer.

11. The tandem light-emitting device of claim 10, wherein the hole transport region comprises at least one of a hole injection layer, a hole transport layer, and an electron blocking layer.

12. The tandem light-emitting device of claim 10, wherein the electron transport region comprises at least one of an electron injection layer, an electron transport layer, and a hole blocking layer.

13. The tandem light-emitting device of claim 11, wherein each layer constituting the hole transport region in any light-emitting unit other than the first light-emitting unit and each layer constituting the electron transport region in the any light-emitting unit each have a thickness of less than or equal to about 100 Å.

14. The tandem light-emitting device of claim 1, wherein at least one of the emission layers in the m light-emitting units comprises:

a first host; and a second host, and the first host and the second host are different from each other.

15. The tandem light-emitting device of claim 1, wherein at least one of the emission layers in the m light-emitting units comprises a plurality of emission layers.

16. The tandem light-emitting device of claim 2, wherein at least one of the plurality of emission layers of the first to fifth light-emitting units comprises an organometallic compound.

17. An electronic apparatus comprising the tandem light-emitting device of claim 1.

18. The electronic apparatus of claim 17, further comprising:

a thin-film transistor, wherein the thin-film transistor comprises a source electrode and a drain electrode, and the first electrode of the tandem light-emitting device is electrically connected to at least one of the source electrode and the drain electrode of the thin-film transistor.

19. The electronic apparatus of claim 17, further comprising:

at least one of a color filter, a color conversion layer, a quantum dot color conversion layer, a touch screen layer, and a polarizing layer.

* * * * *